United States Patent [19]

Bolan et al.

[11] Patent Number: 5,297,099
[45] Date of Patent: Mar. 22, 1994

[54] INTEGRATED CIRCUIT WITH BOTH BATTERY-POWERED AND SIGNAL-LINE-POWERED AREAS

[75] Inventors: Michael L. Bolan, Dallas; Clark R. Williams, Plano, both of Tex.

[73] Assignee: Dallas Semiconductor Corp., Dallas, Tex.

[21] Appl. No.: 727,639

[22] Filed: Jul. 10, 1991

[51] Int. Cl.$^5$ .............................................. G11C 7/00
[52] U.S. Cl. .................................. 365/229; 365/226; 365/177; 365/189.01
[58] Field of Search ............. 365/229, 226, 177, 189.01

[56] References Cited

U.S. PATENT DOCUMENTS

| | | | |
|---|---|---|---|
| 3,859,638 | 1/1975 | Hume, Jr. | 365/229 |
| 4,399,524 | 8/1983 | Muguruma | 365/229 |
| 5,111,058 | 5/1992 | Martin | 365/229 |
| 5,121,359 | 6/1992 | Steele | 365/229 |

*Primary Examiner*—Robert J. Pascal
*Assistant Examiner*—R. A. Ratliff
*Attorney, Agent, or Firm*—Forsythe, Sampels & Wooldridge

[57] ABSTRACT

An integrated circuit, in which some areas of the chip are powered from battery, but at least two other areas of the chip can draw power from independent on-chip power-storage capacitors (which are diode-isolated to accumulate charge from an external signal line). The signal line's input buffer draws power from one capacitor, and the decoder logic draws power from another. Thus, even if the first capacitor is depleted by the signal line's staying in the high-current regime, it will be powered up again when the signal line is again driven high; and the charge stored in the second capacitor will permit the decoding logic to operate. Preferably the second capacitor also powers circuitry which encodes a unique serial number for the chip. Thus, even after the battery has died, the chip can be interrogated to ascertain its unique serial number.

41 Claims, 45 Drawing Sheets

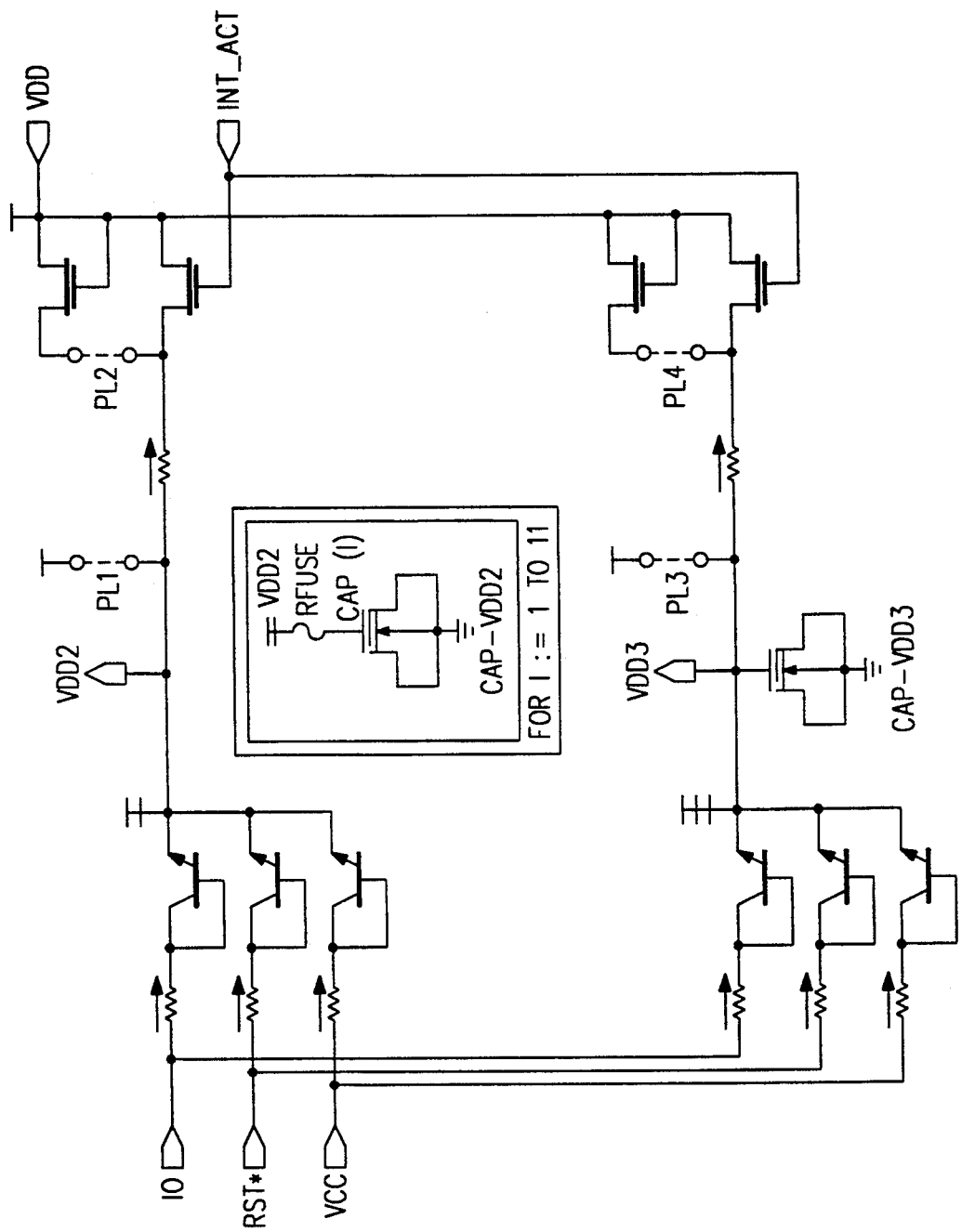
FIG. 4A1

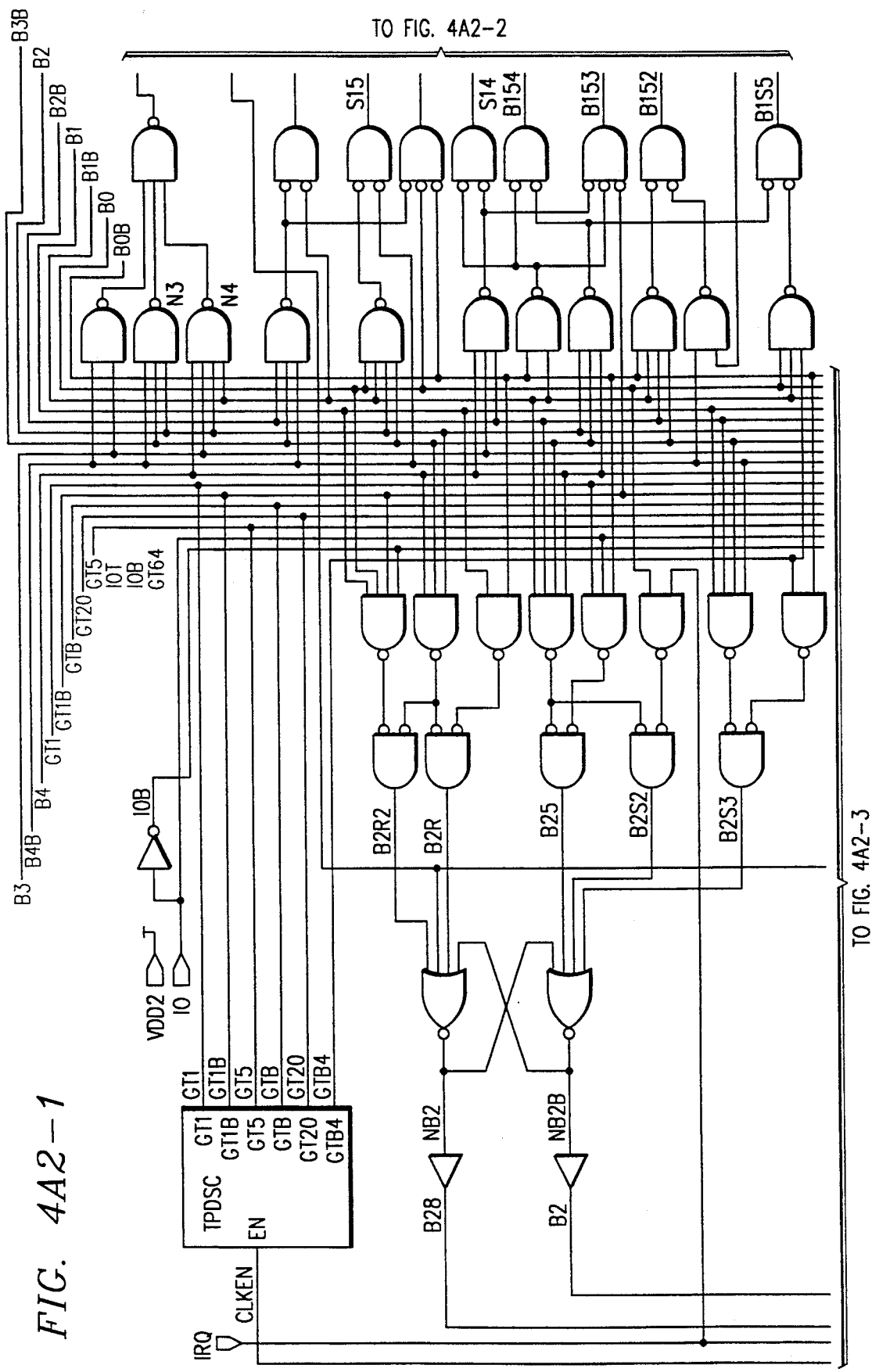
FIG. 4A2-1

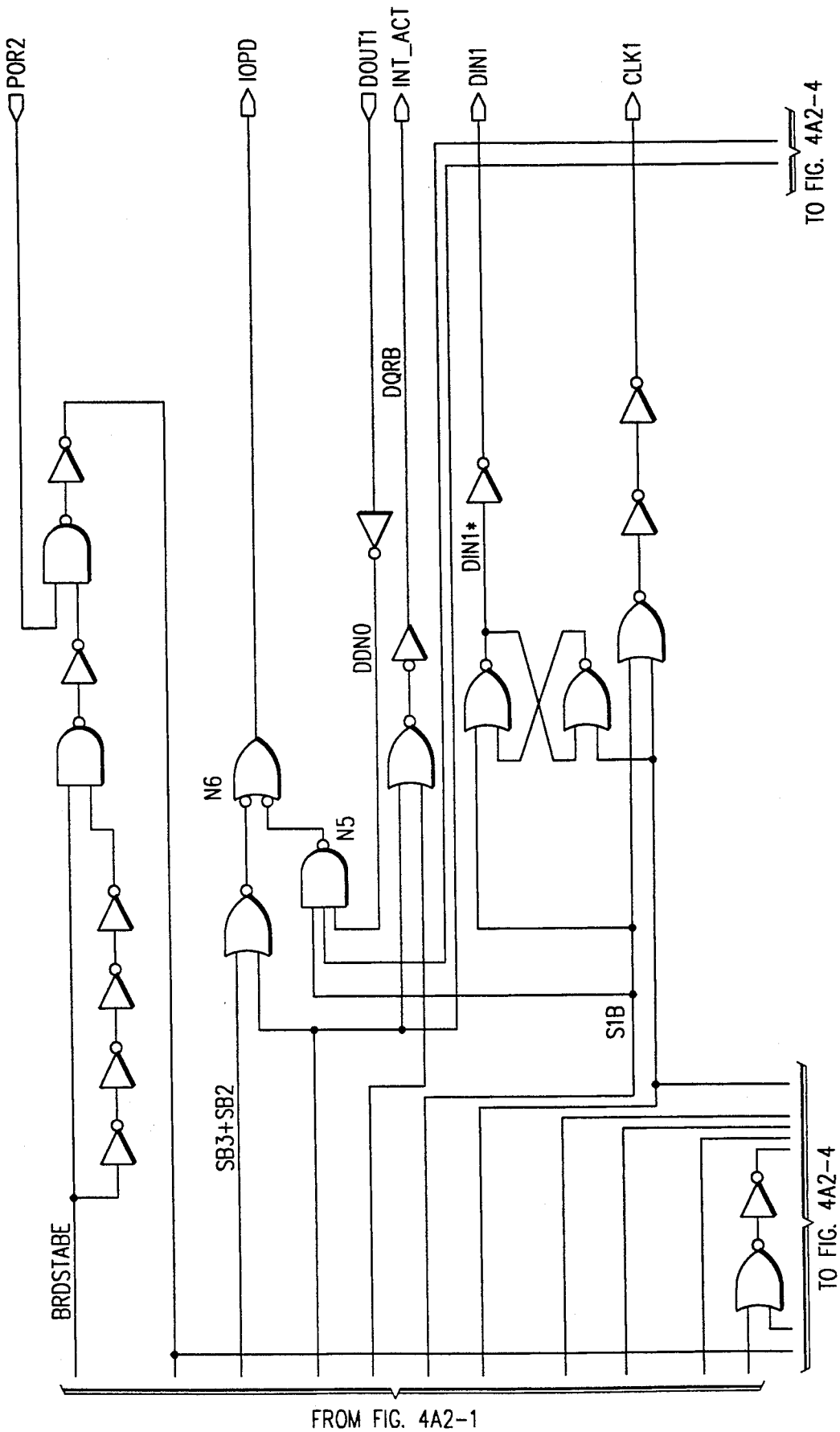
FIG. 4A2-2

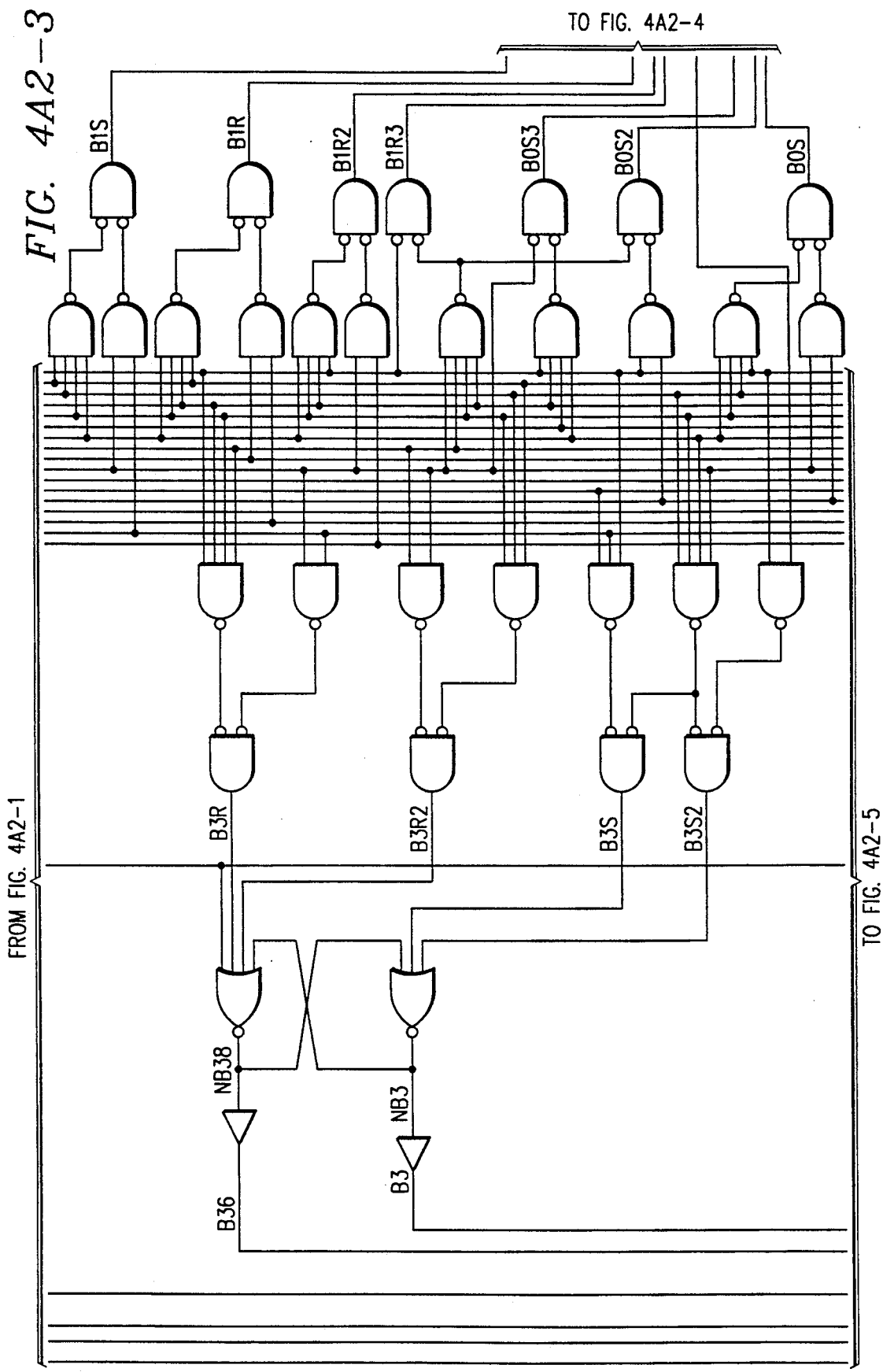

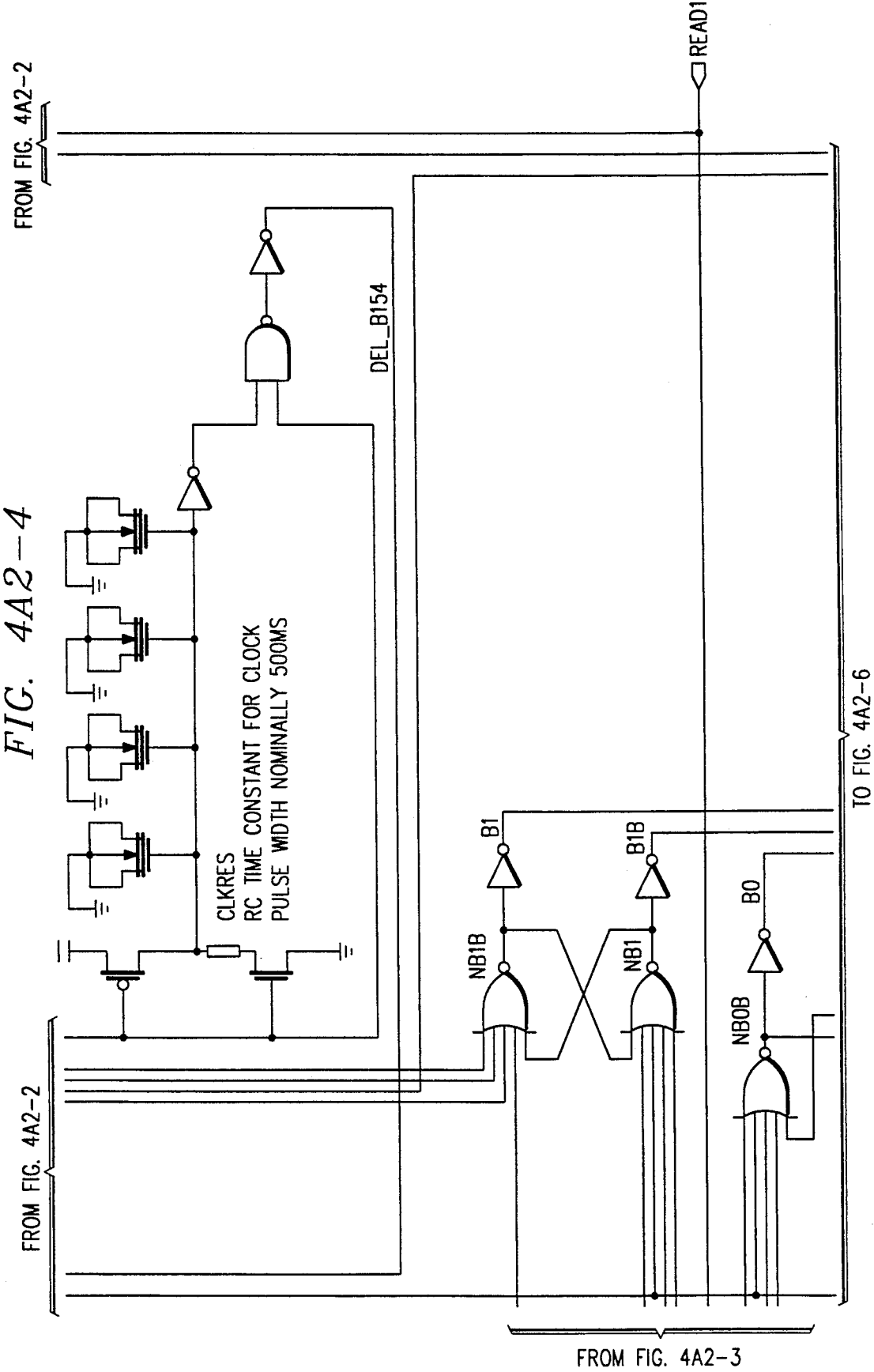

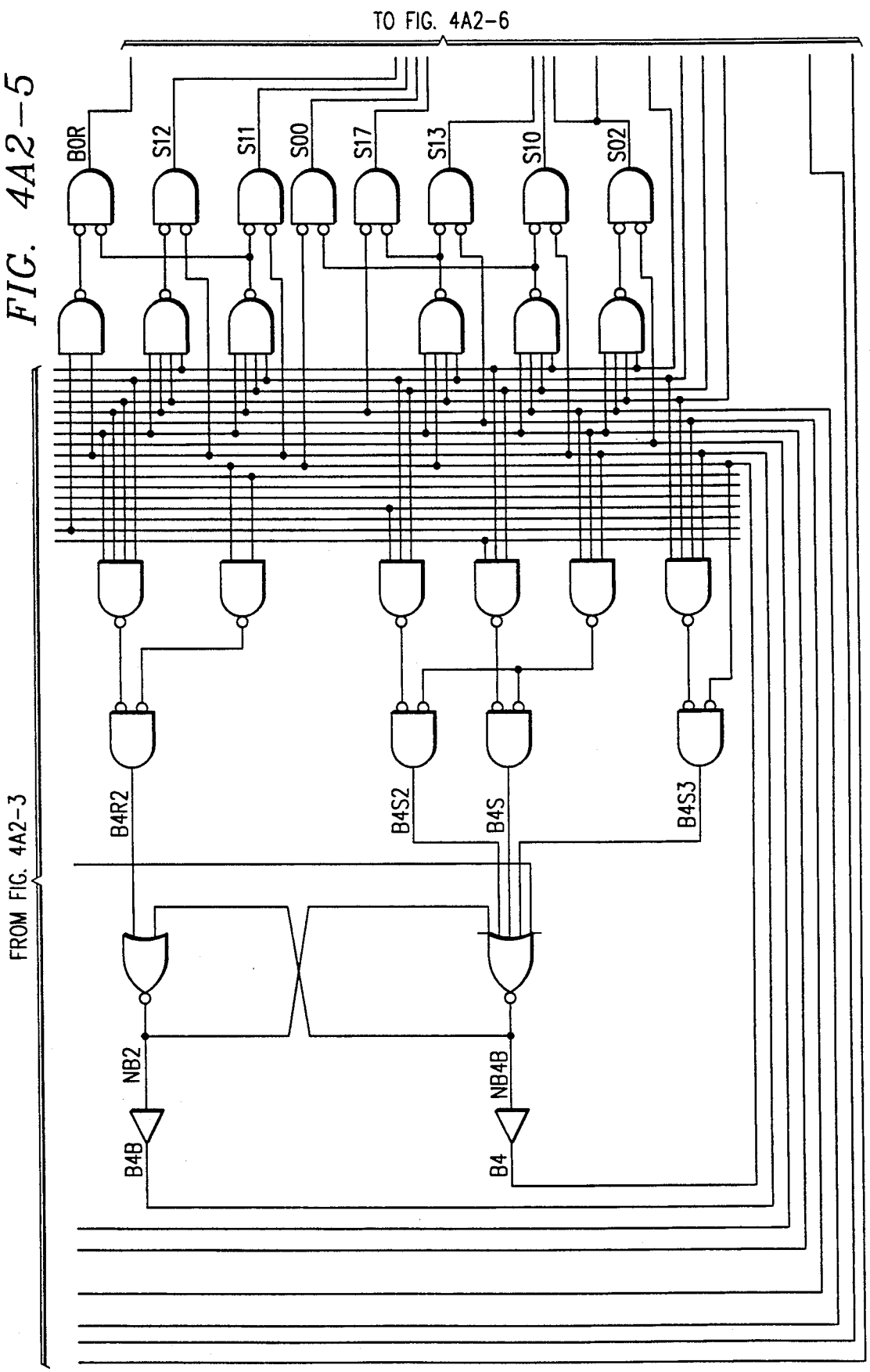
FIG. 4A2-5

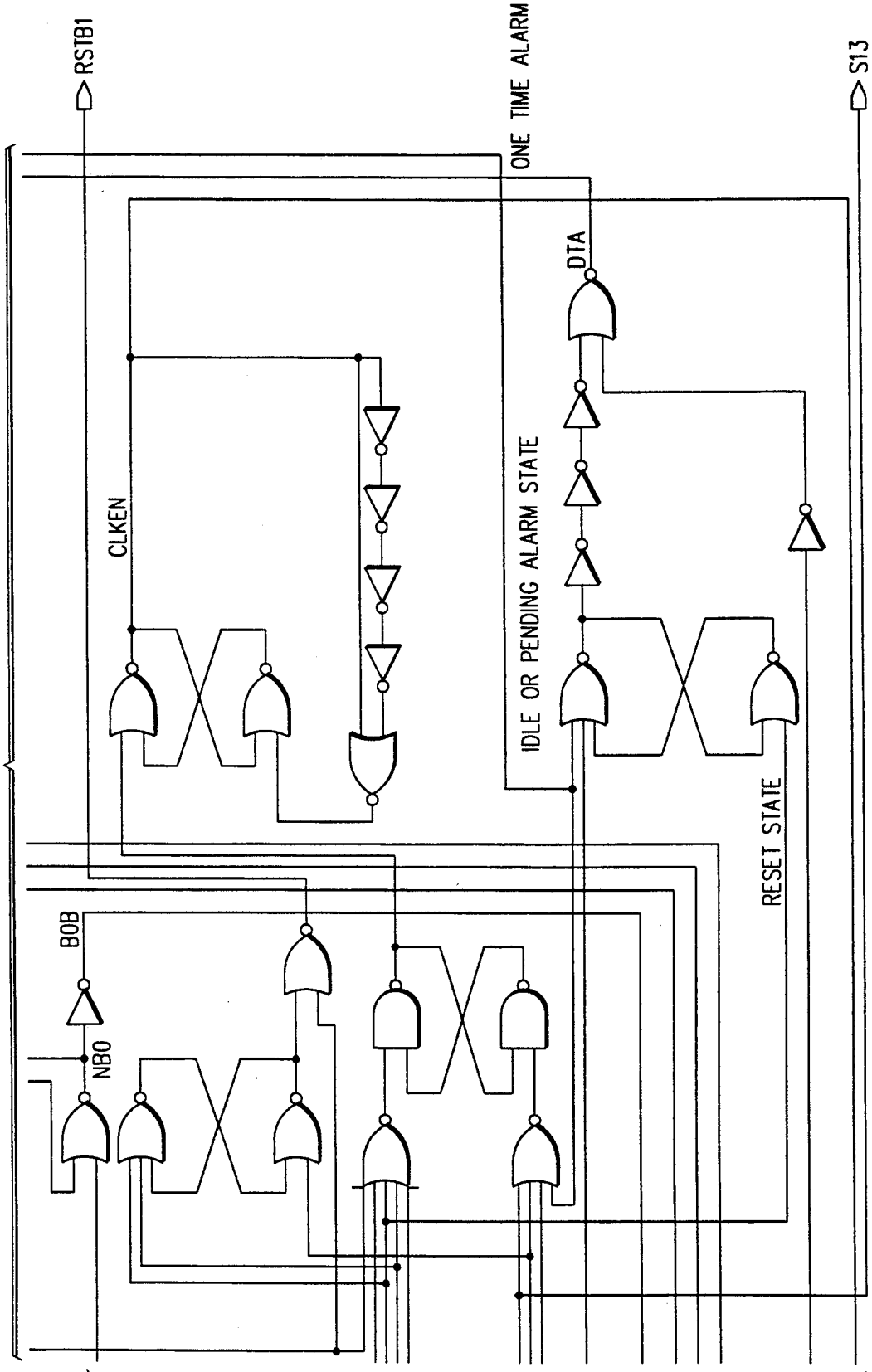
FIG. 4A2-6

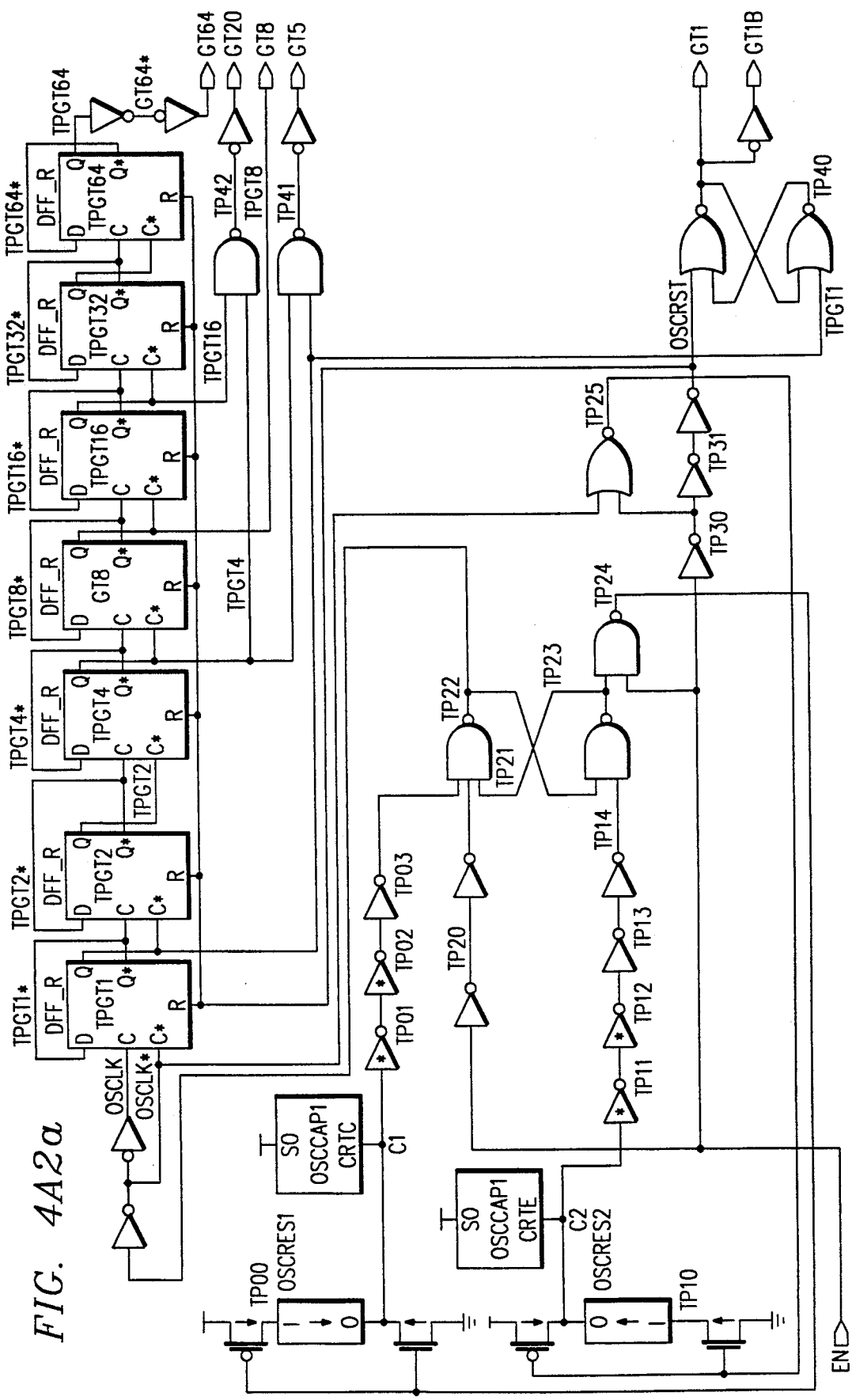
FIG. 4A2a

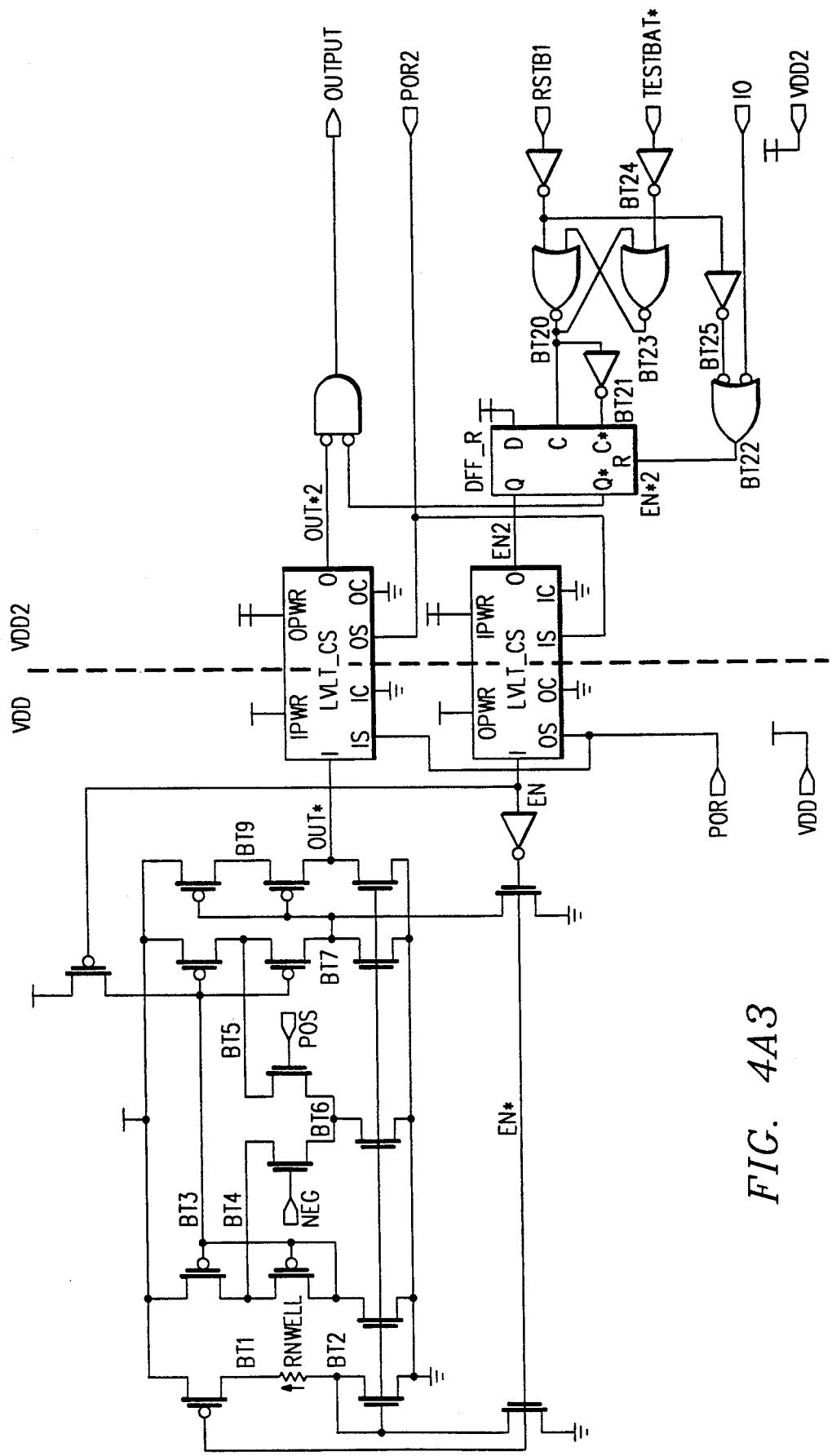
FIG. 4A3

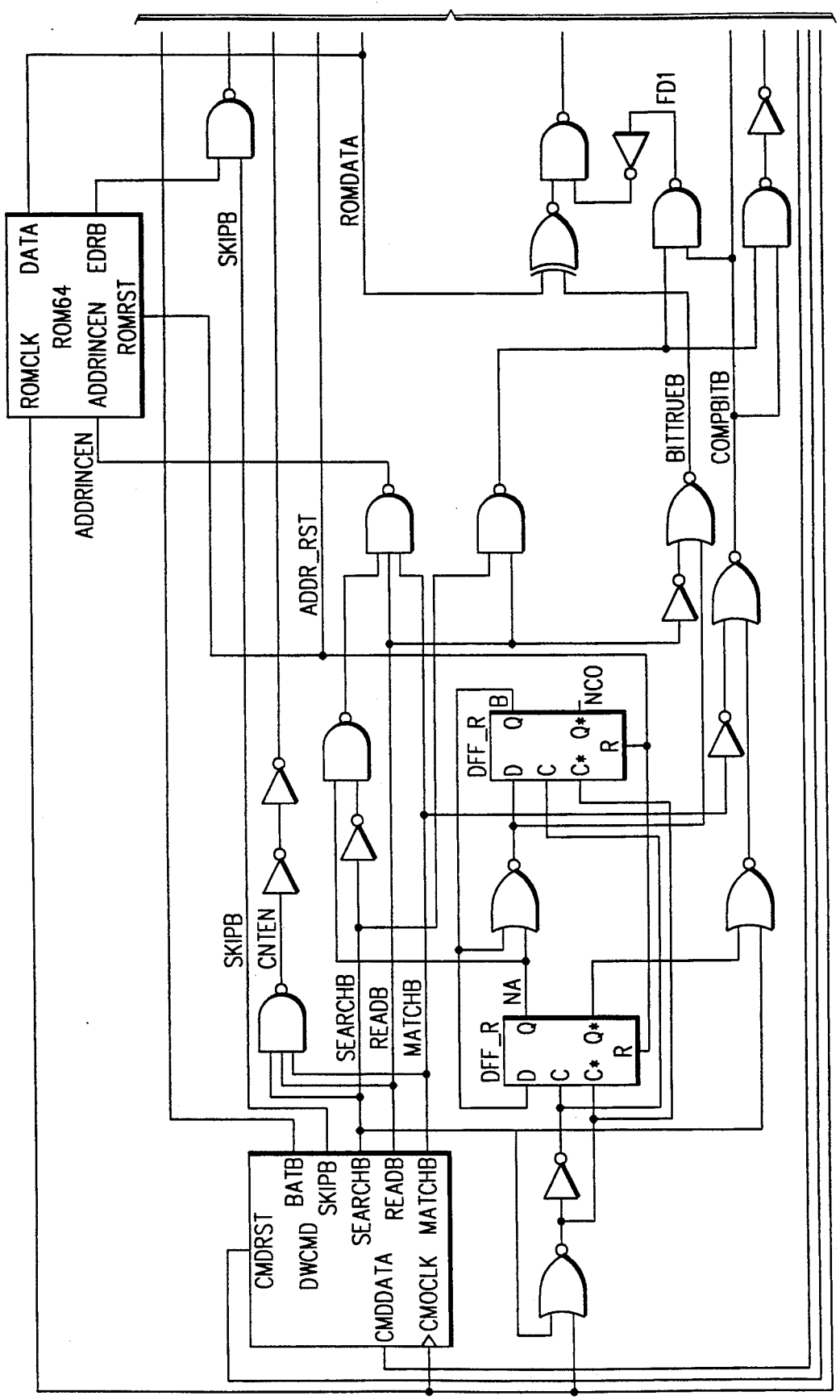
FIG. 4A4-1

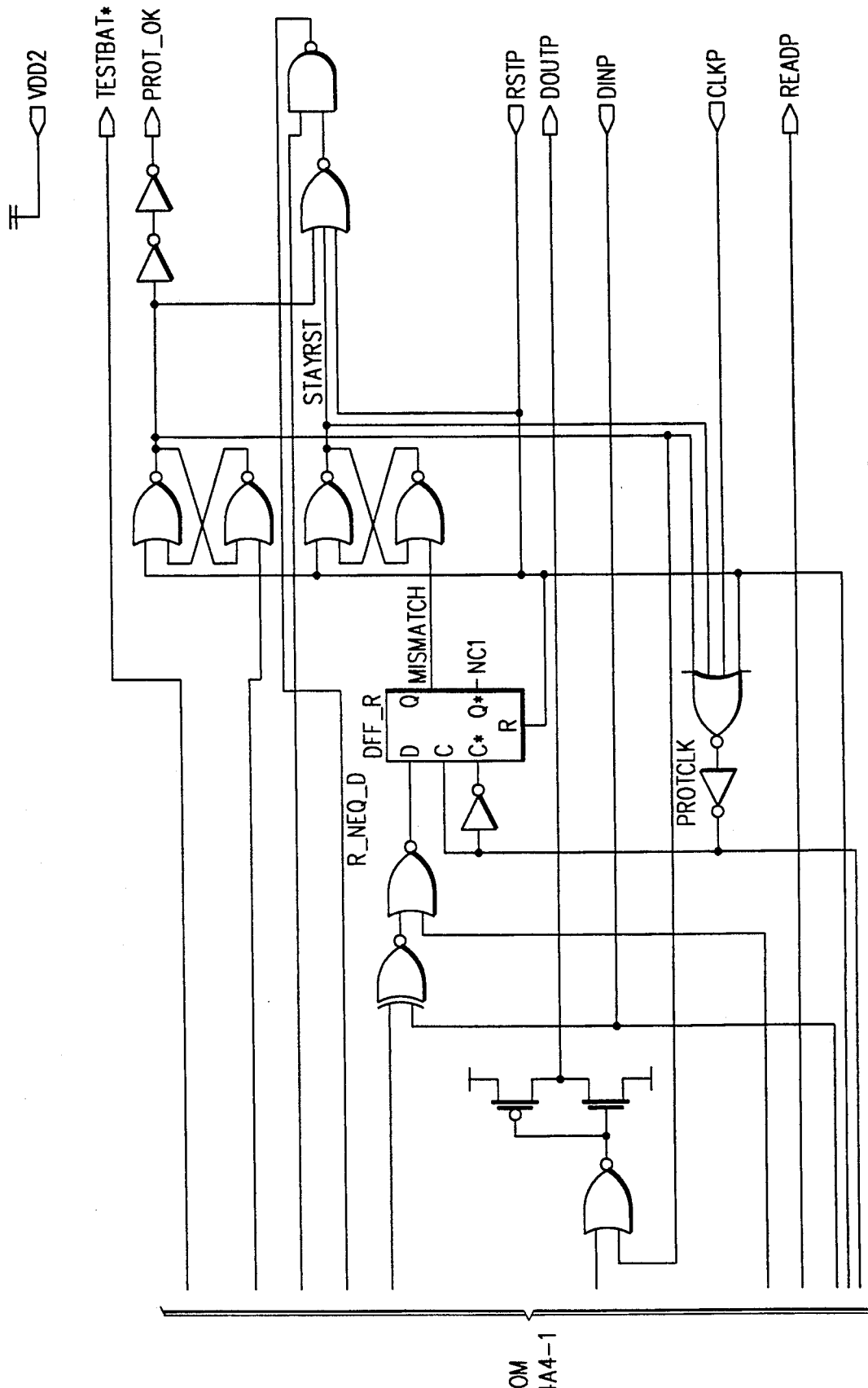
FIG. 4A4-2

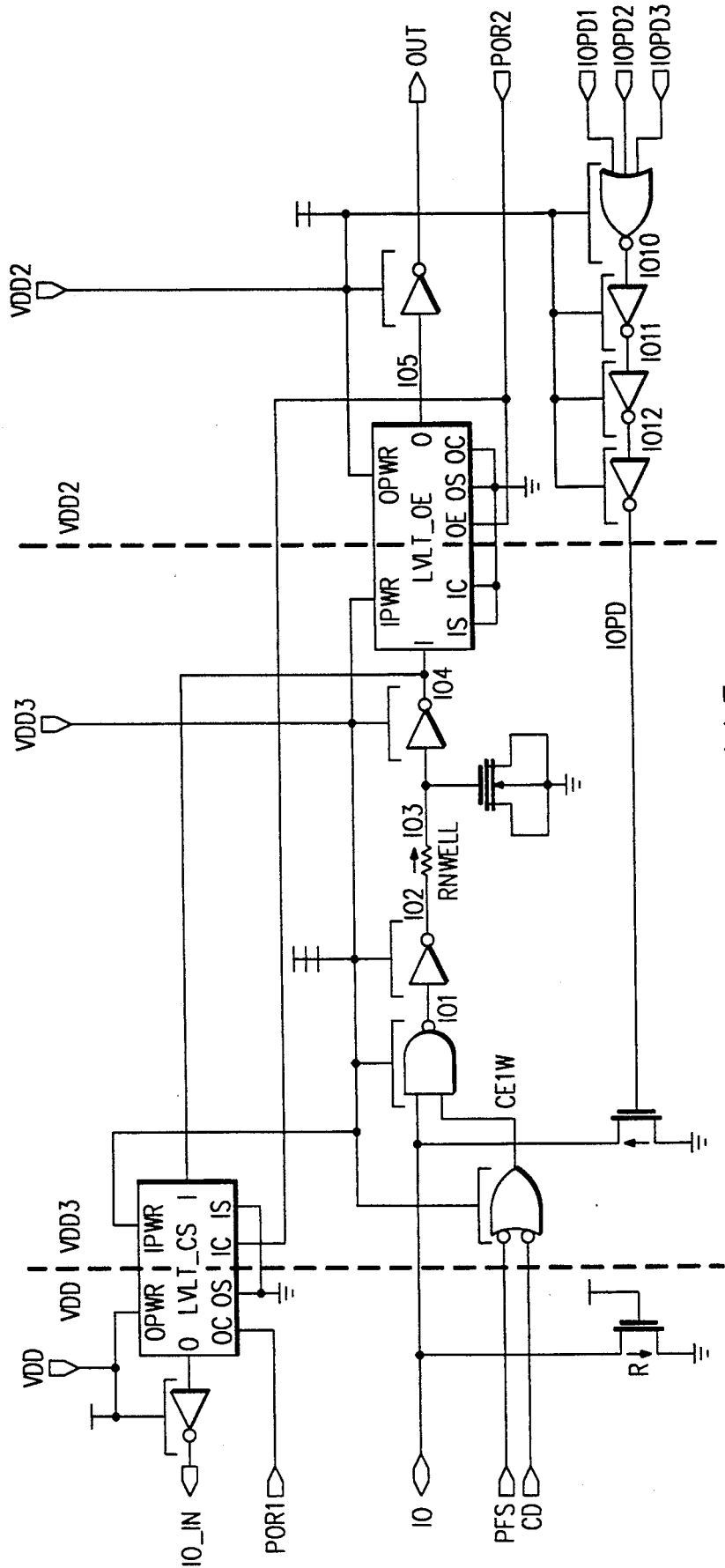
FIG. 4A5

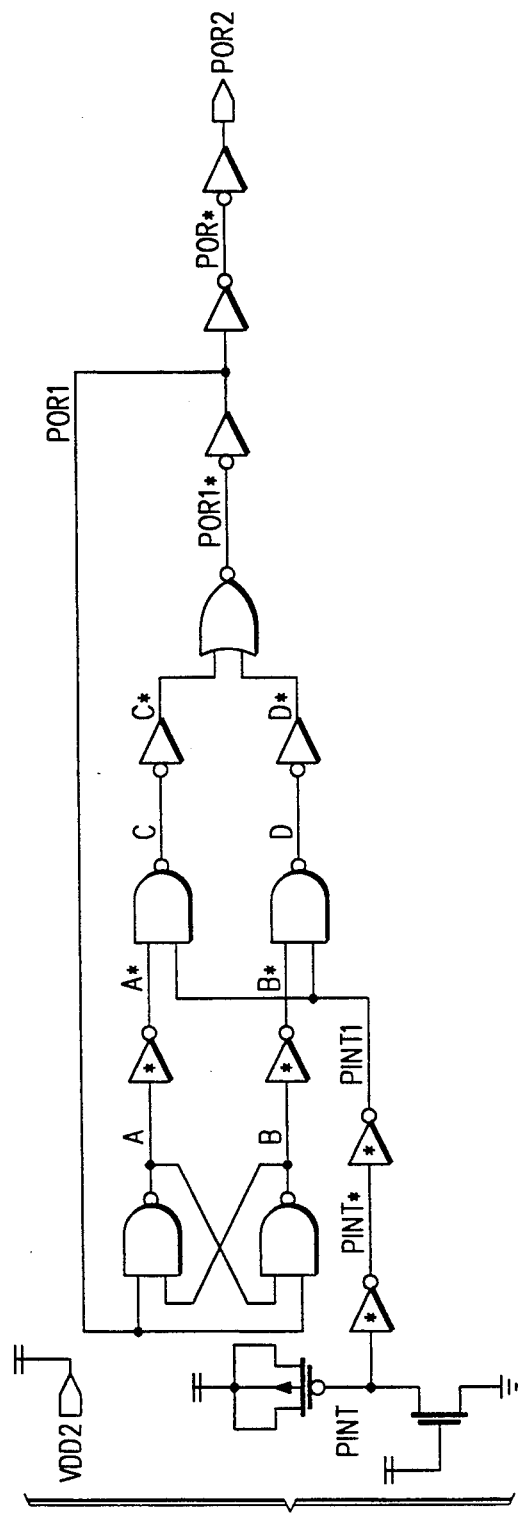
FIG. 4A6

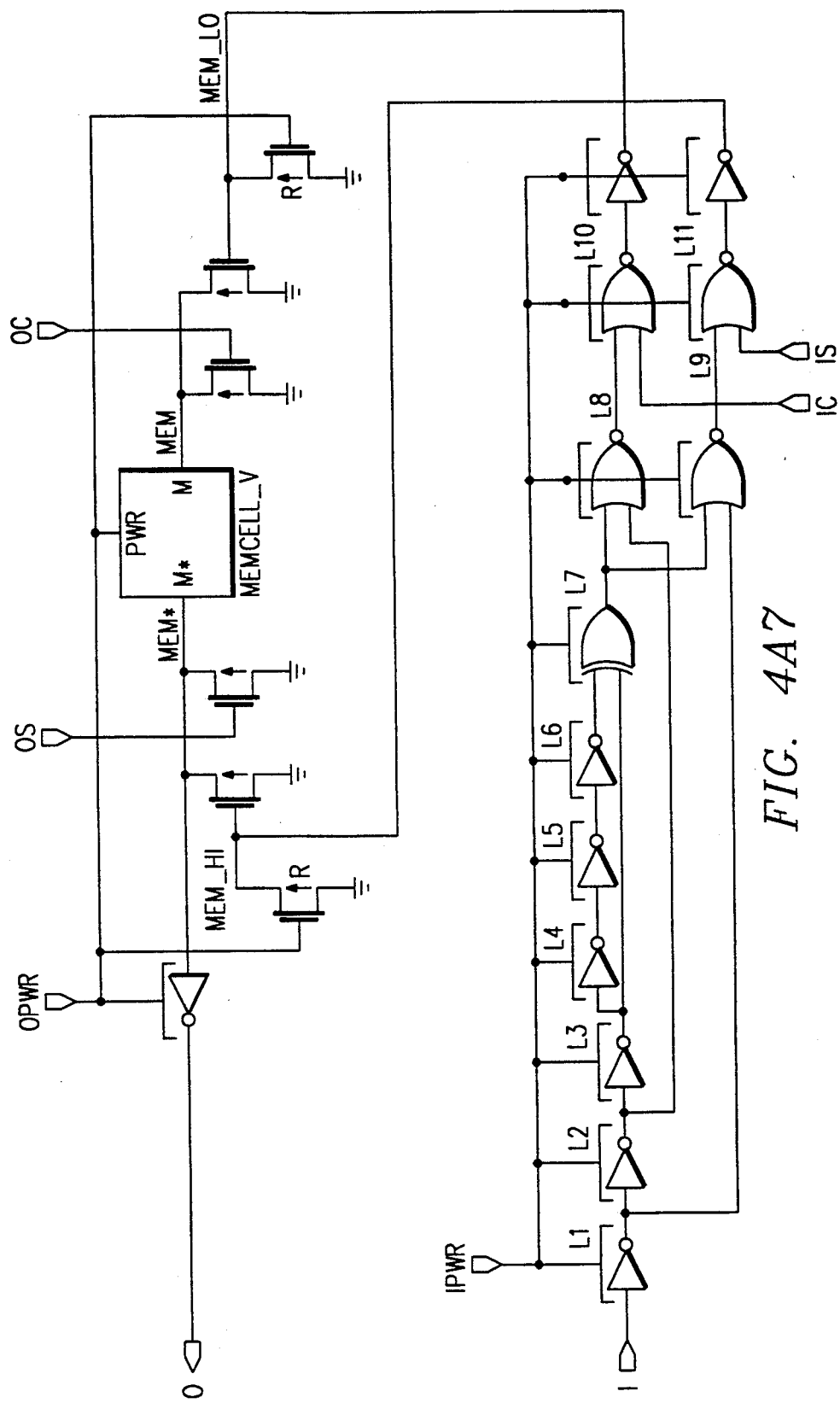
FIG. 4A7

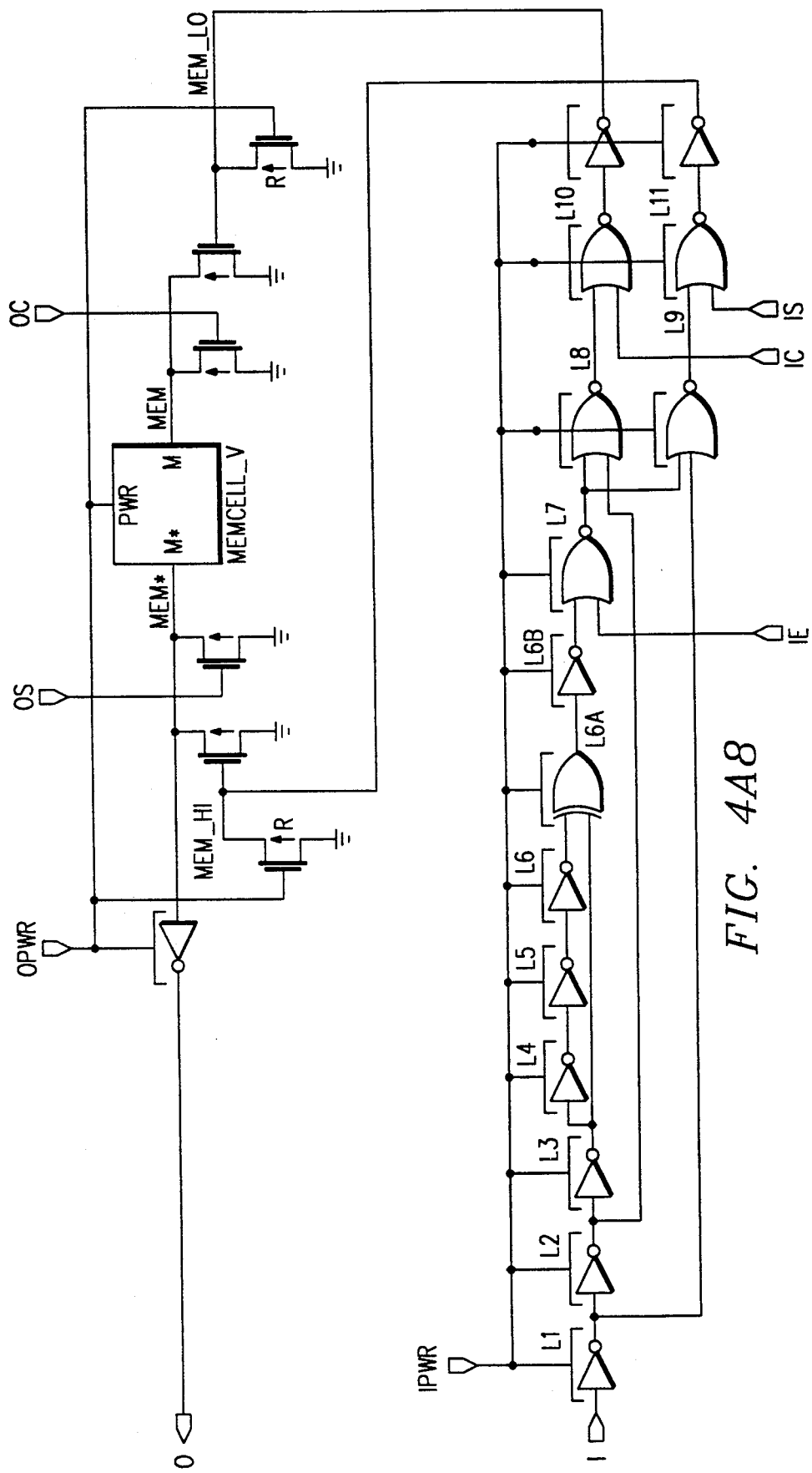
FIG. 4A8

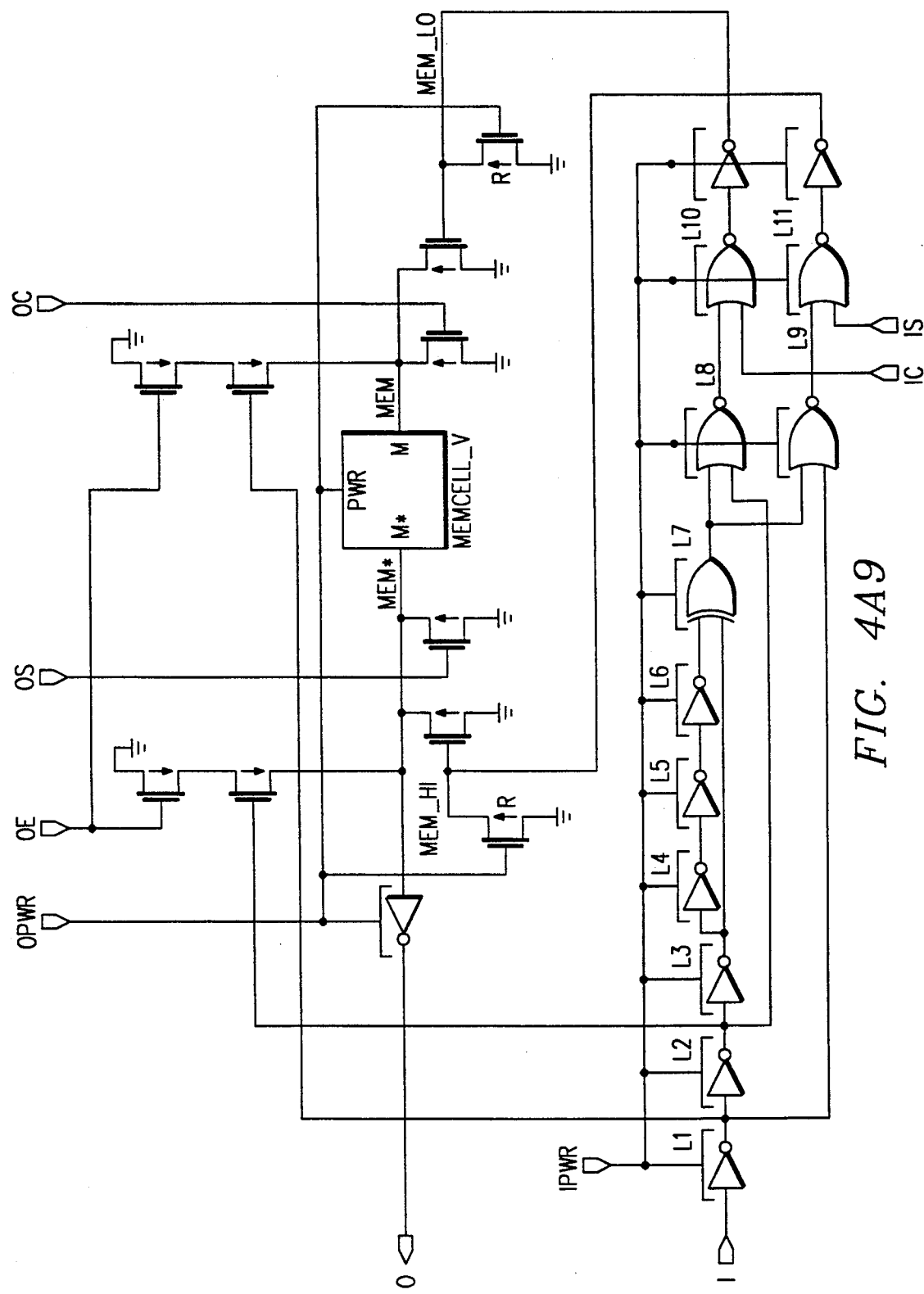
FIG. 4A9

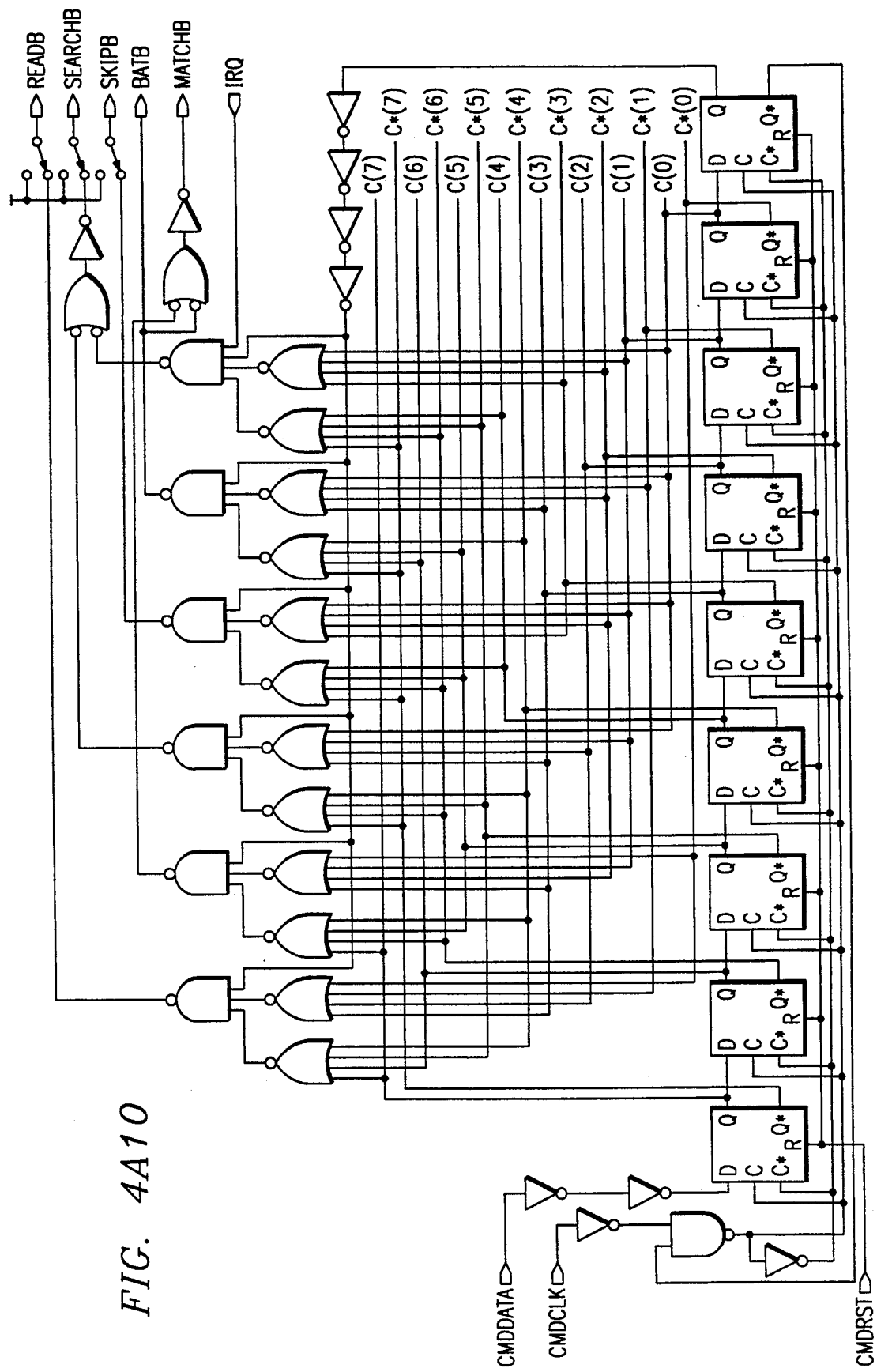
FIG. 4A10

FIG. 4B-1

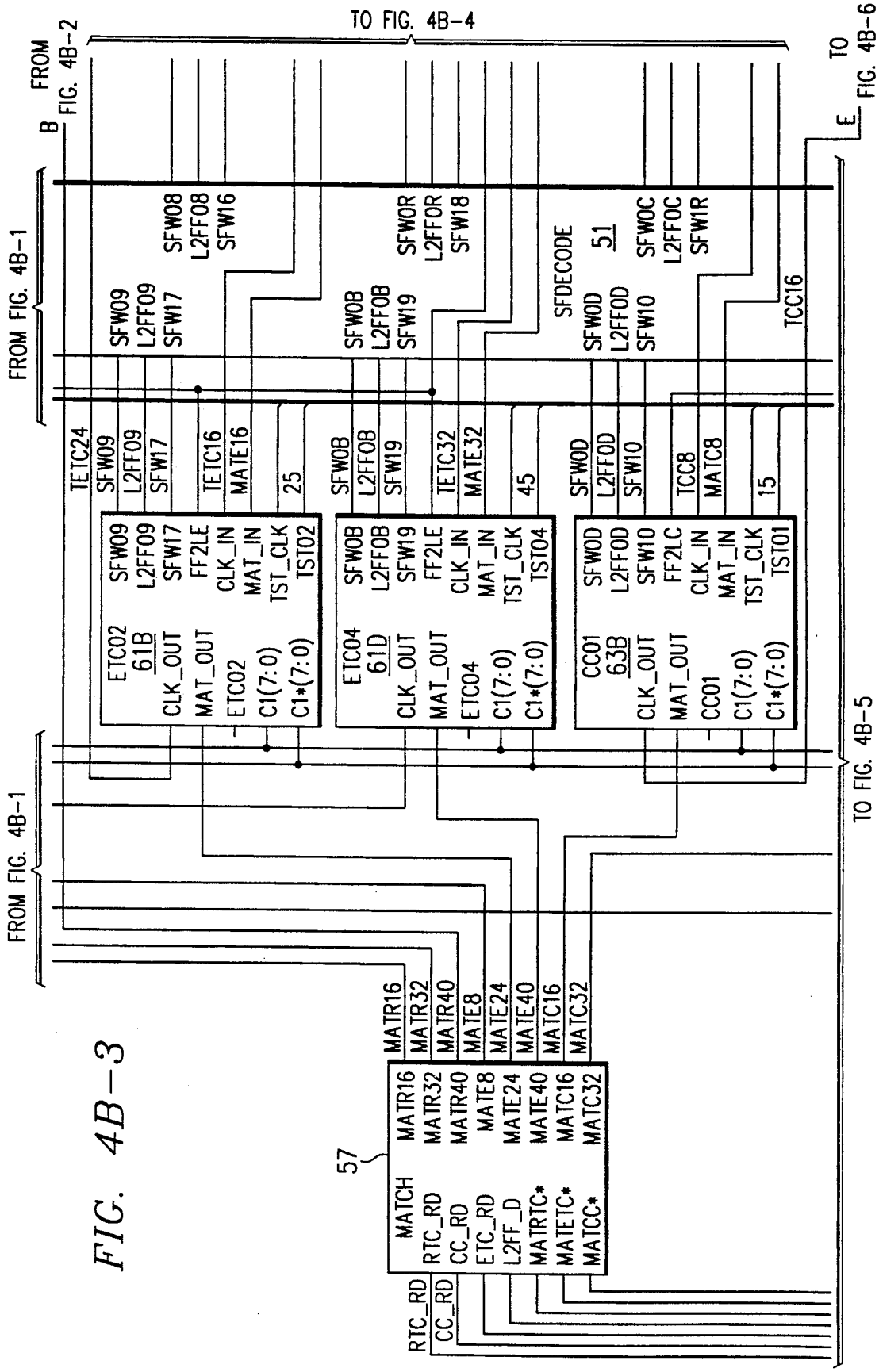

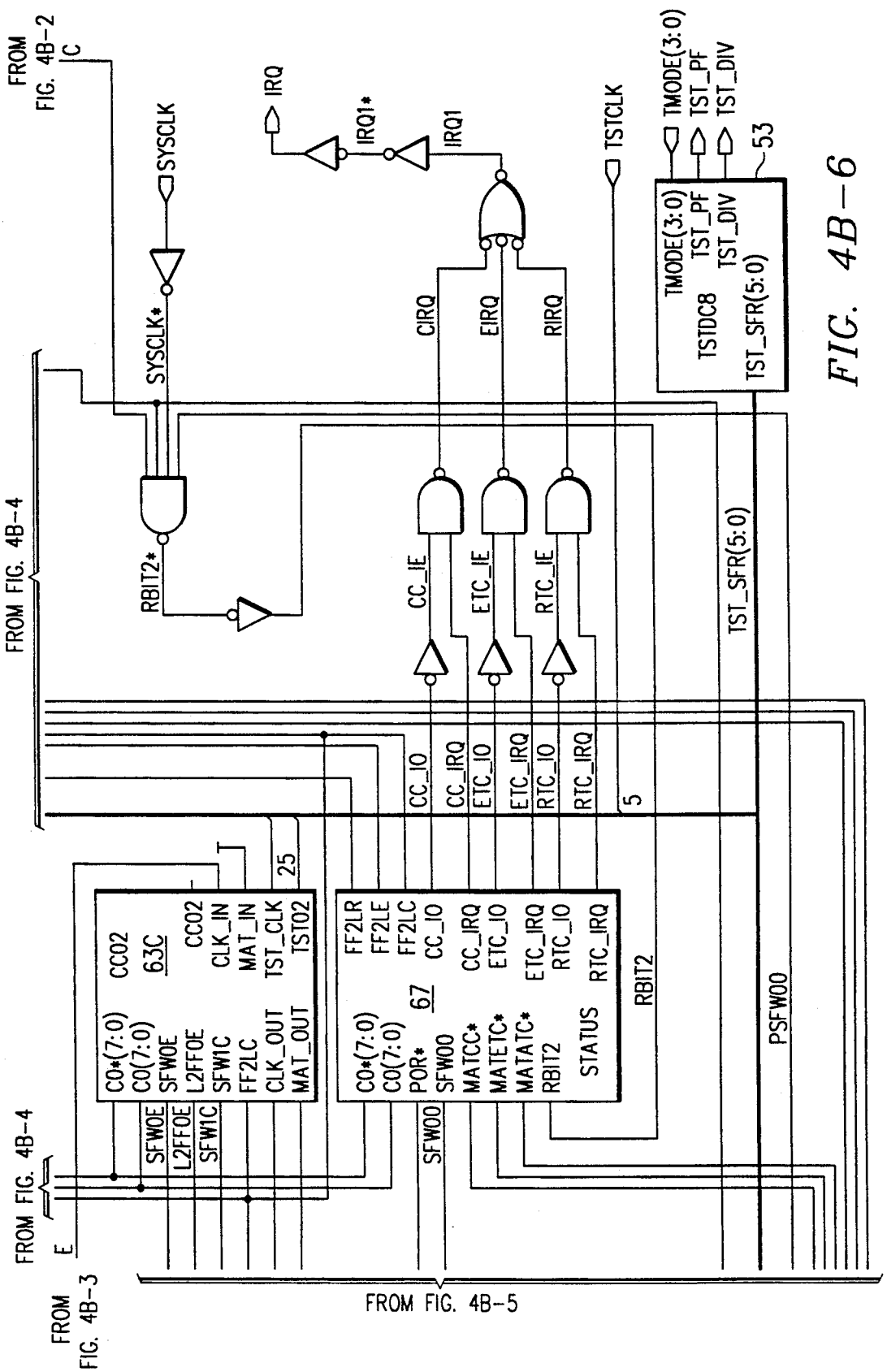

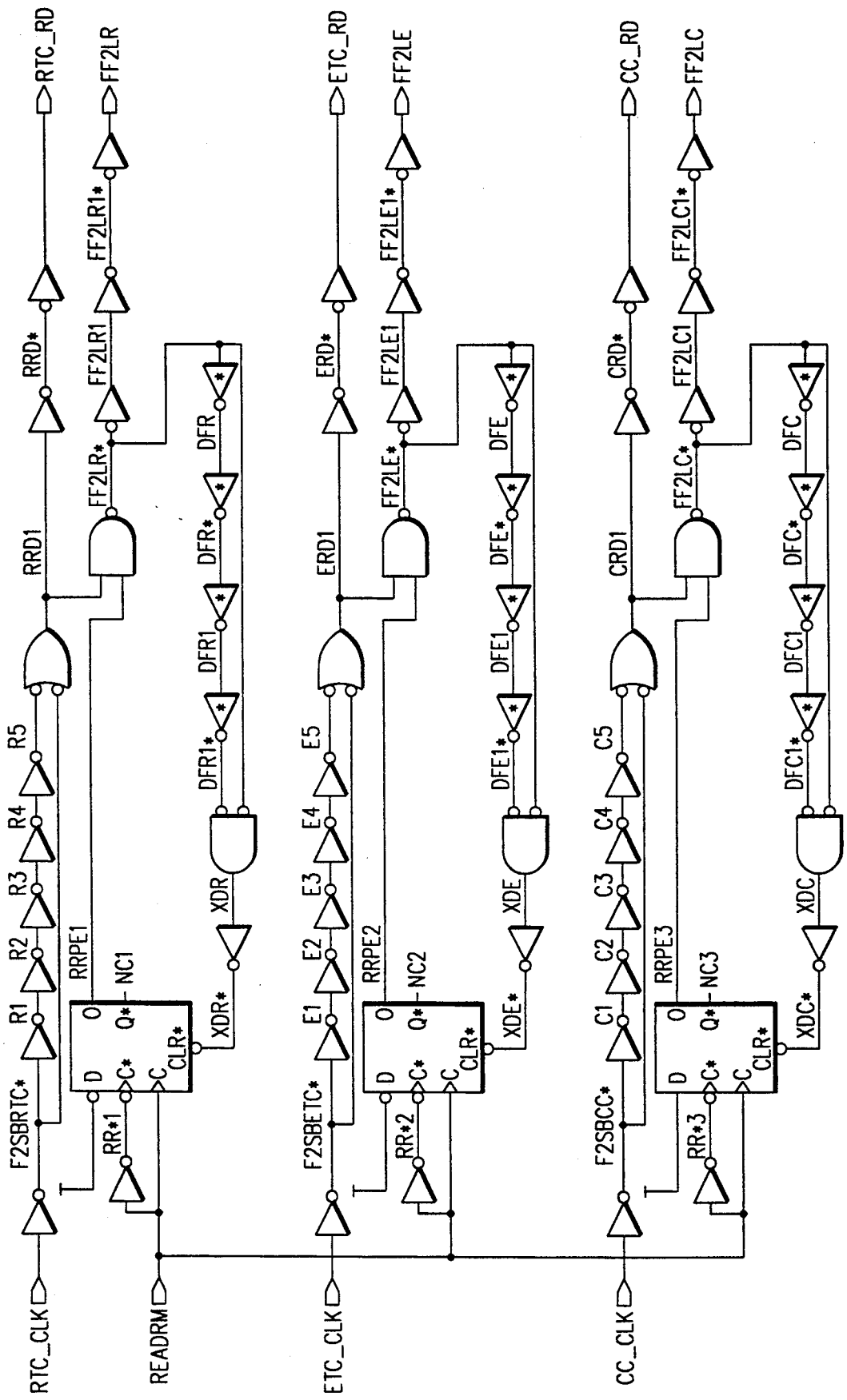
FIG. 4B1

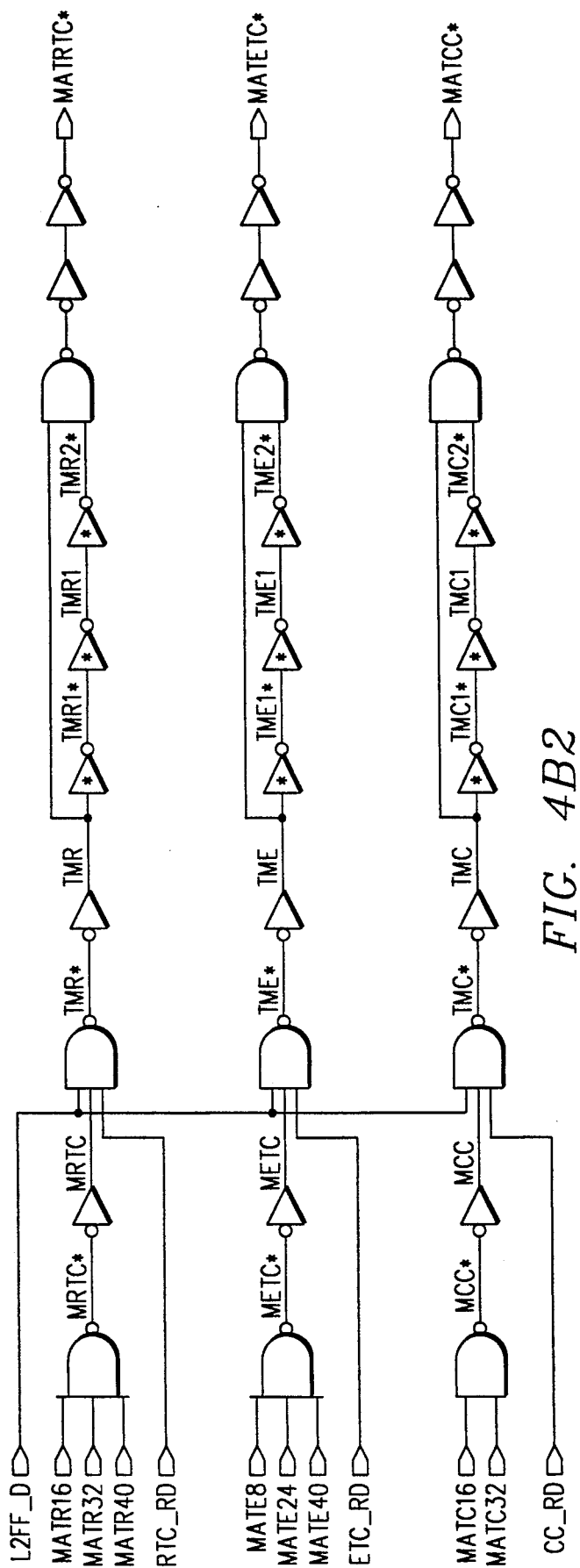
FIG. 4B2

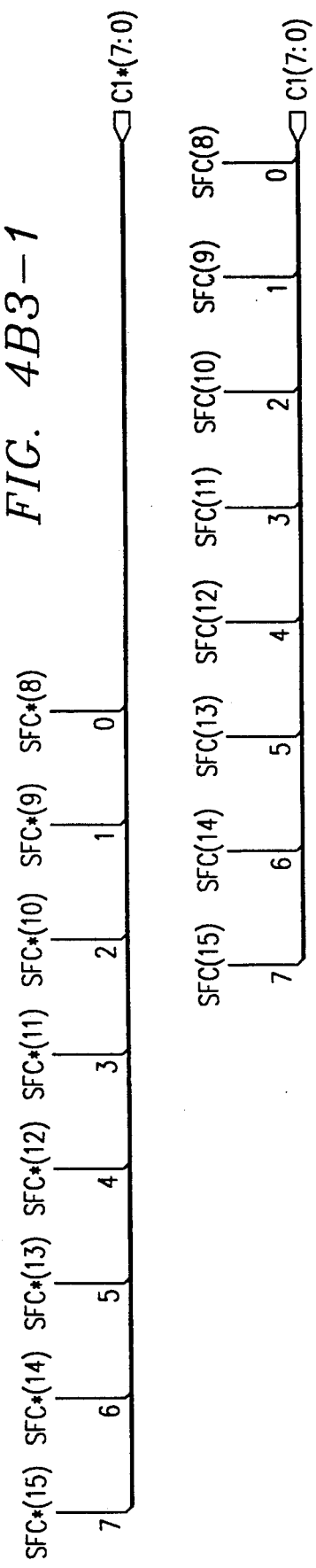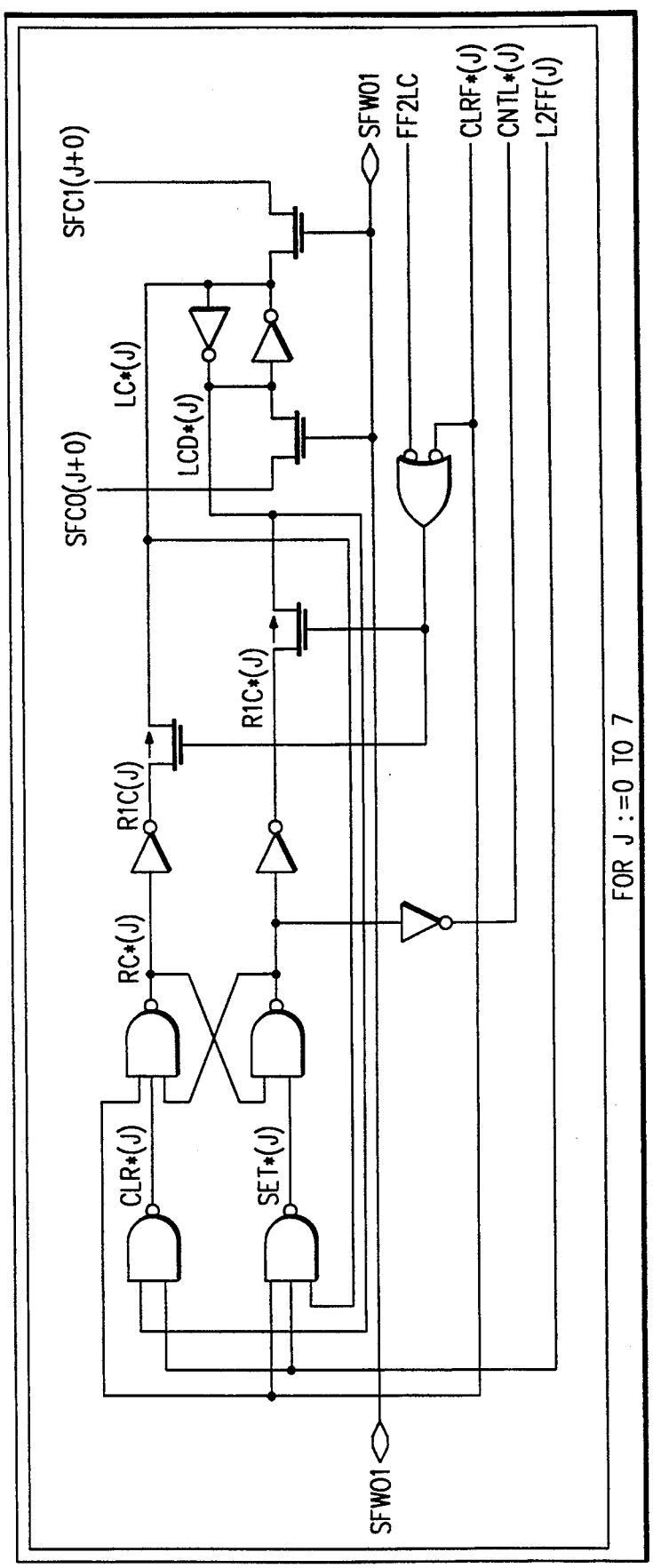
FIG. 4B3-1

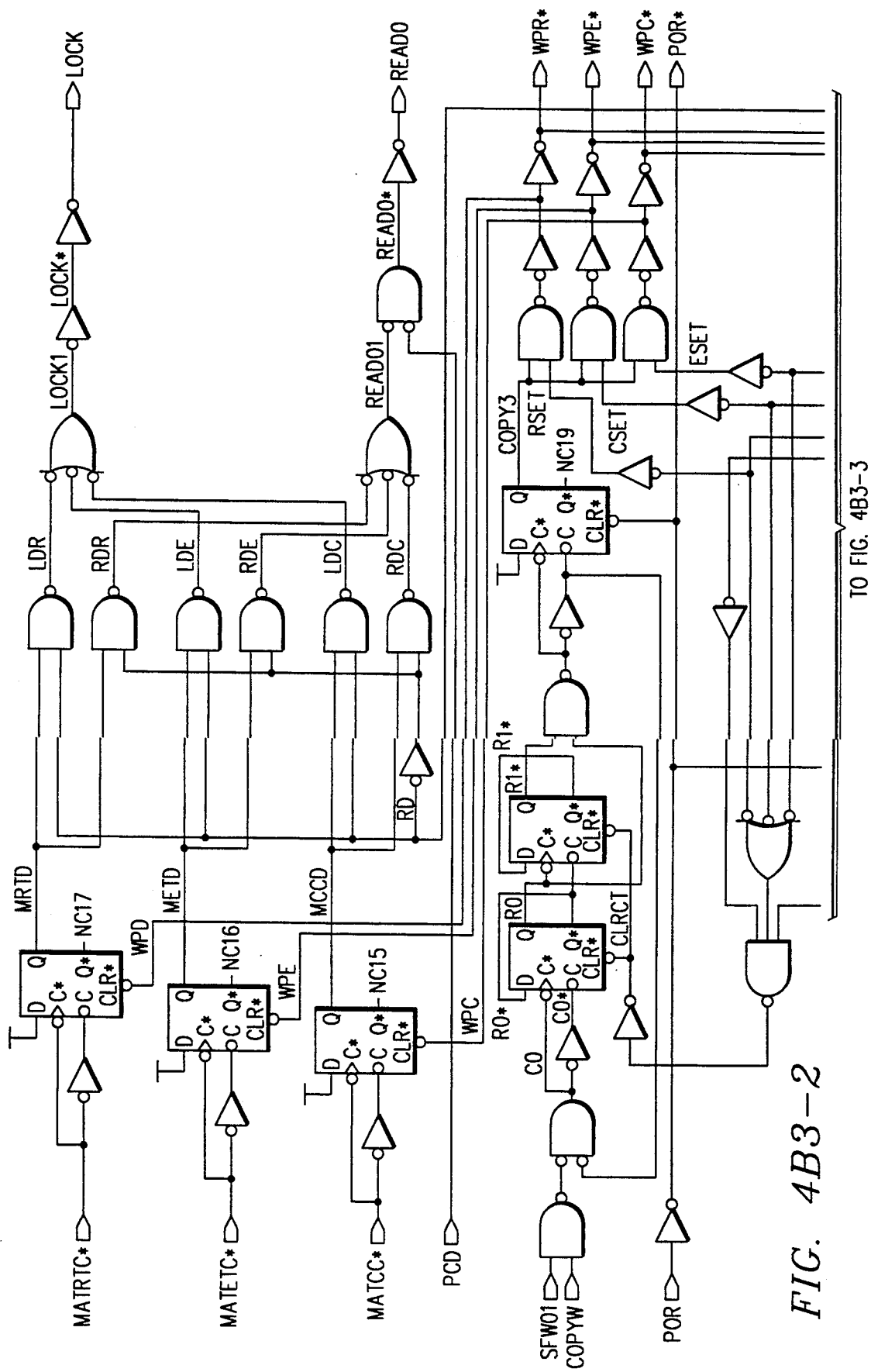
FIG. 4B3-2

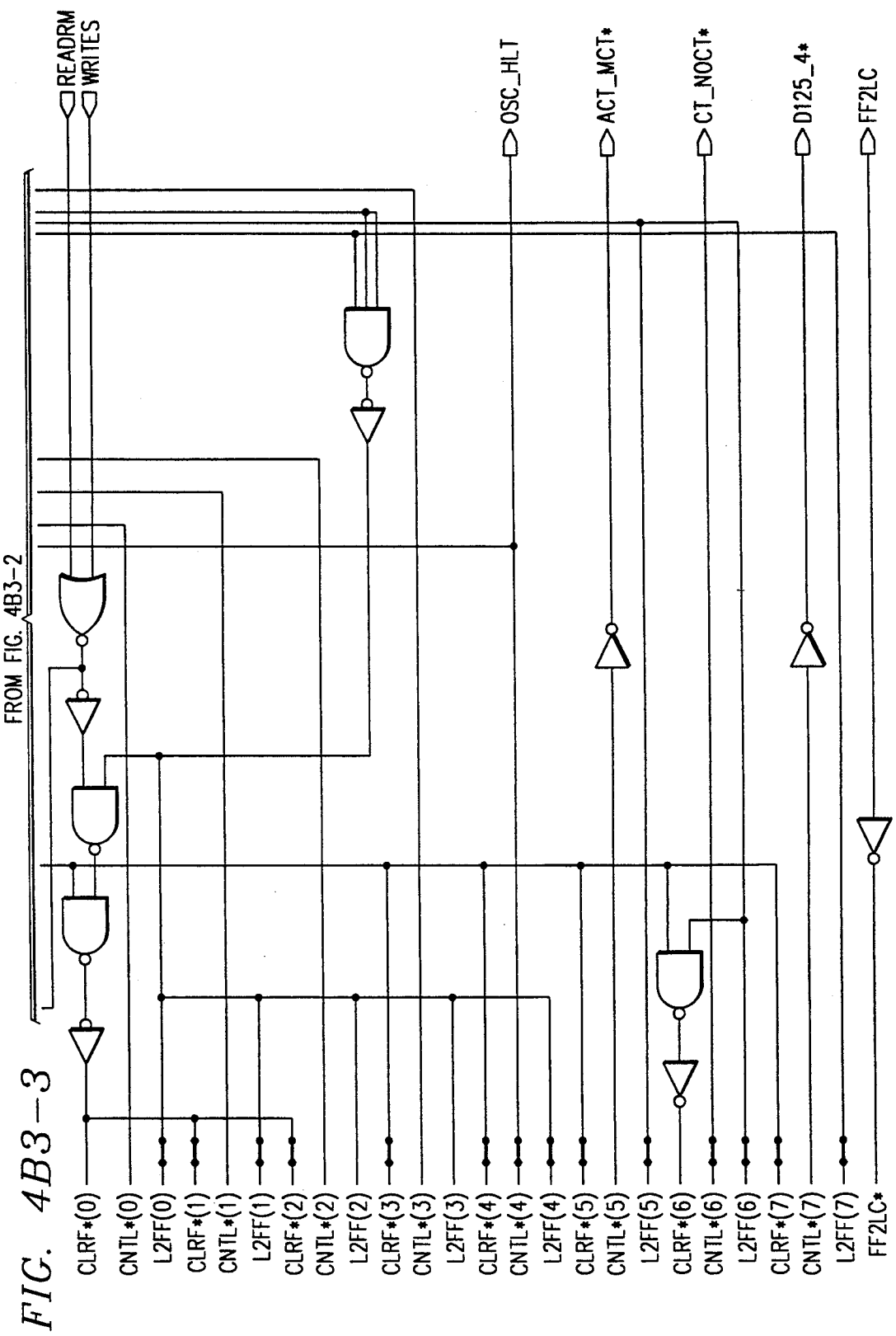
FIG. 4B3-3

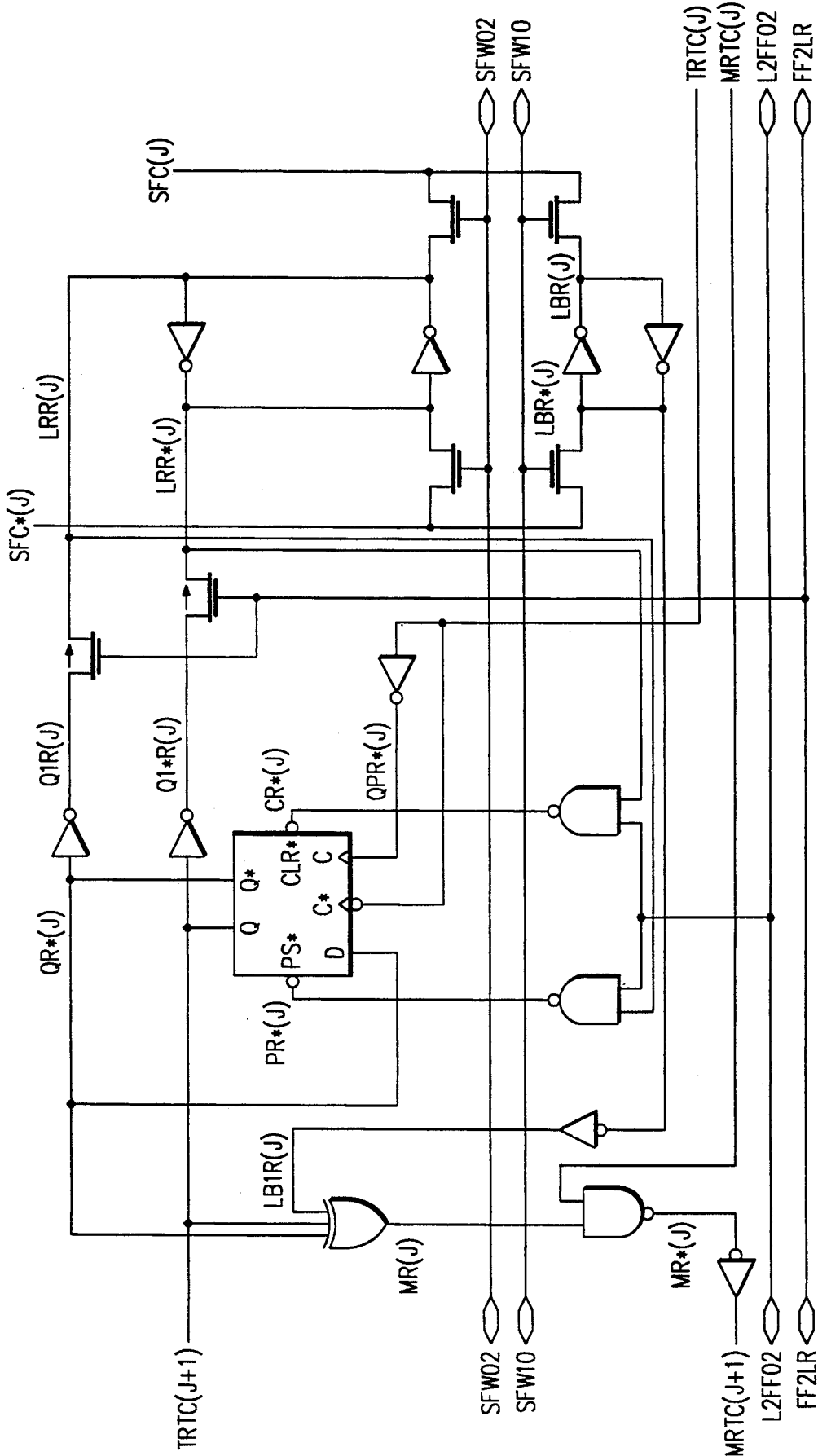
FIG. 4B4

INTEGRATED CIRCUIT WITH BOTH BATTERY-POWERED AND SIGNAL-LINE-POWERED AREAS

PARTIAL WAIVER OF COPYRIGHT

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO OTHER APPLICATIONS

The following applications of common assignee contain at least some drawings in common with the present application, and are believed to have effective filing dates identical with that of the present application, and are all hereby incorporated by reference:

Ser. No. 728,230, filed Jul. 10, 1991, entitled "Power History Monitor Chip";

Ser. No. 727,619, filed Jul. 10, 1991, entitled "Integrated Counter/RAM Array Layout";

Ser. No. 727,638, filed Jul. 10, 1991, entitled "Timekeeping Chip with Clock-to-Memory Update Only on Read Signal";

Ser. No. 727,255, filed Jul. 10, 1991, entitled "Integrated Circuit with Scratchpad Copy to Any Portion of a Page";

Ser. No. 727,639, filed Jul. 10, 1991, entitled "Electronic Key with Three Modes of Automatic Self-Disablement";

Ser. No. 728,229, filed Jul. 10, 1991, entitled "Level-Shifter Circuit for Crossing Power-Supply-Domain Boundaries";

Ser. No. 727,270, filed Jul. 10, 1991, entitled "Socket with Solder Option from Internal One-Wire Bus to Female Pin";

Ser. No. 727,273, filed Jul. 10, 1991, entitled "Power-On-Reset Circuit";

all of which are hereby incorporated by reference.

BACKGROUND AND SUMMARY OF THE INVENTION

The present invention relates to low-power-CMOS integrated circuits, and to modules containing a low-power integrated circuit and a battery.

Battery-Backed ICs

Many system designs have begun to make use of the low standby power consumption of CMOS memory, to provide nonvolatile memory by attaching a very small battery. For example, many personal computers contain a battery-backed clock/calendar, which continues to keep time and date information when the computer is switched off. Many portable applications have also begun to use significant amounts of memory. In such applications, battery lifetime is one of the key performance parameters, from the end-user's point of view. If an integrated circuit which is sold for use in such systems turns out to consume more power than specified, so that the system batteries are exhausted early, this could be very unwelcome to the end-user. A further important class of applications is in packaging an integrated circuit, which includes some memory functions, together with a very small battery. The power supplied by the battery is used to preserve the data in memory while the system power supply is turned off. Thus, this arrangement permits the full advantages of nonvolatile memory to be achieved, without incurring the penalties of high-voltage circuitry and slow write time (as in EPROM or EEPROM floating-gate technology).

Power-Robbing

Various integrated circuits have extracted power from signal lines. For example, Pending PCT Application: Ser.No. PCT/U.S. 90/04286, Filed Jul. 30, 1990, which is hereby incorporated by reference, discloses a line-powered transceiver chip which robs power from an RS-232 line.

Integrated Circuit with Unique ID Number

PCT application PCT/U.S. 90/02891 (Publication No. WO 90/14626), which is hereby incorporated by reference, discloses a class of integrated circuits in which each has a fully unique serial number hard-wired into the chip.

Innovative Integrated Circuit

The disclosed inventions provide an integrated circuit, in which some areas of the chip are powered from battery, but other areas of the chip can draw power from one or more on-chip power-storage capacitors (which are diode-isolated to accumulate charge from an external signal line).

Use of Two Energy-Storage Capacitors

A particularly advantageous innovative teaching is the use of two energy-storage capacitors: one is connected to power the input buffer, and one is connected to power the logic which decodes the received signal.

Thus, the integrated circuit according to this class of embodiments includes at least three separate power domains: one powered by battery voltage; a second domain powered by energy stored in a large on-chip capacitor; and a third domain powered by energy stored in another on-chip capacitor.

The problem is that, as the voltage on the one-wire bus slowly slews down, it may pass through the high-current region (between $V_{cap}-V_{TP}$ and $V_{SS}+V_{TN}$) in which both the NMOS and PMOS transistors of the input buffer are at least partially turned on. If this situation occurs (as it often may), the capacitor which is driving the input buffer will inevitably be drained. However, the use of two capacitors, in the presently preferred embodiment, avoids this problem. The signal line's input buffer draws power from one capacitor, and the decoder logic draws power from another. Thus, even if the first capacitor is depleted by the signal line's staying in the high-current regime, it will be powered up again when the signal line is again driven high; and the charge stored in the second capacitor will permit the decoding logic to operate. Preferably the second capacitor also powers circuitry which encodes a unique serial number for the chip. Thus, even after the battery has died, the chip can be interrogated to ascertain its unique serial number.

BRIEF DESCRIPTION OF THE DRAWING

The present invention will be described with reference to the accompanying drawings, which show important sample embodiments of the invention and which are incorporated in the specification hereof by reference, wherein:

FIG. 4A1 shows the circuit organization of circuit block PWRCAP, which was referred to in FIG. 4A.

FIG. 4A2 shows the circuit organization of circuit sub-block RTOS, which was referred to in FIG. 4A.

FIG. 4A2a shows the circuit organization of circuit block TPOSC, which was referred to in FIG. 4A2.

FIG. 4A3 shows the circuit organization of circuit block BATTEST, which was referred to in FIG. 4A.

FIG. 4A4 shows the circuit organization of circuit block OWPROT, which was referred to in FIG. 4A.

FIG. 4A5 shows the circuit organization of circuit block IOBUF, which was referred to in FIG. 4A.

FIG. 4A6 shows the circuit organization of circuit block POR2, which was referred to in FIG. 4A.

FIG. 4A7 shows the circuit organization of level-translator circuit block LVLT CS, which is referred to in FIG. 4A and elsewhere.

FIG. 4A8 shows the circuit organization of level-translator circuit block LVLT IE, which is referred to in FIG. 4A and elsewhere.

FIG. 4A9 shows the circuit organization of level-translator circuit block LVLT OE, which is referred to in FIG. 4A and elsewhere.

FIG. 4A10 shows the circuit organization for sub-block OWCMD, which is referred to in FIG. 4A4.

FIG. 4B1 shows the circuit organization of block XFER which is referred to in FIG. 4B.

FIG. 4B2 shows the circuit organization of block MATCH, which was referred to in FIG. 4B. This block detects the occurrence of an alarm condition in any of the counters.

FIG. 4B3 shows the circuit organization of block CONTROL, which was referred to in FIG. 4B. In addition to performing routine control functions, note that this circuitry generates a signal LOCK when a match occurs within any of the three counters.

FIG. 4B4 shows the actual detailed implementation of one bit of these counter chains.

FIG. 5 shows an innovative socket which can be used in combination with the chip of the presently preferred embodiment.

DESCRIPTION OF THE PREFERRED EMBODIMENTS

Figure 1:
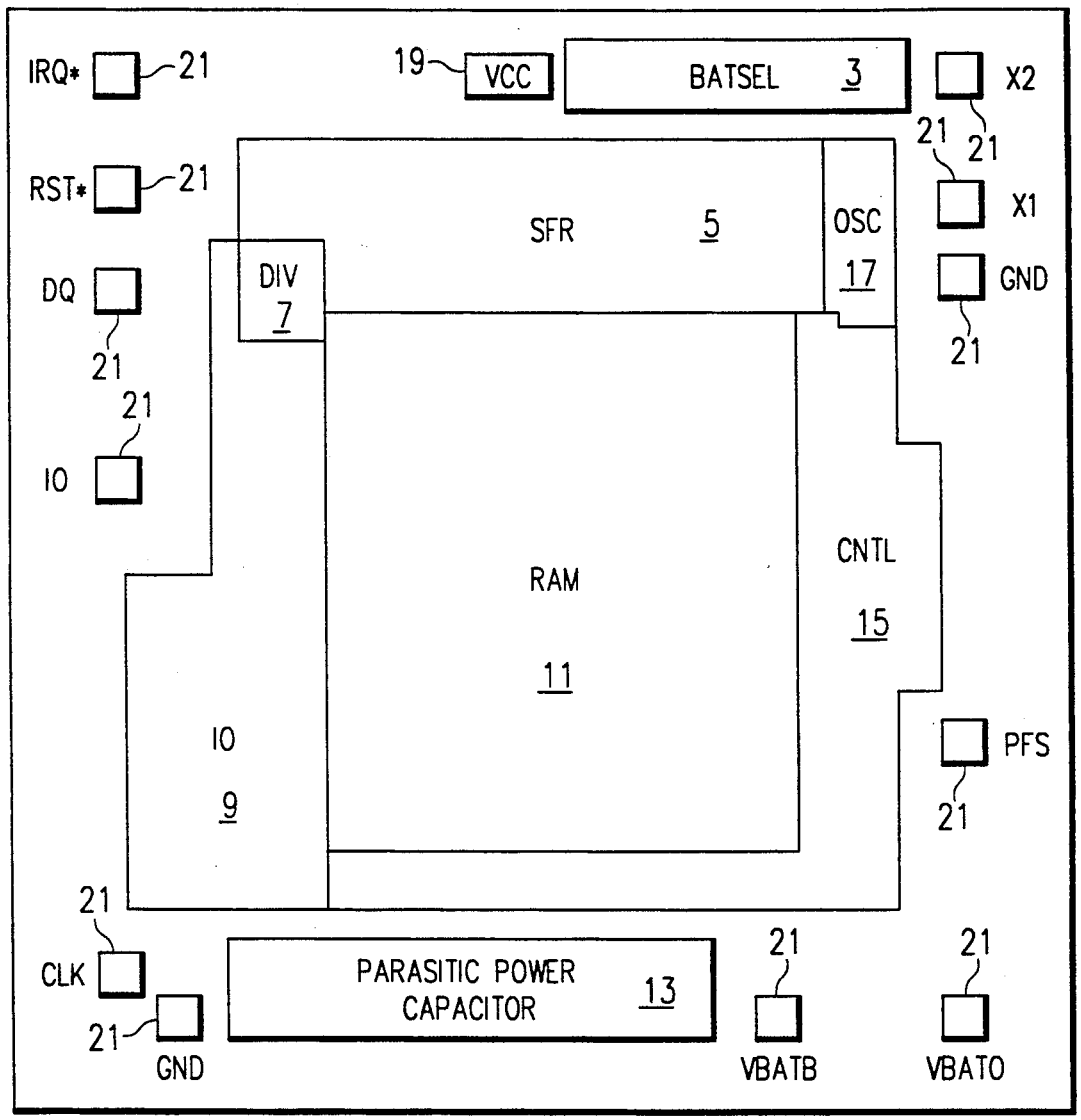
FIG. 1 shows the high-level physical layout of the chip used in the presently preferred embodiment.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Functional Description

Some notable features of the chip of the presently preferred chip embodiment include the following:
Unique 1-wire interface requires only one port pin for communication
Contains real-time clock/calendar in binary format
4096 bits of SRAM organized in 16 pages, 256 bits per page
Programmable elapsed time meter
Programmable cycle counter can sample and store the number of system power-on/off cycles
Programmable alarms can be set to generate interrupts for elapsed time, real-time clock alarms, and/or cycle counter
Lock-out feature provides tamper-proof data
Data integrity assured with strict read/write protocols
3-wire I/O for high speed data communications
Replaces bar code labels with unique 64-bit factory lasered solid state serial number
Space-saving 16-pin SOIC package
Operating temperature range= −40° C. to +85° C.
Battery operating voltage range=2.0 Volts to 5.5 Volts.
Not all of these features are asserted to be separately novel; but this list of features is provided to indicate the general characteristics of the presently preferred embodiment.

The DS2404 EconoRAM Time Chip offers a simple solution for storing and retrieving vital information with minimal hardware. Only one port pin is required for communication. This I/O gives the user access to a unique lasered identification number, a real-time clock/calendar, elapsed time clock, cycle counter, programmable interrupts and 4096 bits of SRAM. All these features are available with or without system power applied. The lasered identification number can replace bar codes for tracking purposes. Using the 1-wire port, this ID can be read when assembly is without power. Utilizing backup energy sources, the data is nonvolatile and allows for stand-alone operation. A strict protocol for accessing the DS2404 insures data integrity. For high speed communication, the traditional Dallas Semiconductor 3-wire interface is provided.

Extensive additional material regarding the one-wire-bus architecture of the preferred embodiment may be found in commonly-owned U.S. patent application Ser. No. 725,793, filed Jul. 9, 1991, entitled "Memory," which is hereby incorporated by reference.

Pin Description

TABLE 1

| PIN | SYMBOL | DESCRIPTION |
|---|---|---|
| 1,16 | Vcc | Power input pins for 3.0 to 5.5 volt operation. |

TABLE 1-continued

| PIN | SYMBOL | DESCRIPTION |
|---|---|---|
| | | Either pin can be used for Vcc. Only one is required for normal operation. (See VBATO & PFS definitions). |
| 2 | IRQ/ | Interrupt output pin - Open drain |
| 3 | RST/ | Reset input pin for 3-wire operation |
| 4 | DQ | Data in/out pin for 3-wire operation |
| 5,7 | NC | No connection pins |
| 6 | CLK | Clock input pin for 3-wire operation |
| 8,13 | GND | Ground pin - Either pin can be used for ground. |
| 9 | VBATB | Battery backup input pin - Battery voltage should be 3.0 volts for power fail protection mode. See VBATO & PFS pin definition. |
| 10 | VBATO | Battery operate input for 2.0-5.5 volt operation. Battery with 2.0-5.5 volts can be used to power the chip. The Vcc & VBATB pin must be grounded when this pin is used to power the chip. |
| 11 | I/O | 1-Wire input/output - Complete communication with the chip can be done using this pin. See definitions of 1-Wire protocol for complete description. Open drain. |
| 12 | PFS | PFS Power fail select - To activate the power fail protection circuitry when using Vcc and battery backup, this pin must be connected to the VBATO. In this mode the power monitor circuitry is enabled and will write protect all inputs when Vcc < VBATB. When operation is required from 2.0-5.5 volts, use VBATO for power. This pin must be connected to ground. In this mode, no input pin can be held in an intermediate voltage level, i.e., 0.7 < VIN < 2.3 V. All inputs must be at VIL or VIH levels. See DC Characteristics for VIL & VIH. Operational voltage range is restricted in this mode to VBATB to 5.5 V. |
| 14,15 | X1,X2 | Crystal input pins. Connections for a standard 32.768 KHz quartz crystal, Daiwa part number DT-26S (be sure to request 6 pf load capacitance). |

Table 1

FIG. 1 shows the high-level physical layout of the chip used in the presently preferred embodiment. BATSEL 3 refers to location of the Battery Select circuitry. SFR 5 refers to the location of Special Function Register circuitry. DIV 7 refers to location of the Divider circuitry that comprises a countdown chain and reduces the output from the Oscillator (OSC 17). IO 9 refers to location of the Input/Output circuitry. RAM 11 refers to location of Random Access Memory circuitry. Parasitic Power Capacitor 13 refers to location of the Parasitic Power Capacitor 13. CNTL 15 refers to location of the Control circuitry. OSC 17 refers to location of the Oscillator circuitry. VCC 19 refers to the location of VCC Power Supply circuitry. Pins 21 show the location of the respective pins that correspond to Table 1 described above.

Figure 2A:
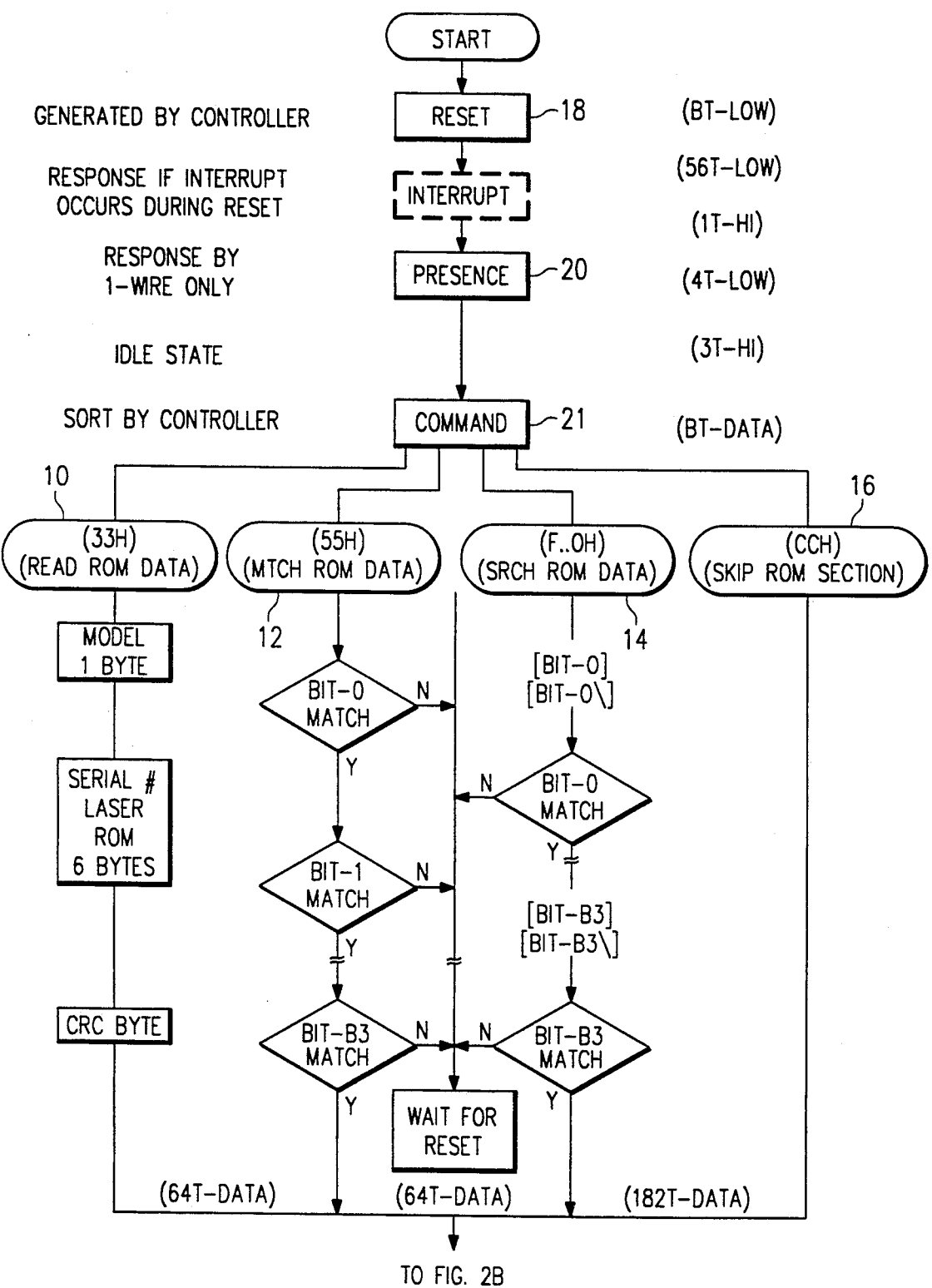
FIGS. 2A and 2B are a single flow chart, on two sheets, showing the sequence of operations used, in the presently preferred embodiment, to interface to the one-wire bus, and to respond to memory read, scratchpad read, scratchpad write, and scratchpad copy commands.

The real-time clock, elapsed timer, real-time alarm, elapsed time alarm, cycle counter and control/status register are all read/write registers. Flag bits in the status register are read-only bits. Data is sent from the host via the serial interface(s), least significant bit (LSB) first. All data is in binary format. As shown in FIG. 2A following briefly describes the 1-wire protocol: The host generates a reset pulse that clears all previous commands and begins communications. The DS2404 then sends a presence pulse 20 to acknowledge that reset has occurred and it is ready for a new command. As an example to illustrate how the protocol works, a typical command for 1-wire communications is Read ROM Data. The host sends a command byte 33h (correlates with Read ROM Data 10); after which it drives the I/O line to a low state for less than 15 μsec. It then releases the I/O line and samples the line condition (high or low level) at a time greater than 15 μsec but less than 60 μsec. If the voltage level on the I/O is high, VIH, the bit is a one. The host drives and samples the I/O line 64 times to complete the reading of the lasered ROM. The model number (04h for the DS2404) is the first byte read. The unique serial number contained in the next 6 bytes is read second; the CRC byte 22 used to verify the data is read last. The process then begins again—the host sends a reset pulse and the DS2404 responds with a presence pulse.

In order to ensure data integrity, multiple commands are required to read or write to the DS2404. (See the flow chart in FIGS. 2A-2B.) All data written to the DS2404 must be written to a 256-bit scratch page. Data can be read from the scratch page or secure memory, which is 16 pages with 256 bits per page. There are four basic commands that enable reading and writing: Write to Scratch Page 2, Read Scratch Page 4, Read Secure Memory 6, and Copy Scratch Page to Secure Memory 8. See the section entitled "Command Byte" for definitions.

An important feature of the Copy Scratch to Secure Memory command 6 is the authorization code required for data transfer. This code is located in the first three bytes of the scratch page. The first two bytes are the target address that the host sent to the DS2404 when data was written to the scratch page. The third byte, generated by the DS2404 when data was written to the scratch page, contains the ending address within the scratch page. That is, if 256 bits were written, then a 0Fh would be the third byte read.

This ending address also includes status bytes to verify that data wasn't corrupted while being sent to the DS2404. A partial byte flag is set if less than a full byte was written into the scratch page; an overflow flag is set if more than 256 bits are sent. The last flag bit, the Authorization Accepted flag, is set if the authorization code matches and the data is transferred from scratch memory to secure memory.

Here is an example of how this transfer is accomplished. The Skip command (CCh) 16 is issued from the host, followed by the Copy Scratch to Secure Memory command (A5h) 6. Then the unique authorization code is sent; this consists of two address bytes along with the ending address byte read when verifying scratch page data. If these three bytes match the scratch page bytes, the data is transferred to secure memory and the Authorization Accepted (AA) bit box 24 is set to a one. The DS2404 remains in a busy state until the data transfer is complete. Having sent a reset, the host then reads the third byte in the scratch page to verify the AA bit is set and data has been transferred. See the section entitled "Command Byte" for more information.

The 3-wire interface bypasses the Read ROM 10, Match ROM 12, Search ROM 14, and Skip ROM 16 commands used with the 1-wire protocol. Consisting of Reset/, DQ, and Clock, the 3-wire is a high-speed communications interface that transmits/receives at a rate of 2 MHz. To communicate via this interface, only the command bytes for access to secure memory and scratch memory are required. No reset or presence pulses are available.

Communication Protocol:
The following steps should be noted in relation to the 1-wire/3-wire protocol:
1-wire Interface When the 1-wire interface is used, all communications to and from the DS2404 are accomplished via a single interface lead. Data is read and written through the use of time slots to manipulate bits and a command word to specify the transaction.

Write Time Slots

A write time slot is initiated when the host pulls the data line from a high logic level to a low logic level. There are two types of write time slots: Write One time slots and Write Zero time slots. All write time slots must be a minimum of 60 μsec and a maximum of 120 μsec in duration. There is a minimum of a 1 μsec valid access recovery time between time slots.

For the host to generate a Write One time slot, the data line must be pulled to a logic low level and then released, allowing the data line to pull up to a high level within 15 μsec after the start of the write time slot.

For the host to generate a Write Zero time slot, the data line must be pulled to a logic low level and remain low for the duration of the write time slot.

Read Time Slots

The host generates read time slots when data is to be read from the 1-wire interface. A read time slot is initiated when the host pulls the data line from a logic high level to a logic low level. The data line must remain at a low logic level for a minimum of 1 μsec and a maximum of 15 μsec. This maximum time of 15 μsec includes the time required for the data line to pull up to a high level after it is released. The state of the 1-wire data line must be read by the host within 15 μsec after the start of the read time slot. After this time, the state of the data is not guaranteed. All read time slots must be a minimum of 60 microseconds in duration with a minimum of a one microsecond valid access recovery time between individual read time slots.

1-wire Protocol

The 1-wire protocol can be viewed as having three distinct layers. These layers are the Presence Detect layer 20, the Reset layer 18, and the Command layer 21.

Presence Detect

The Presence Detect layer 20 is used to signal to a host device either 1) that a new device has been attached to the 1-wire port, or 2) the device(s) on the 1-wire have cleared previous commands (after a reset pulse). This handshake is used for feedback to the host.

After Presence Detect, all devices on the 1-wire are ready for the next command. The 1-wire port from the host remains at a logic high level during quiescent times between read and write time slots. This high time must be present for a minimum of 15 μsec before the new device can assert a presence detect signal. The presence detect signal will be a logic low level asserted by the newly attached device which remains low for a maximum of 240 μsec and is then released. This low logic level can be detected by the host and used as an interrupt condition for the host processor.

Device Reset

The Reset layer 18 is used to reset the attached 1-wire devices. This allows the host to place the 1-wire device or devices into a known state at any time. The reset signal consists of a logic low level asserted by the host for a minimum of 480 μsec. After this, the host must release the 1-wire signal line and allow it to rise to a logic high level. This high logic level must be maintained by the host for a minimum of 480 μsec before any data can be exchanged. During this logic high time, any device present on the 1-wire signal line will assert its presence-detect waveform.

Interrupts:

The DS2404 interrupts are provided on two pins. The IRQ, pin 2, and the I/O, pin 11 in the Table 1, which describes the pin layout. The IRQ pin is normally high and will transition to a logic 0 level when an interrupt occurs. The I/O pin will send a high to low pulse when a interrupt occurs. The duration of this pulse is 3.0 msec. If communication is occurring on the I/O pin when an internal interrupt is generated, the interrupt will not be sent until the user generates a reset pulse to stop communications. The reset pulse is normally 480 μsec in duration. When the reset is sent, the interrupt pulse width will be added to the reset pulse. The resultant pulse will by typically 3.5 msec in duration. To use the I/O interrupt, the user must sample the I/O signal after the 480 μsec to determine if the interrupt signal is active. If I/O Signal is in the idle mode, the interrupt pulse will pull the I/O low for 3 msec. Idle mode is defined as: 1. reset pulse has been sent, 2. no communication has occurred for 1 msec after the presence pulse was sent, and the I/O signal is at a VIH level. To reset the IRQ, pin 2, the status register, address 0200 h, is read. Reading this register will clear all interrupt flags. See control register definition.

1-wire Commands

There are four commands which can be issued by the host on the 1-wire port. These are:

1) [33 hex] read ROM data 10
2) [55 hex] match ROM data 12
3) [F0 hex] search ROM data 14
4) [CC hex] pass-through mode 16

Read ROM Data

Upon recognition of the command word [33 hex], the DS2404 is ready to respond to the next eight read time slots with the Type Identifier number. This number is a hexadecimal 02 and is unique to the DS2404 part. After receipt by the host of the Type Identifier number, the DS2404 is ready to output the unique 48-bit serial number contained within the device. The host must issue 48 read time slots to retrieve this number. Following the 48-bit serial number is an 8-bit Cyclic Redundancy Check (CRC) value. This CRC value has been calculated over the Type Identifier and Serial Number, 56 bits total, using the following polynomial:

$$px = x_2 + x_3, \text{ assuming } x_0 = > LSB$$

This calculated value is then lasered into the part at the time of manufacture. To read the CRC value, the host must issue eight additional read time slots.

Match Rom Data

The Match ROM data command 12 (in FIG. 2A) is used as a device select when multiple 1-wire devices are connected to a single bus. This command allows the host to address any one of the multiple 1-wire devices on an individual basis. To do a Match ROM data command 12, the host must issue the command [55 hex] to the device with eight write time slots. Following the command byte, the host must write the desired device's type identifier, serial number, and CRC byte. If all of these values match the data stored internally in the ROM, the DS2404 can now be accessed using the standard DS2404 commands and protocol. If any of the bit values transmitted by the host fail to match the ROM data pattern, the access will be terminated. To return from a pattern fail condition, the host must issue a Reset command:

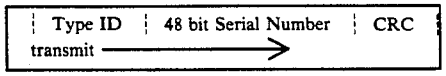

Search Rom Data

The Search Rom Data command 14 (in FIG. 2A) allows the host 1-wire device to poll efficiently to determine the unique ROM address of all devices on the 1-wire bus. In this mode, each of the bits of the ROM data requires three time slots on the 1-wire bus. The first two time slots are read time slots in which the DS2404 transmits back to the host value of the ROM bit followed by its complement. The third time slot is a write time slot in which the host supplies its desired value for the ROM bit. The DS2404 then compares the desired value with the actual ROM bit. If they disagree, the DS2404 will go to a high impedance state until a RESET is issued by the host. If the bits agree, the DS2404 increments its internal counter to point to the next bit in the ROM data and then repeats the same set of three time slots for the next bit. If all bits of the ROM are matched correctly, the host may access the DS2404 with the standard command structure for the part.

Example of a Rom Search

The following example of the ROM search process assumes two different DS2404s are connected to the same 1-wire bus. The ROM data of the two DS2404s begins as shown:

ROM0-00110101 ...
ROM1-00010001 ...

The search process is as follows:

1. The host begins by resetting all devices present on the 1-wire bus.
2. The host will then issue the Search ROM Data command on the 1-wire bus.
3. The host executes two read time slots and receives a zero bit followed by a one bit. This indicates that all devices still coupled have zero as their first ROM bit.
4. The host executes a write zero time slot as the third slot in the set of three.
   This action keeps ROM≠ and ROM1 coupled.
5. The host executes two read time slots and receives a zero bit followed by a one bit. This indicates that all devices still coupled (ROM≠ and ROM1) have a zero as their second ROM bit.
6. The host supplies a write zero time slot as the third time slot to keep ROM≠ and ROM1 coupled.
7. The host executes two read time slots and receives two zero bits. This indicates that both one bits and zero bits exist as the third bit of the ROM I.D.'s of the devices coupled.
8. The host executes as write zero time slot as the third bit. This decouples ROM≠, leaving only ROM1 still coupled.
9. The host reads the remainder of the ROM bits for ROM1 using three time slots for each bit. After this, the host can communicate to the underlying logic if desired. This completes the first ROM I.D. search pass, in which one of the devices was found.
10. The host starts a new ROM search by repeating steps 1 through 7 above.
11. The host supplies a write one time slot as the third bit. This decouples ROM1, leaving only ROM≠ still connected.
12. The host reads the remainder of the ROM I.D. bits for ROM≠ and communicates with the underlying logic if desired.

If more devices are present on the 1-wire, the same structure as presented above will be used to determine the unique ROM I.D. of each attached device. As soon as multiple devices are detected, a series of writes will be used to disable that branch in the search path.

The host learns the unique address (ROM data pattern) of one 1-wire device on each ROM SEARCH operation. The time required to derive the part's unique address is:

$$960 \ \mu sec + [8 + 3 \times 61 \ \mu sec] \times 61 \ \mu sec = 13.16 \ msec$$

The host is therefore capable of identifying 75 different 1-wire devices per second.

Additionally, the data obtained from the two read time slots of each set of three time slots have the following interpretations:

00-There are still devices attached which have conflicting bits in this position.
01-All devices still coupled have a zero bit in this bit position.
10-All devices still coupled have a one bit in this bit position.
11-There are no devices attached to the 1-wire bus (this is an error condition).

Pass-Thru Mode

The Pass-Thru command is used to allow a host connected to the 1-wire bus to gain access to the DS2404 directly. It can be used only when there is one DS2404 on the 1-wire bus. This command bypasses the serial number internal to the DS2404 and allows the host to directly control the DS2404 with the DS2404 commands and protocol.

3-wire Bus

The 3-wire bus is comprised of three signals. These are the RST\(reset) signal, the CLK (clock) signal, and the DQ (data) signal. All data transfers are initiated by driving the RST\input high. The RST\signal provides a method of terminating a data transfer.

A clock cycle is a sequence of a falling edge followed by a rising edge. For data inputs, the data must be valid during the rising edge of a clock cycle. Command bits and data bits are input on the rising edge of the clock and data bits are output on the falling edge of the clock. All data transfers terminate if the RST is low and the DQ pin goes to a high impedance state. When data transfers to the DS2404 are terminated by the RST\signal going low, the transition of the RST\going low must occur during a high level of the CLK signal. Failure to ensure that the CLK signal is high will result in the corruption of the last bit transferred. The command bytes are the same for 1-wire and 3-wire.

1-wire/3-wire Arbitration

The DS2404 can utilize both the 1-wire and the 3-wire busses simultaneously. Neither input bus has priority over the other. Instead, if both inputs are being used, the signal arriving first will take precedence. More simply, if the 1-wire interface becomes active before the 3-wire interface, all communications will take place on the 1-wire bus. The 3-wire bus will be ignored in this case. The same condition occurs for the 1-wire interface if the 3-wire interface becomes active first.

Command Byte:

The command byte is sent to select read memory, read scratch, write scratch, or copy scratch to memory.

Write Scratch Memory Page (Command Byte ≠Fh)

After the command byte 2, ≠Fh, 2 address bytes must be sent. These bytes define the target page (S0-S15) where the data written into the scratch page will be copied. Addressing is on page boundaries. Data written to the scratch page beyond the 32nd byte will be ignored. This address will be saved in the scratch page and will be sent to the user for verification when the scratch page is read. See Copy Scratch Page to Secure Memory Page and Read Scratch Page definition. After the last address bit (S15) is sent, the user can begin to write to the scratch page at the byte address (S0-S4). If less than 8 bits are written into a byte, the partial byte flag (pf) is set (bit E5). If this flag is set and a Copy Scratch Page to Secure Memory Page command is sent, the bytes will be copied as is to the target address page. If data is sent beyond the last byte in the page, the additional bytes/bits are ignored and the overflow flag (of) will be set to a "1"(bit E6). Flags E5 and/or E6 will be cleared only when new data is written to the scratch page that does not have partial byte and/or overflow condition.

Figure 2B:
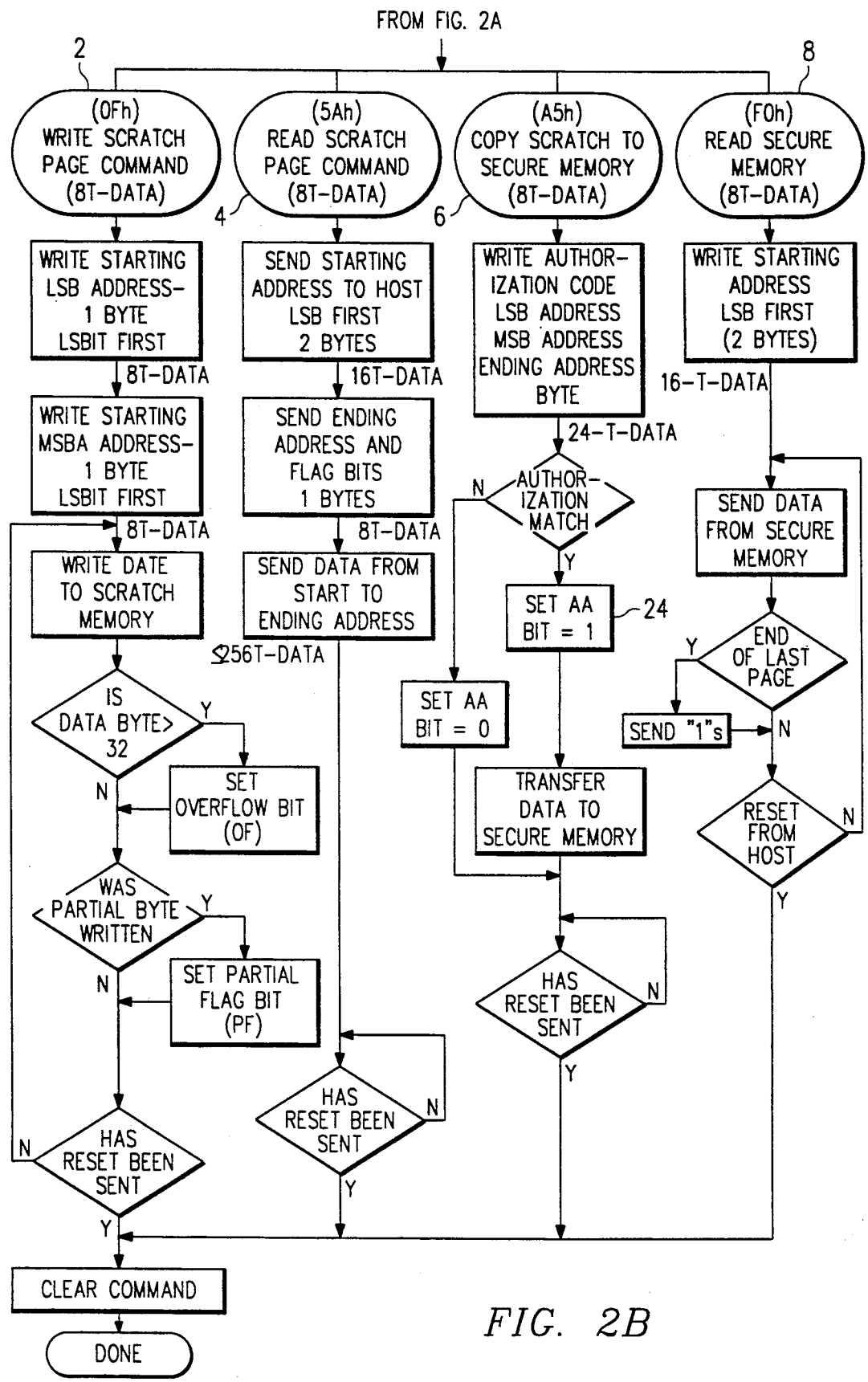

Read Scratch Page (Command Byte 5Ah) 4 (in FIG. 2B)

After the command byte 21, 5Ah, the user can start to read scratch page data. The first 3 bytes read will be the last target address (S0-S15) sent by a write scratch command and a byte containing the ending byte address (E0-E4), overflow flag (of) bit E5, partial byte flag (pf) E6, and authorization accepted (aa) bit E7. If a Copy Scratch to Secure Memory command 6 (in FIG. 2B) is sent and the authorization code is not accepted, bit E7 is set to zero. This bit will be set to a "1" if the code matches. It will be reset when the next Write to Scratch Page command 2 (in FIG. 2B) is sent with a target address. Flags E5 and/or E6 will be cleared only when new data is written to the scratch page that does not have partial byte and/or overflow condition. The data is then read from the starting address. To stop reading, a reset pulse is sent by the user. If reading occurs beyond the end of the page, all "1"s will be read and a reset will be required to regain access to the DS2404.

Copy Scratch Page to Secure Memory Page (Command Byte A5h) 6 (in FIG. 2B)

After the command byte, the user sends the target address (S0-S15) and the ending address/status byte (E0-E7) that was read from the scratch page during verification of scratch data.

This target address and ending address is verified internally and when matched, the data in the scratch page is copied to secure memory. Bit E7 (aa) will be set to a logic '1'. (See Read Scratch Memory for bits E0-E7 definition).

Read Secure Memory Page (Command Byte F≠h) 2 (in FIG. 2B)

The user must send 2 bytes (S0-S15) after the command, F≠h. The bits, S0-S4, select the beginning byte address within the page (0-31). Bits S5-S15 select the page address. The user can read bytes until a reset pulse is sent or until the last byte in the last page is read. If reading is attempted beyond the last byte in the last page, only logic "1"s will be read. A reset pulse is required to regain access to the DS 2404.

Address Select Bytes (S0-S15)

These bits are read/write bits that define the target page address and the byte address within the page. Bits are active when set to a logic "1". S0-S4 define the byte address within a selected page. S5-S15 define the target page address.

These bits are sent LSB to MSB.

Page Memory Map Definition

Secure memory pages =0000h-01FFh=sixteen (256 bit) pages. The term "secure memory" is used to define memory that can only be read. To write to this memory, the user must write to the scratch page, verify the data in the page, and authorize the coping of that data to secure memory.

The user can start reading any where in the memory map and continue reading until a reset is sent by the user. If reading continues beyond the last byte in the last page, only logic "1"s will be sent. The user will be required to send a reset pulse (480 μsec) before access will again be granted. If more than 32 bytes are read when reading Scratch Memory Page, only logic "1"s will be read until the user sends a reset pulse.

Control Register (0200h)

For better understanding of the preferred architecture, the following is a more detailed analysis of the control register assignments.

Mode Select Register-All alarm flags will be reset to a logic low state when the correct bit of this register is read.

Bit 0=RTCF=The RTC alarm has occurred and set this bit to a logic "1" state. This bit will clear when bit 1 has been read. This is a read only bit.

Bit 1=ETCF=This bit is set to a logic "1" when the elapsed time alarm occurs. This bit will clear when bit 1 has been read. This is a read only bit.

Bit 2=RTCE=This bit, set to a logic "1", will enable the interrupt for the real-time clock alarm. When the alarm condition exists, bit 0 will be set to a logic "1" and an IRQ will be generated. This is a read/write bit. Note: All interrupts will be held in a pending condition if communication is detected on the I/O pin. When the communication has completed, the interrupt will be sent to the host.

Bit 3=ETCE=This bit, set to a logic "1", will enable the interrupt for the elapsed time clock alarm. When the alarm condition exists, bit 1 will be set to a logic "1" and an IRQ will be generated. This is a read/write bit. Note: Interrupts generate on the 1-wire I/O address will be held in a pending condition if communication is detected on the I/O pin. When communication has completed, the interrupt will be sent to the host via the I/O pin.

Bit 4=OSC\=This bit is set to a logic "0" to enable the clock oscillator.

Bit 5=DSEL=Delay select bit. This bit is used to select a delay time for starting the elapsed timer in Auto mode. See bit 7 definition for Auto. When set to a logic 0, the delay for starting and stopping the elapsed timer is 3.4+0.5 msec. When set to a logic 1, the delay will be 123+2 msec.

Bit 6=/ELAP=Manual Start/Stop command bit. This bit is set to a logic "0" to start the elapsed time clock. Setting this bit to a logic "1" will stop the elapsed time clock. Bit 7 must be set to a logic "0" to use the elapsed timer in the manual mode.

Bit 7=AUTO=This bit, when set to a logic "1", enables the elapsed time clock in the automatic mode. The elapsed timer will start or stop depending on the voltage levels on the I/O input and the Bit 5 setting. The requirements for this are listed below. Example: When bit 5 is set to a logic 1, the elapsed time will start when the voltage applied to the I/O pin is greater than 2 volts and has been at this voltage level longer than 123+2 msec with no transitions on the I/O. The elapsed time will stop when the voltage on the I/O pin is less than 0.8 Volts for 123+2 msec with no transitions on the I/O pin. The elapsed time registers will accumulate on time. One start state followed by a stop state is defined as one cycle. When bit 7 is set to a logic "0", the elapsed timer can be controlled by bit 6, and the cycle counter will no longer count cycles until returned to Auto mode.

Real-Time Clock (Address bytes 0201–0205$h$)

The real-time clock register and alarm register are located at address 0201$h$–0205$h$ and 020B$h$–20F$h$. The real-time clock is assigned address 0201–0205$h$. The clock and alarm data is in binary format with the LSB equal to 256th of a second. The total count of the 5 bytes is a calendar of 136 years. The alarm is a match of bits in the alarm bytes to the RTC bytes. The alarm registers are located 020B$h$–020F$h$.

Elapsed time–Address bytes 206$h$–20A$h$

The elapsed time and alarm registers are located at address 206$h$–20A$h$ and 210$h$–214$h$. The elapsed time registers will accumulate the time in binary format with the LSB=256th of a second. The elapsed time alarm (bytes 10$h$–14$h$) is programmed by the user and an alarm condition exists when the alarm byte count matches the elapsed time bytes count.

Cycle counter–Address bytes 215$h$–217$h$

The cycle count registers require 3 bytes. These registers will accumulate the (binary) number of times the voltage at the I/O pin transitions from low to high level and back to a low level. One cycle is defined in the bit 7 Auto definition. These registers can be cleared only by the user writing "0"s to these registers. The time base for counting cycles is determined by the DSEL bit 5.

Overall Organization

FIG. 1 shows the high-level physical layout of the chip used in the presently preferred embodiment.

Figures 1, 4:
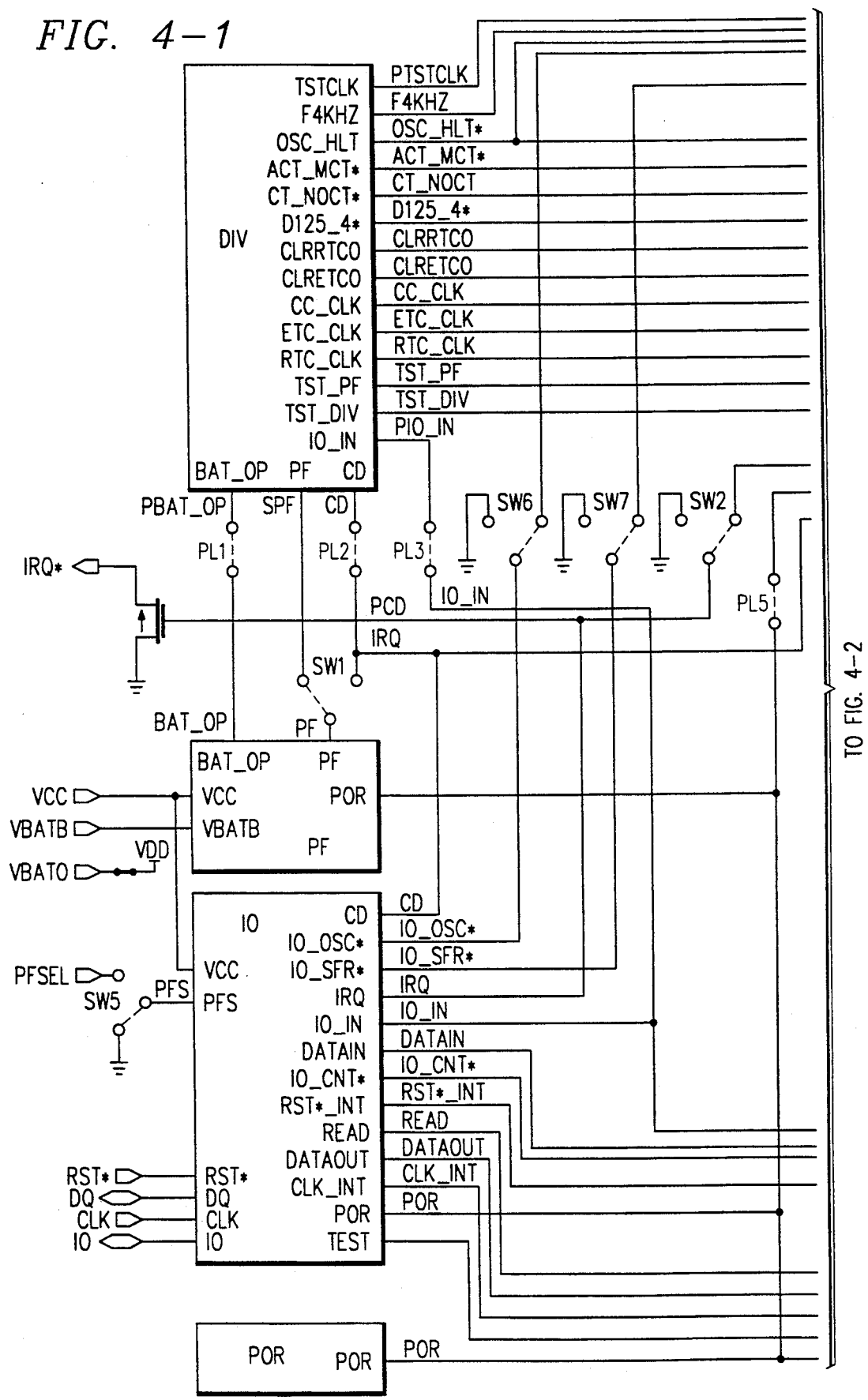
FIG. 4 shows the high-level circuit organization of the chip used in the presently preferred embodiment.

Oscillator (OSC 17 in FIGS. 1 and 4)

The crystal-controlled oscillator, in the presently preferred embodiment, is essentially the same as that described in U.S. application Ser. No. 499,853, Filed Mar. 27, 1990, entitled "Feedback-Controlled Oscillator", which is hereby incorporated by reference. The parent and grandparent applications have issued as U.S. Pat. Nos. 4,871,982 and 4,912,435, which are both hereby incorporated by reference.

Divider (DIV 7 in FIGS. 1 and 4)

The oscillator output, in the presently preferred embodiment, is divided down to produce a "tick" signal at 256 Hz.

Integrated Counter/SRAM Array

FIGS. 3A through 3F are an overlaid set of maskwork patterns, showing the principal levels of the layout actually used, in the presently preferred embodiment, for the integrated RAM-counter array.

Figure 3A:
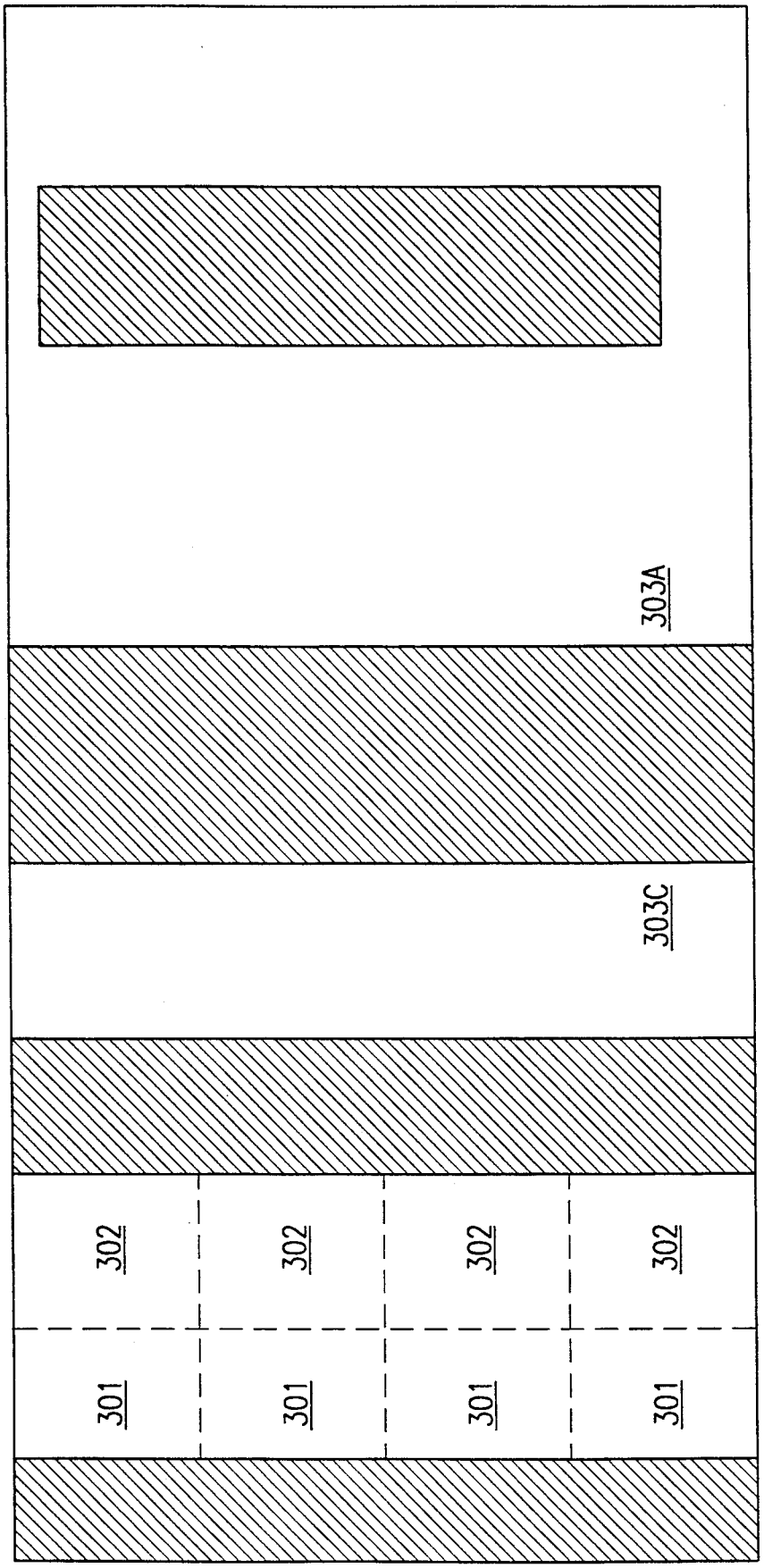
FIGS. 3A through 3F are an overlaid set of maskwork patterns, showing the principal levels of the layout actually used, in the presently preferred embodiment, for the integrated RAM-counter array.

FIG. 3A shows the N-Well pattern. The black parts of this pattern are areas where N-type dopant ions will be implanted to form N-Well regions (where PMOS devices can be fabricated). In the remaining areas, the doping will remain P-, and NMOS devices can be fabricated there.

FIG. 3A shows the well implant maskwork pattern. In particular, memory cells 303A and 303C correspond to memory cells, which comprise part of the Special Function Register 5 (in FIG. 1). Cell 303A contains alarm data and cell 303C contains time-keeping information.

Figure 3B:
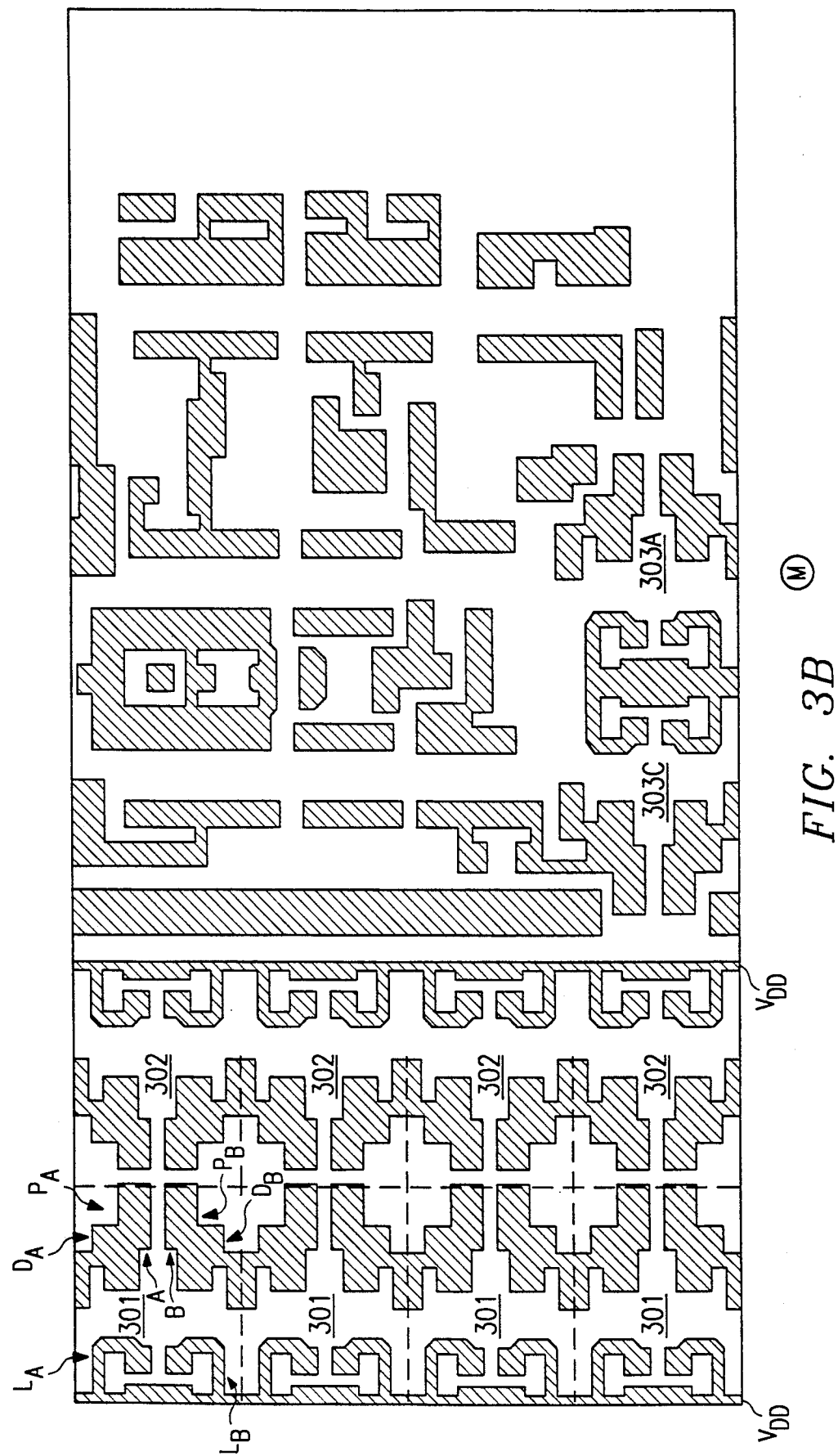

FIG. 3B shows the "active" pattern. In the black areas of this pattern, crystalline semiconductor material will be left exposed, so that a MOS transistor will be created wherever the polysilicon pattern crosses the active pattern. The other areas shown in FIG. 3B will be covered with a thick field oxide.

Figure 3C:
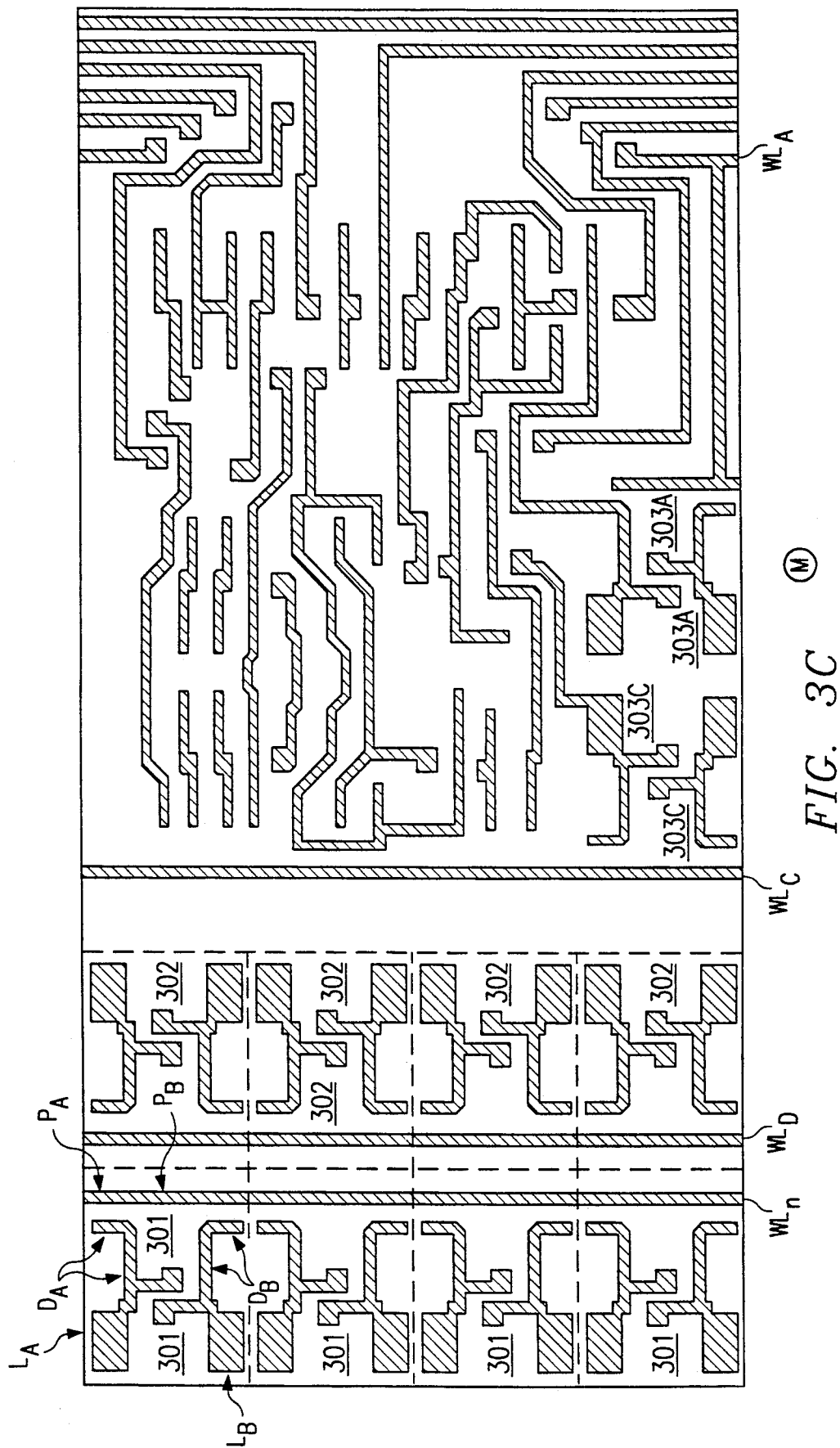

FIG. 3C shows the polysilicon pattern. The polysilicon layer (shown in black) provides transistor gates, and also is used for interconnects.

Figure 3D:
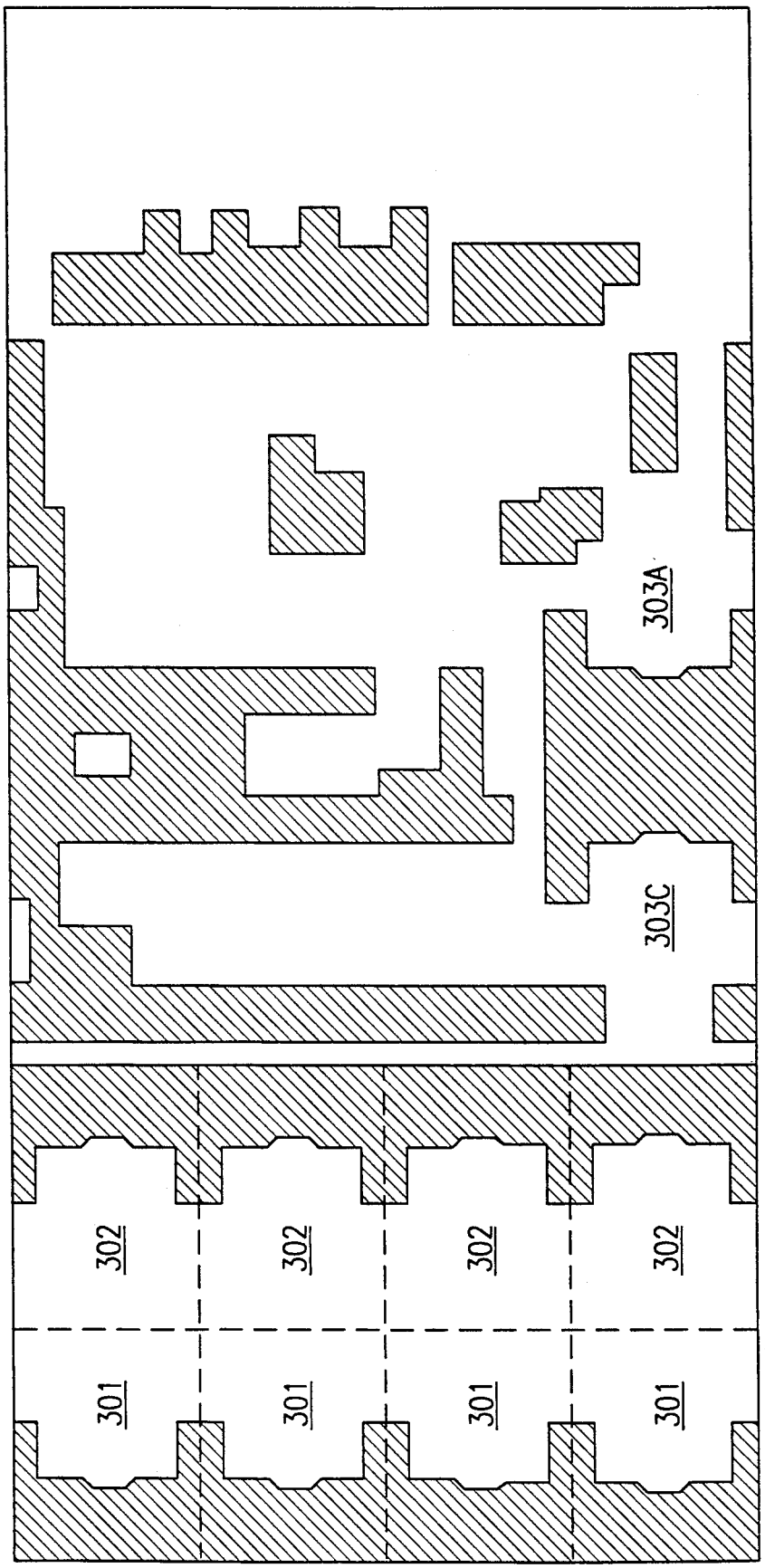

FIG. 3D shows the P+ implant pattern. In the black areas, P-type ions will be implanted. This implant will be blocked by polysilicon (where present) and by thick field oxide, wherever those are present; but in other locations this implant will form the P+ source/drain regions of PMOS transistors. A complementary mask is used to bring the implantation of N+ dopants, to form the N+ source/drain regions of NMOS transistors. Both of these implants are high-dose, low-energy implants, to form shallow, heavily doped source/drain regions.

Figure 3E:
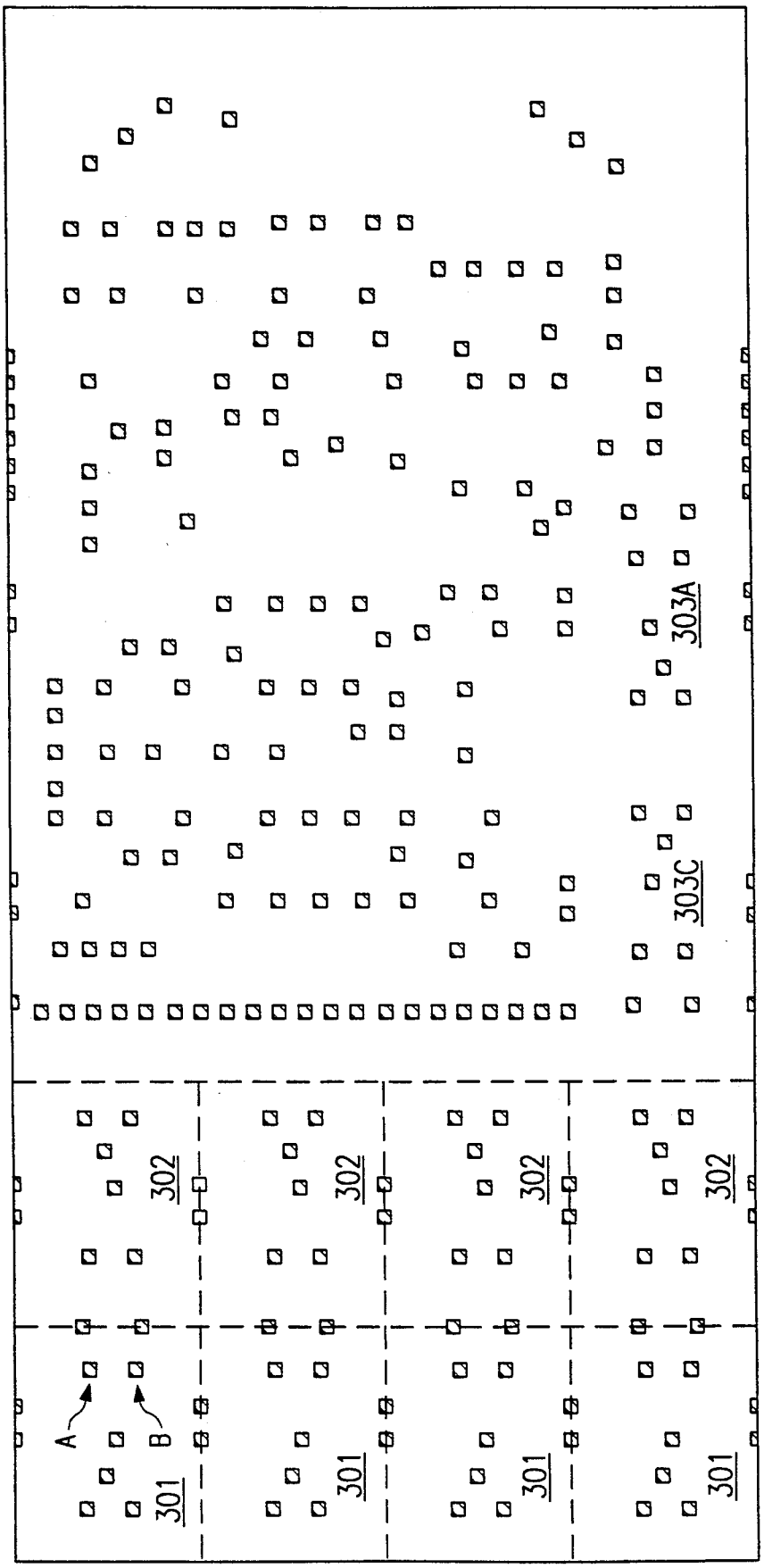

FIG. 3E shows the contact pattern. Each little black square shows a location where a contact hole will be open in the interlevel oxide. Thus, overlying metal layer will make contact to the polysilicon layer, or to the silicon active area, wherever one of these contacts occurs.

Figure 3F:
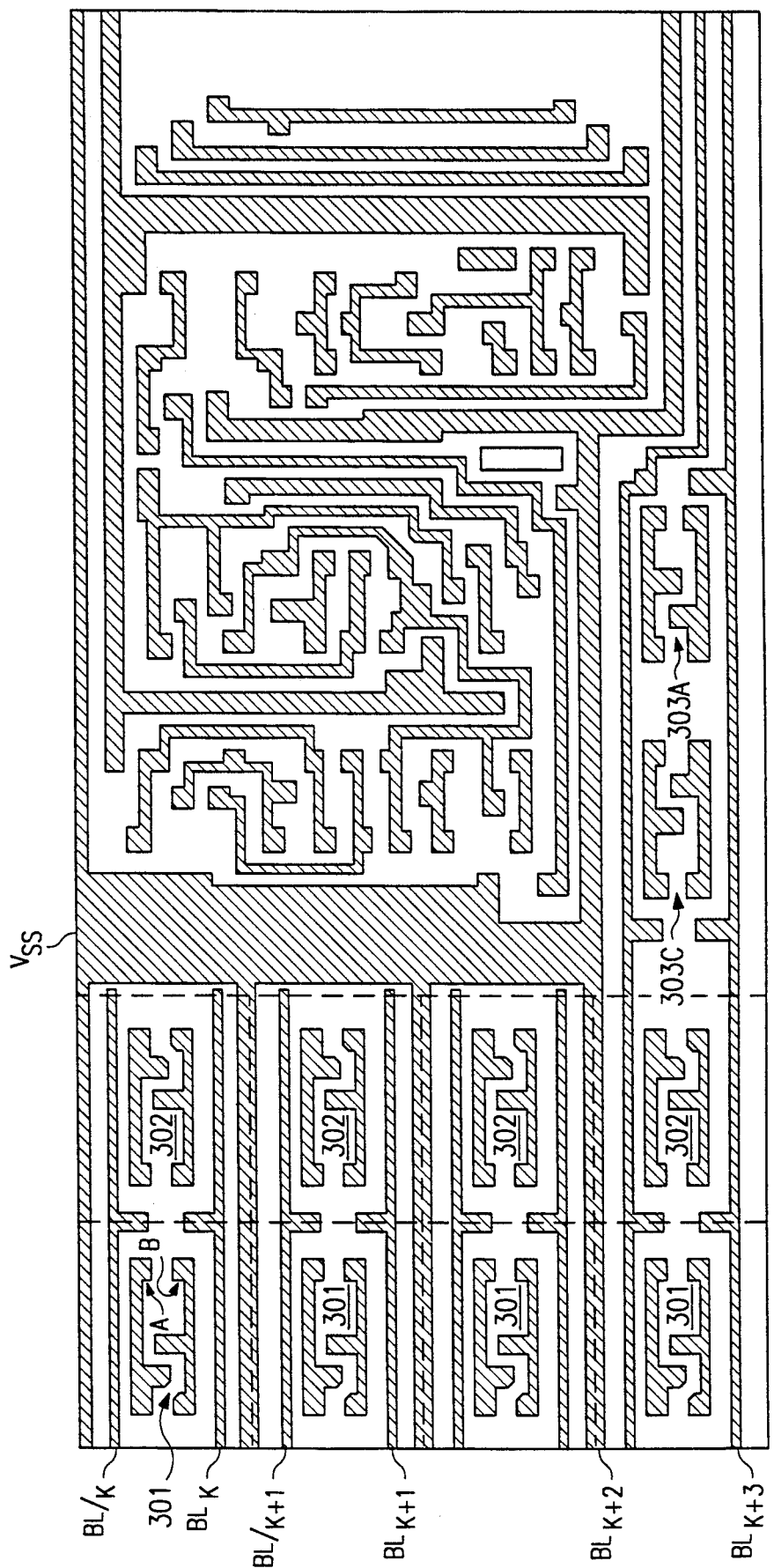

FIG. 3F shows the metal pattern used, in the presently preferred embodiment.

These figures show accurate relative dimensions, and are all drawn to the same scale. Thus, while these drawings, of course, do not show absolute dimensions, the relative dimensions are accurately shown.

In the SRAM array, each cell 301 contains two principal nodes, which are labeled "A" and "B" for one of the cells shown. Each of these principal nodes is accessed by a pass transistor $P_A$ or $P_B$, and is either being pulled down by a driver transistor $D_A$ or $D_B$, or else is being pulled up by a load transistor $L_A$ or $L_B$. The pass transistors $P_A$ and $P_B$ serve to connect the principal nodes A and B to a pair of metal bit lines, $BL_K$ and $BL_k$ . The ground voltage $V_{SS}$ is routed around the memory array using metal lines. However, note that the power supply voltage, $V_{DD}$, is routed in a direction parallel to the rows, using a long N+ diffused region. (In the counter cell, $V_{DD}$ is brought in on a metal line; but this is not necessary for the RAM array.)

Although there appear to be two rows of memory cells shown, the rightmost row (of cells 302) is actually not functional, but is a dummy: note how the active area is interrupted, so that the pass transistors are not able to make contact to the bit lines. The whole purpose of this dummy row is to provide a capacitance, as seen by the dummy word line $WL_D$, which is exactly equal to the capacitance which an operational row of cells provides to its word line $WL_n$. (Thus, by using the voltage on the dummy word line $WL_D$ to drive a logic transition, the peripheral logic can tell when the selected one of the real word line has been charged up to a high enough voltage to open the pass transistors in the selected cells.)

Note how three of the column line pairs ($BL_k$ and $BL_k\backslash$ through $BL_{k+2}$ and $BL_{k+2}\backslash$ shown simply stop at the edge of the array of memory cells. Only the fourth pair of column lines ($BL_{k+3}$ and $BL_{k+3}\backslash$) continues up through the counter arrays.

The layout shown includes only one bit of one counter chain. The column line pair continues upward, through the stage shown, into the corresponding stage of the next counter chain, and then into the corresponding stage of the third counter chain, and so on.

In the presently preferred embodiment, there are three counter chains, each including 41-bit stages, but of course this number can readily be increased or decreased as desired. In fact, one of the advantages of the disclosed innovations is that they provide a fully saleable architecture for multiple counters of any size.

Note that two word lines run along each counter chain: one word line is used to address the stored count value, and one word line is used to address the stored alarm value.

Note that the one-bit counter stage also includes two bits of SRAM memory. One of these two cells is used to store the one-bit of count value for this stage, and one-bit is used to store the alarm value for this stage. The logic integrated in this counter stage includes a digital comparator, which will pull down the MATCH line if a match is not detected. (Thus, all of these digital comparator circuits are effectively wire-ANDed together, and an overall match will be detected if, and only if, a match is detected at every bit position.)

In addition to the MATCH line, two other lines which run to every cell are FF2L and L2FF. When the line FF2L is driven active (high), each flip-flop will transfer its state to the corresponding gated latch. This latch can then be read out over the column line pair, by driving the time data word line.

In the presently preferred embodiment, separate FF2L and L2FF lines are provided for each of the three counter chains. However, alternatively, these lines could be connected to be common to all the counter chains.

In the presently preferred embodiment, the FF2L line is driven high at the start of any user-read operation. The protocol used, in the presently preferred embodiment, requires address arguments with any read command. Communication of these arguments, in the required serial protocol, provides enough time for any ongoing ripple through the counter to be completed, and for transfer of the counter data to the accessible latch cell of each stage, before the selected word line can go high to begin data access. (A signal Ripple_done is used, in the presently preferred embodiment, to indicate that any ongoing rippling should be completed.)

Thus, the consumption of battery charge caused by this operation is avoided, except when strictly necessary.

The L2FF signal is wired in a similarly parallel connection, but serves merely to provide a transfer in the opposite direction (from the accessible latch back to the flip-flop stage.)

Each stage provides a one-bit data output TRTC which clocks the next stage of the counter chain. The very first stage of the counter chain is clocked by a divided down signal that is clocked directly by the divided-down oscillator signal.

In the presently preferred embodiment, the first stage is clocked at a frequency of 256 Hertz, and the total number of stages is 40. Thus, this counter stage will not overflow for approximately 126 years. In the presently preferred embodiment, the RAM/counter array is laid out as two half arrays, with some peripheral logic in the center. (Of course, other subarray organizations can be used instead if desired.) However, in the presently preferred embodiment, the gap between the two half-arrays is used for insertion of a test clock signal into the TRTC and TECT lines. (A problem with long counter chains is that, even if a fast test clock is applied, the time to propagate this signal through the whole counter chain would be unacceptably long).

Counter Circuitry

Note that each counter stage, in the layout of FIG. 3, includes TWO gated latches: one of these holds one bit of the time data, and the other holds one bit of alarm data.

Parallel Transfer from Flip-Flop to Latch

Figures 2, 4:
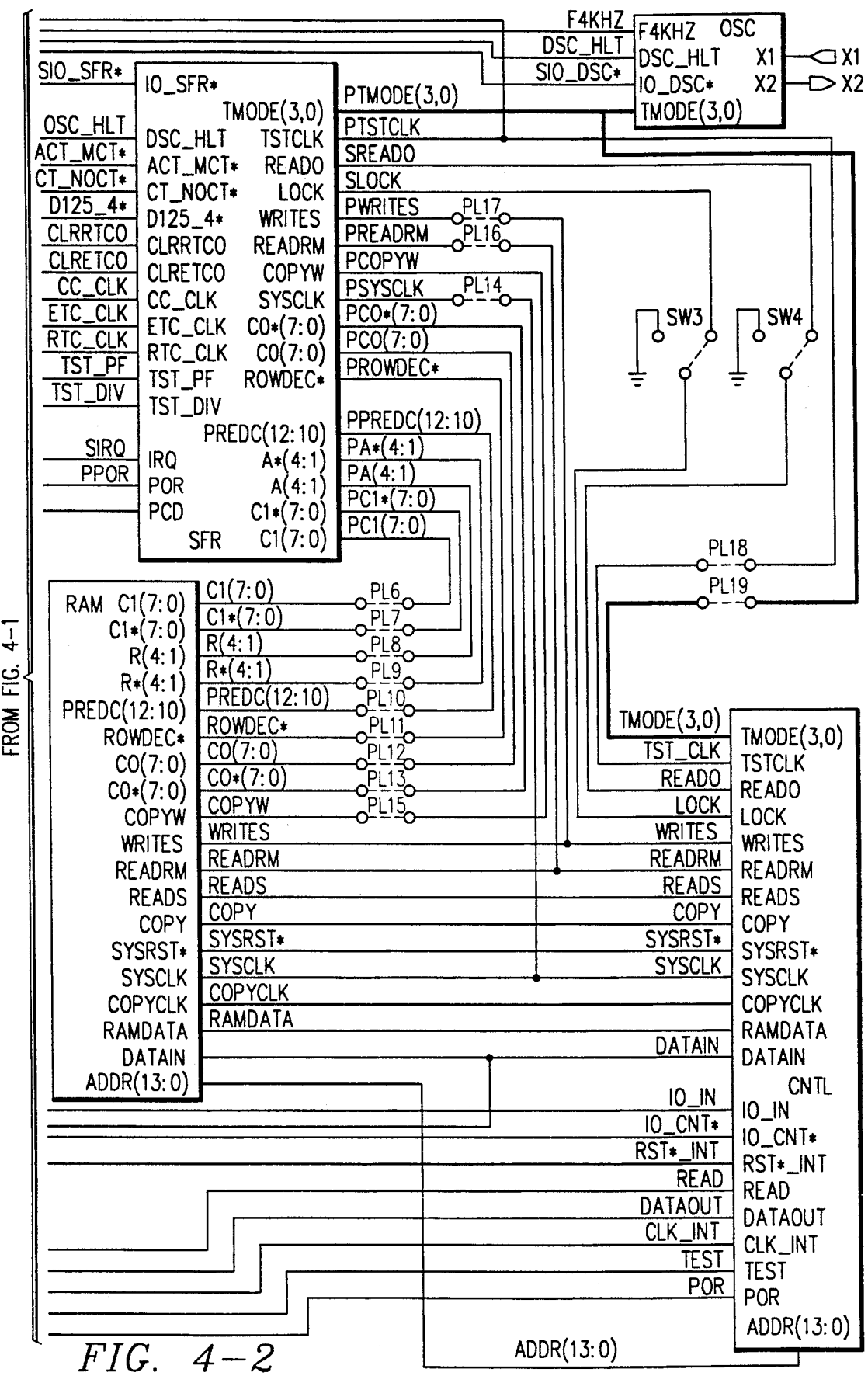
Figures 1, 4A:
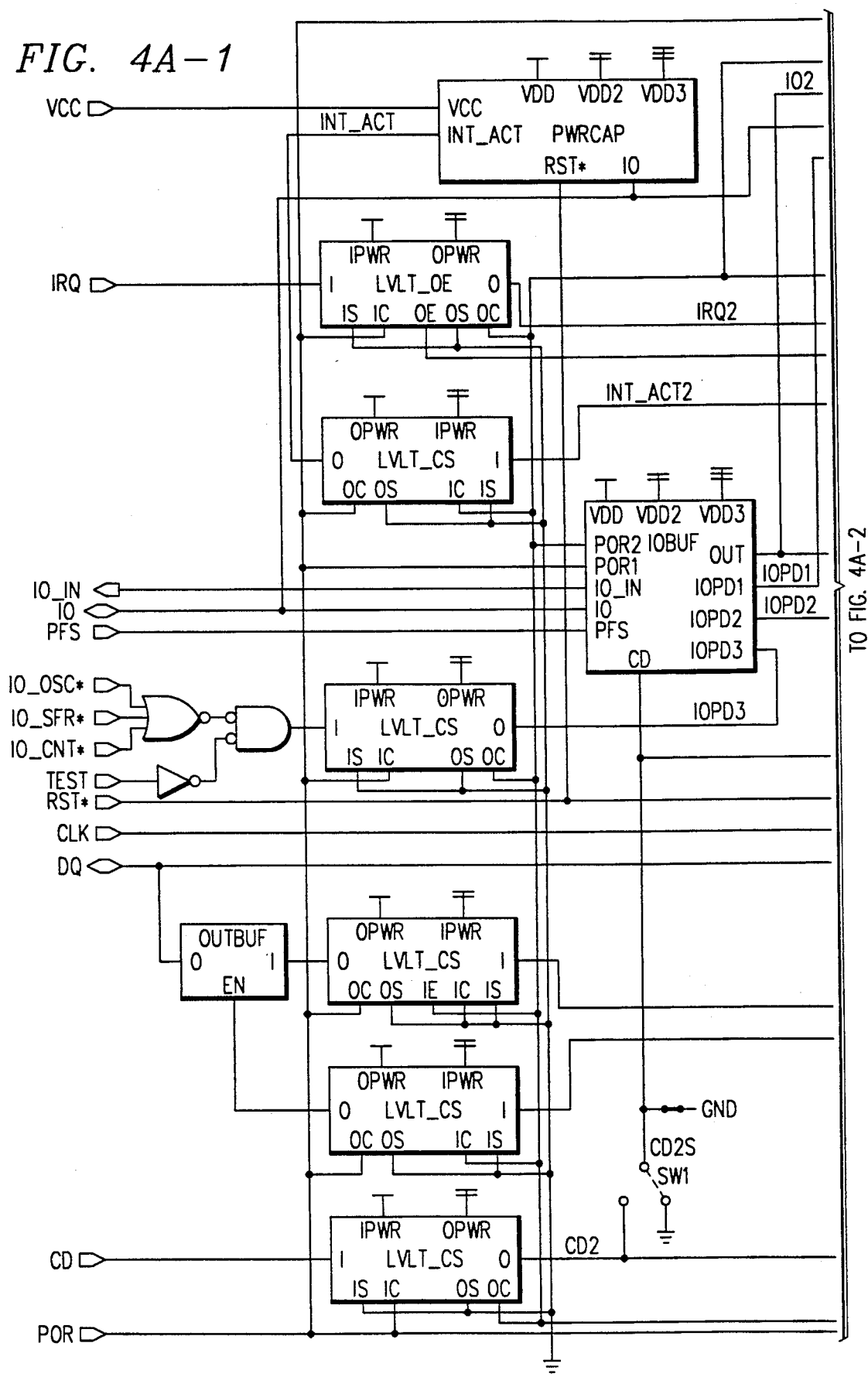
FIG. 4A shows the circuit organization of circuit block IO, which was referred to in FIG. 4.
Figures 2, 4A:
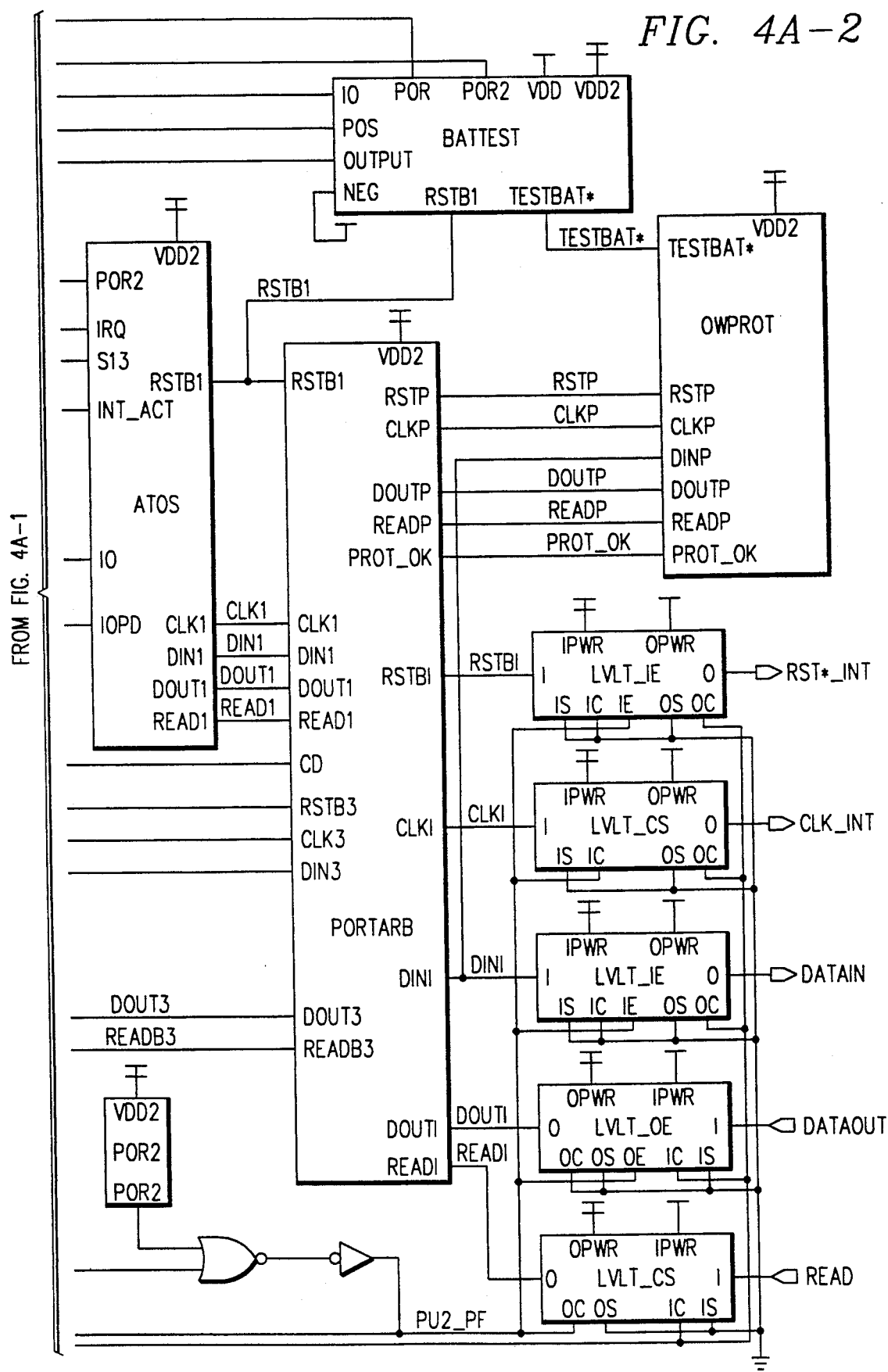
Figures 2, 4B:
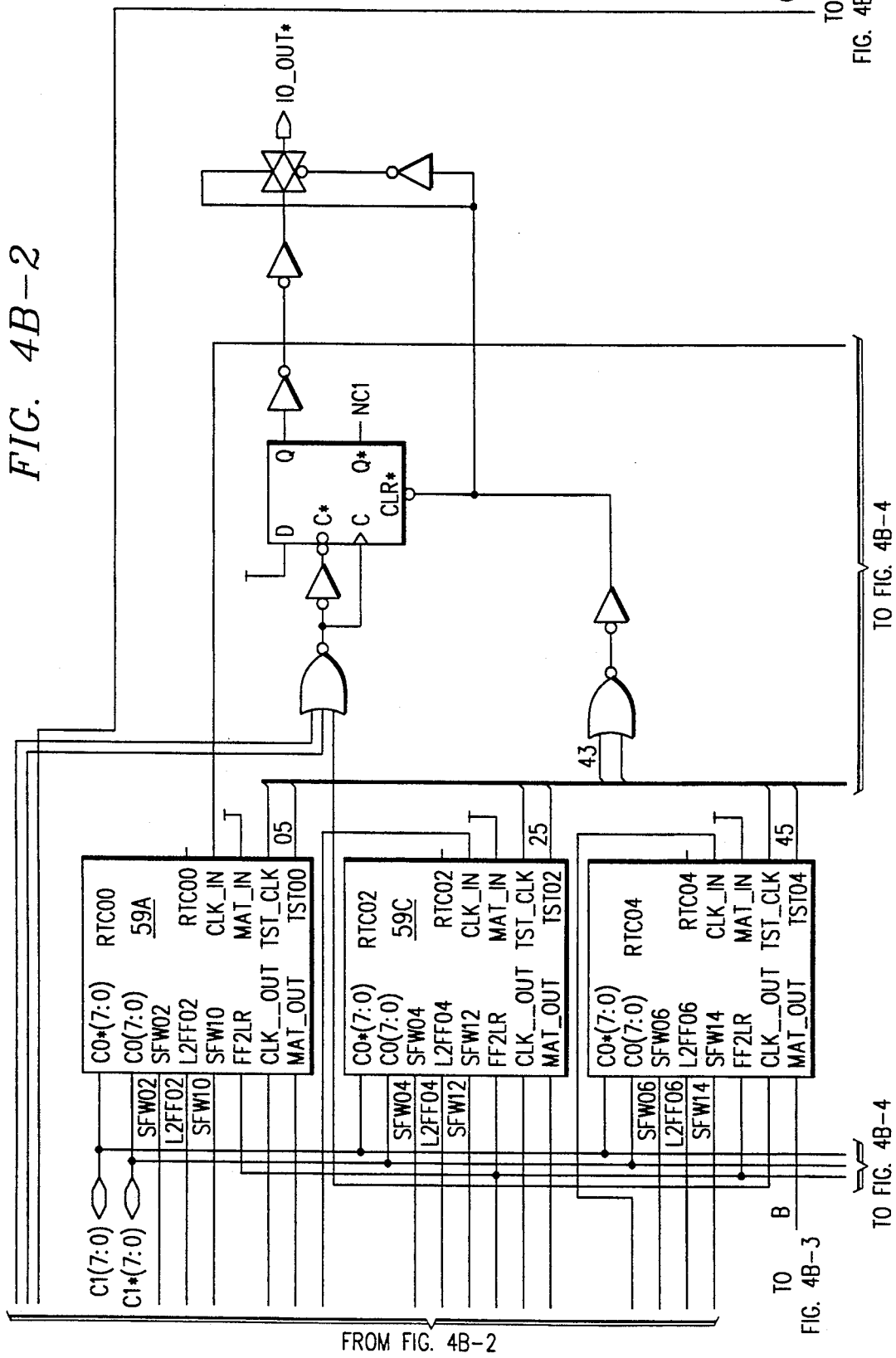
Figures 4, 4B:
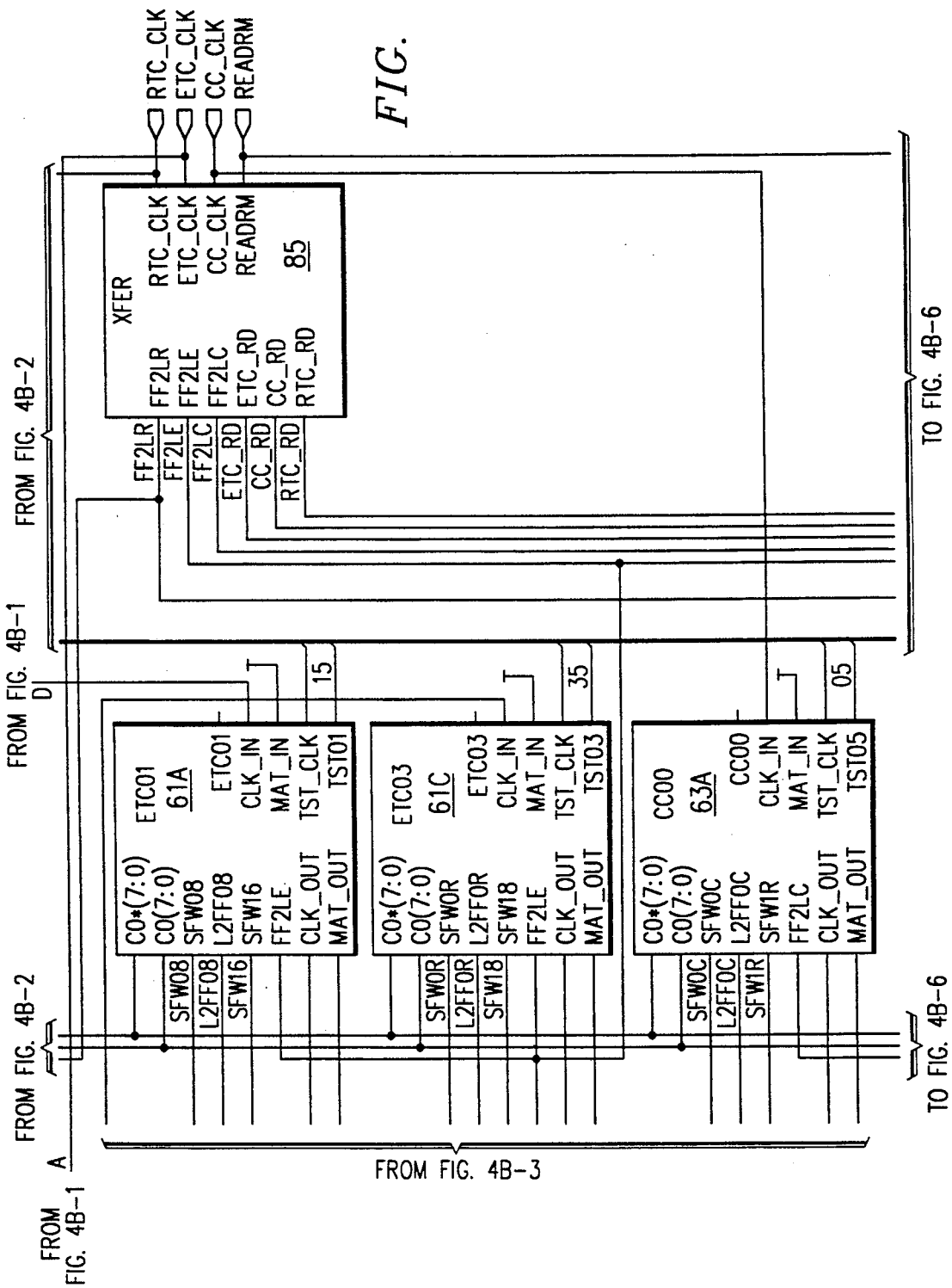
FIG. 4B shows the special function register block SFR, which was referred to in FIG. 4.

FIG. 4B1 shows the circuitry used, in the presently preferred embodiment, to generate a parallel transfer signal (FF2L) at the start of every read operation.

Use of Scratchpad to Safeguard Memory Access

FIGS. 2A and 2B are a single flow chart, on two sheets, showing the sequence of operations used, in the presently preferred embodiment, to interface to the one-wire bus, and to respond to memory read, scratchpad read, scratchpad write, and scratchpad copy commands.

Self-Disablement

Three modes of self-disablement are provided in the chip in the presently preferred embodiment.

Use of Separate Power-Supply Domains

The chip of the presently preferred embodiment is laid out in three separate power supply domains. Thus, one side may be operational when the other side is totally powered down. Thus, signal lines crossing the power boundary may be in a floating condition. To prevent the potential of a floating line from pulling an input buffer into its high-current region, weak loads are connected to the signal lines. To prevent the weak loads from dissipating excessive amounts of current, the signal lines running across the power boundary are fed through one-shot circuits before they cross the power boundary. Thus, the weak load provides no DC current draw. This relationship may be applied only to signals originating on one side of the power boundary, or alternatively, to signals originating on either side of the power boundary.

FIGS. 4A7–4A9 show three slightly different versions of the circuitry used to transmit signals across a power-supply-domain boundary, in the used in the presently preferred embodiment.

Innovative Smart Socket for Microprocessors

Figures 4, 4B, 5:
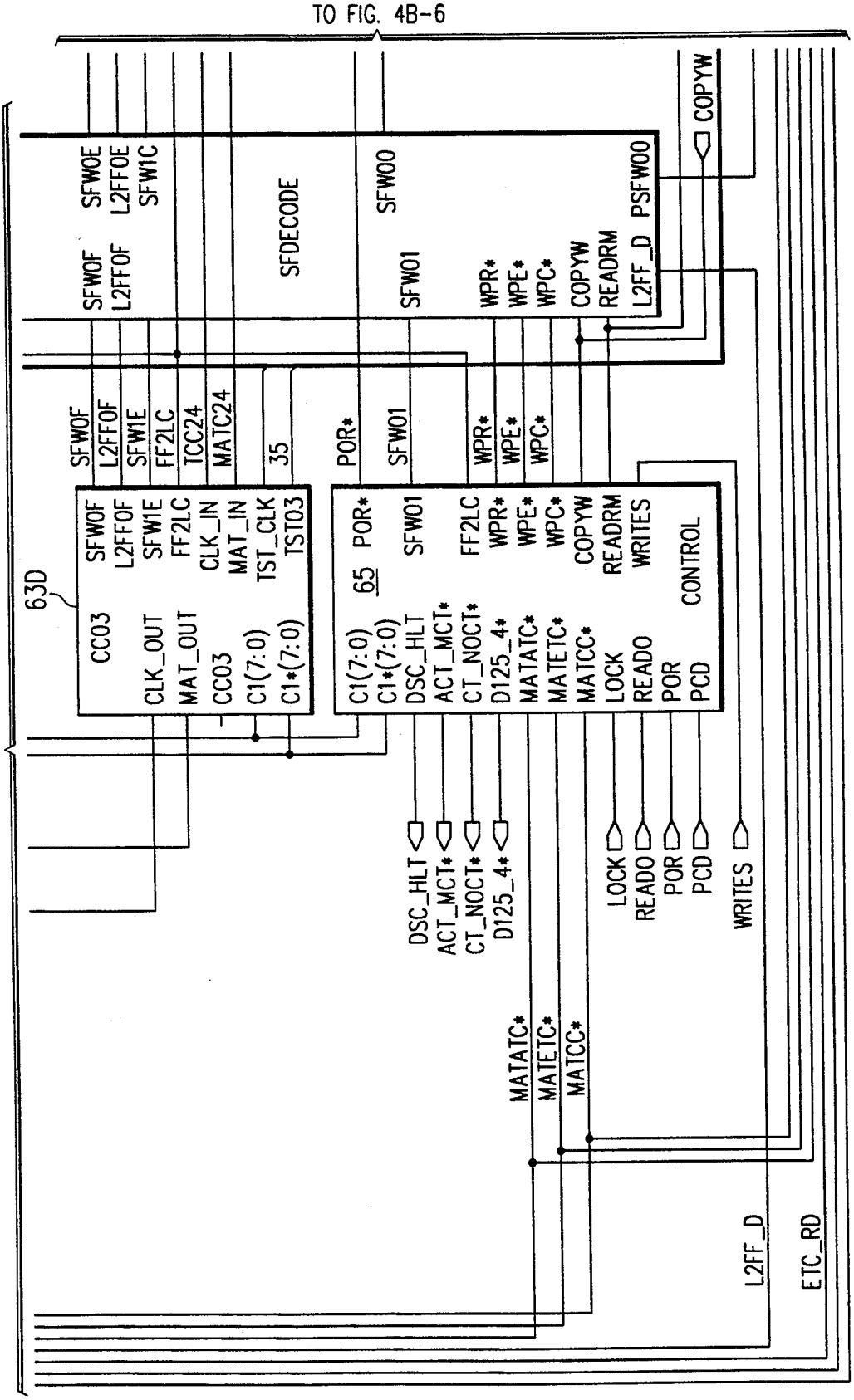
Figure 5:
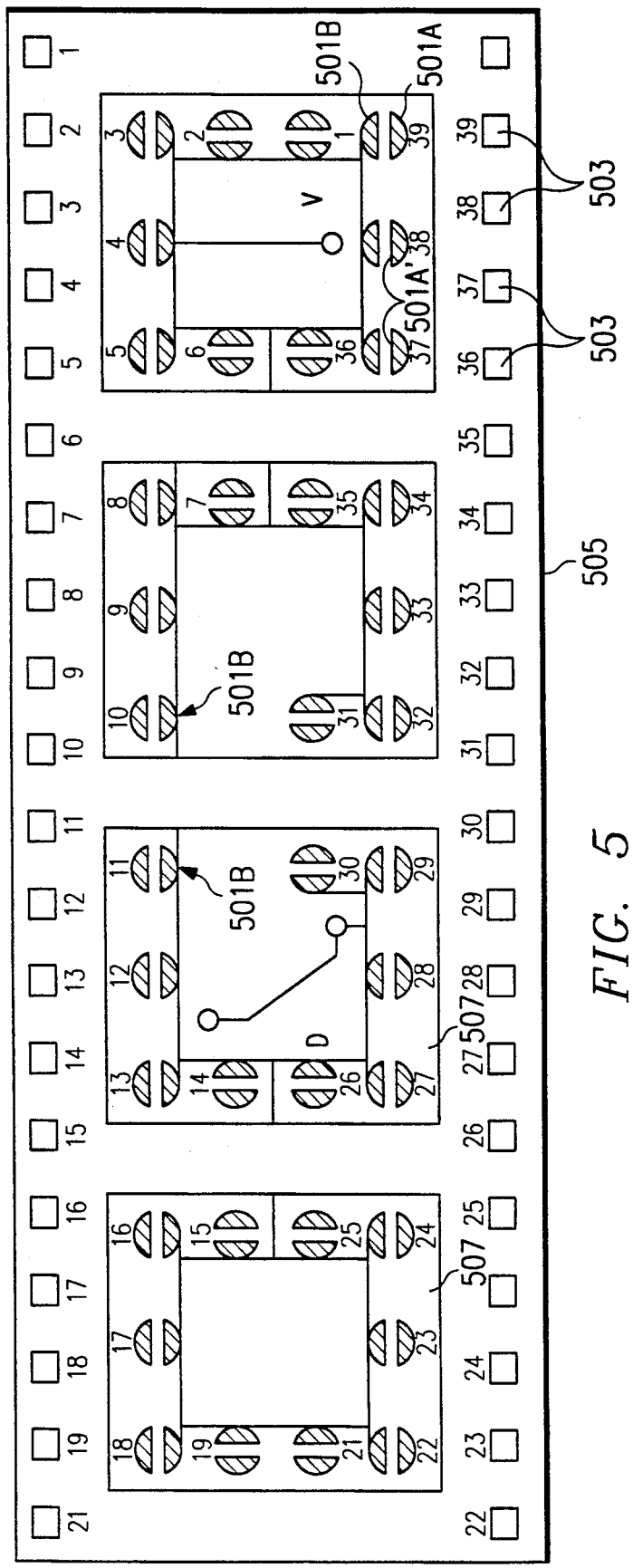

FIG. 5 shows a plan view of an innovative socket which can be used in combination with the chip of the presently preferred embodiment.

The pattern of pin holes 503 in this particular socket is arranged to match a 40-pin DIP footprint, which is particularly convenient for use with an 8-bit microprocessor or microcontroller. However, of course, other standard pinout definitions can be used instead.

In the plan view shown, a small circuit board 507 is visible through openings in the module's top surface 505. Wiring traces on the circuit board 507 are routed so that a glob of solder can easily bridge any one of the solder-option-terminal pairs 501A/501B.

In the embodiment shown, a solder-option-terminal pair 501A/501B has been provided for each of the pin holes 503, except pins 20 and 40. The pin numbers are indicated for pins 1–6, to show the corresponding assignments of solder-option-terminal pairs 501A/501B with pin holes 503.

In this embodiment, the base of the socket module holds a lithium-cell battery and an integrated circuit which has a one-wire interface. (For example, in the preferred embodiment the integrated circuit is as shown in FIG. 4.) All of the terminals 501B are connected to the one-wire-bus terminal of this integrated circuit.

Innovative Power-On-Reset Circuit

FIG. 4A6 shows the innovative power-on-reset circuit of the chip which is used in the presently preferred embodiment, and FIGS. 6A-6D show a detailed simulation of the timing of voltages appearing at various nodes in the power-on-reset circuit of FIG. 4A6.

Node PINT is pulled up by an integration capacitor to VDD2, and pulled down by a weak NMOS pulldown to ground. The capacitor, in the presently preferred embodiment, is a MOS capacitor of 40 microns square. The pull-down at node PINT, in the presently preferred embodiment, has a nominal width of 5 microns and a nominal length of 200 microns.

Node PINT, followed by an inverter chain, provides an initial pulse-generating circuit. This circuit element produces a pulse, as desired, when power is first applied. However, this circuit element will also produce a pulse on nodes PINT and PINT1 if a transient voltage increase is seen on the power supply line. The pulldown transistor on node PINT will provide an approximate reference voltage, since it will not turn on until node PINT exceeds its threshold voltage. The behavior of the voltage at node PINT is very similar to that of prior art power-on-reset circuits.

Figure 6A:
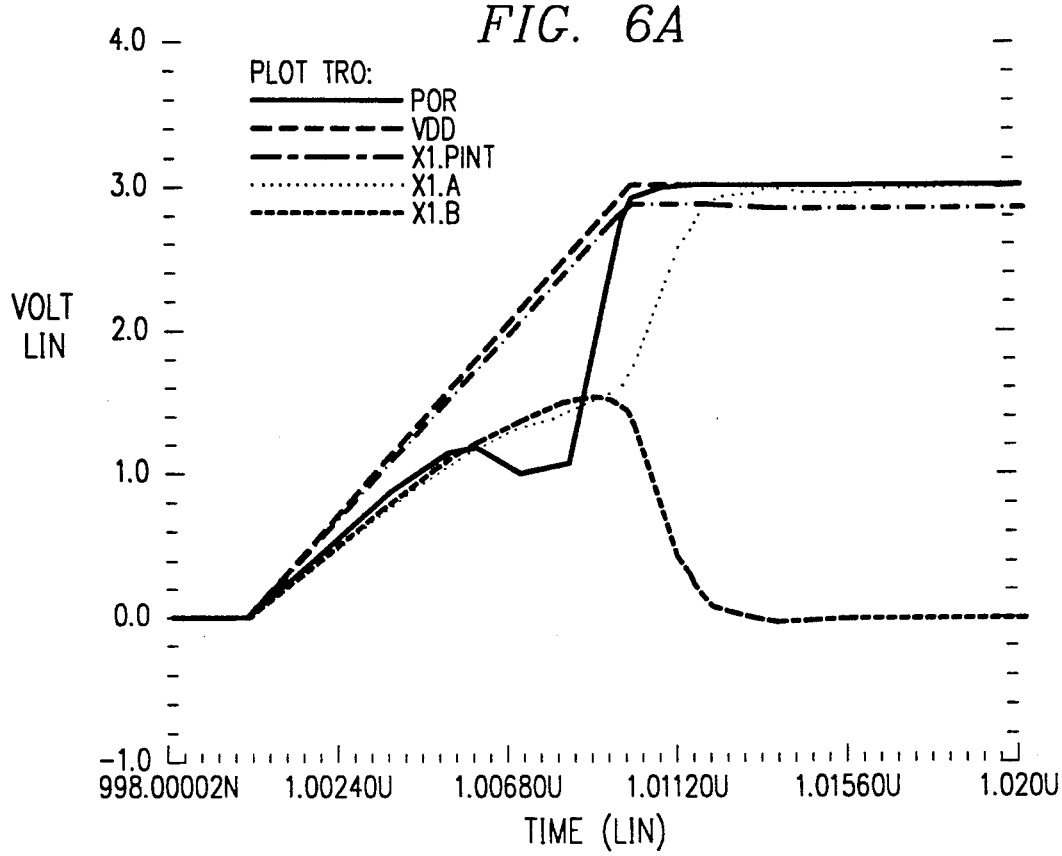
FIGS. 6A-6D show the timing of voltages appearing at various nodes in the power-on-reset circuit of FIG. 4A6.

FIG. 6A shows the behavior of nodes PINT, VDD2, A, B, and POR2 as the power supply VDD comes up. In this graph (and in FIG. 6B), the right edge of the graph corresponds to a time about 20 nanoseconds after VDD2 begins its rise from zero Volts.

Nodes A and B are driven by a totally symmetric cross-coupled pair of gates. (In the presently preferred embodiment, these are NAND gates with $W_P/W_N$[1] sizes of 17.7/10.) Since this circuit is symmetric, the relation of nodes A and B, as power is supplied, will be unknown. Note that the particular divergence of nodes A and B is random and unpredictable. That is, if power is repeatedly reapplied to a given circuit, sometimes node A will go high, and sometimes node B will. Moreover, the delay before these nodes begin to diverge may also be somewhat variable. However, due to the crosscoupling of this circuit, it will settle into one of two possible states.

[1] Transistor sizes are normally stated as a number W/L, where both numbers refer to dimensions in microns. The first number is the width of the transistor, and a larger value for this number implies a higher drive current capability. The second number is the length of the transistor, and a larger value for this number implies a lower drive current capability.
In CMOS logic design, "$W_P$" refers to the nominal width of the PMOS device in a CMOS gate, and $W_N$ refers to the NMOS width. Similarly, $L_P$ and $L_N$ refer to the respective nominal lengths, and $V_{TP}$ and $V_{TN}$ refer to the respective threshold voltages.
Logic gate parameters are often also stated as a ratio $W_P/W_N$, in which case it is assumed that $L_P$ and $L_N$ are equal to the minimum geometry. The device parameters of a logic gate may also be stated more fully, as $W_P/L_P$, $W_N/L_N$.
The presently preferred embodiment has been realized with a minimum nominal (drawn) dimension of 1.2 microns. Of course, as is well known to processing engineers, the actual dimensions may vary from the nominal dimensions, and the nominal dimensions can readily be varied according to known scaling laws.

Nodes A and B are each separately connected to drive a respective highly asymmetrical inverter. In the preferred embodiment, the PMOS transistor of each inverter is relatively strong (with a nominal W/L, in the presently preferred embodiment, of 25/1.2), and the NMOS transistor of each inverter is relatively weak (nominal W/L, in the presently preferred embodiment, of 5/10). (By contrast, with the device and process parameters used in the presently preferred embodiment, a normal symmetrical inverter, with a trip point about halfway between VDD and ground, would have a PMOS width only about twice the NMOS width, with both at the minimum length of 1.2 microns.)

These two asymmetrical inverters produce outputs A* and B*. These two nodes A* and B* are each separately fed into a respective blocking gate, together with node PINT1. Again, the relative states of nodes A* and B* are initially unknown; but even after the metastable state resolves, at least one of these nodes will have a state which permits the blocking gate to propagation of the pulse from node PINT1. Until nodes A and B diverge, to produce a definite logic state which is propagated through, these asymmetric inverters provide an output which is dominated by their strong side (the pull-up side, in the presently preferred embodiment). Thus, in the presently preferred embodiment, nodes A* and B* will initially follow the power supply voltage up, until one of the nodes A or B goes low enough to switch the following inverter.

Figure 6B:
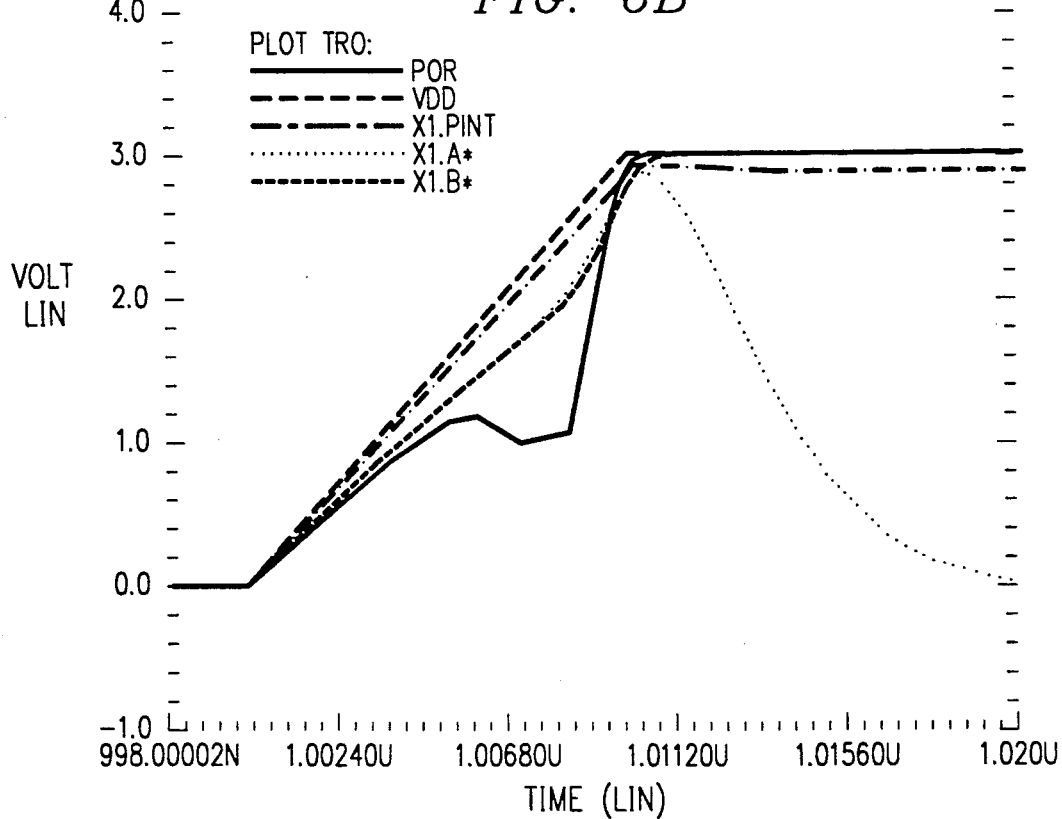

FIG. 6B shows the behavior of nodes PINT, VDD2, A*, B*, and POR2 as the power supply VDD comes up. Note that nodes A* and B* diverge somewhat later than nodes A and B.

The outputs C and D of the blocking gates are propagated into a combining gate which, in the presently preferred embodiment, is a NOR gate. Thus, if a reset pulse has propagated through either of the blocking gates, to either node C* or to node D*, it will propagate on through the combining gate to nodes POR1 and POR2.

Figure 6C:
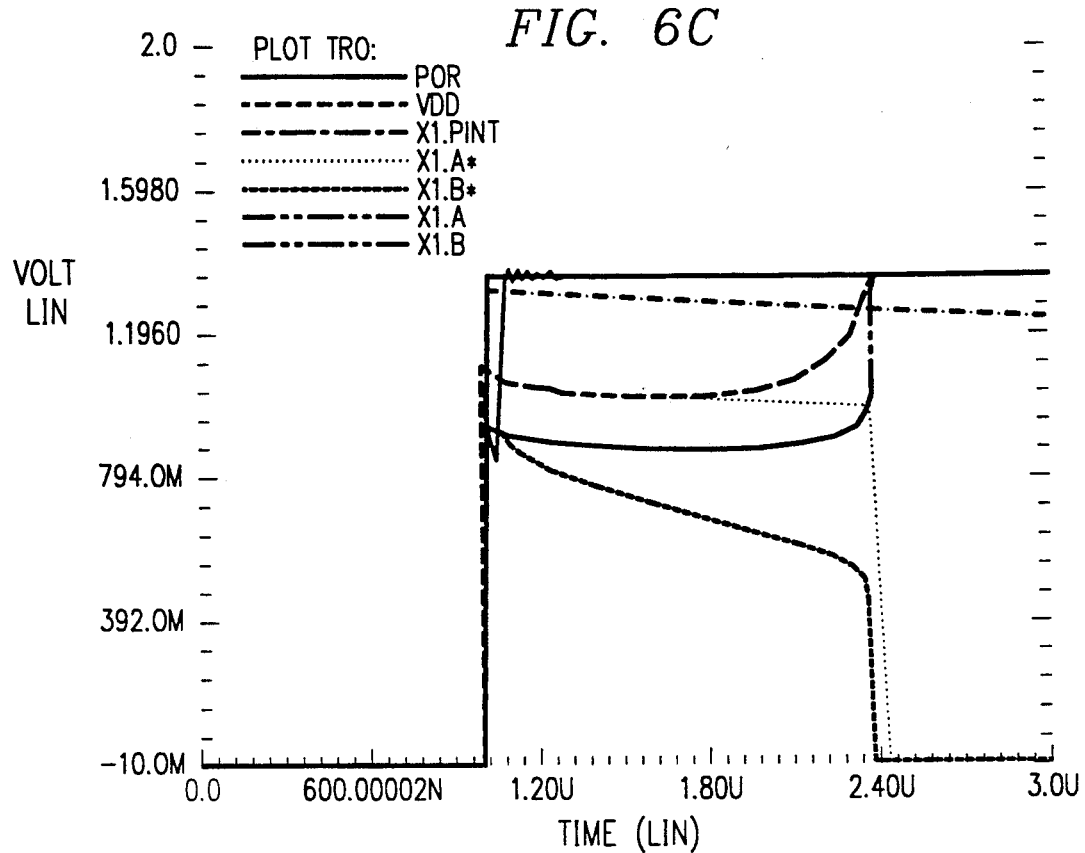

FIG. 6C shows the behavior of nodes PINT, VDD2, A*, B*, and POR2 over a longer period of time. In this graph, the right edge of the graph corresponds to a time about 2000 nanoseconds after VDD2 begins its rise from zero Volts.

Figure 6D:
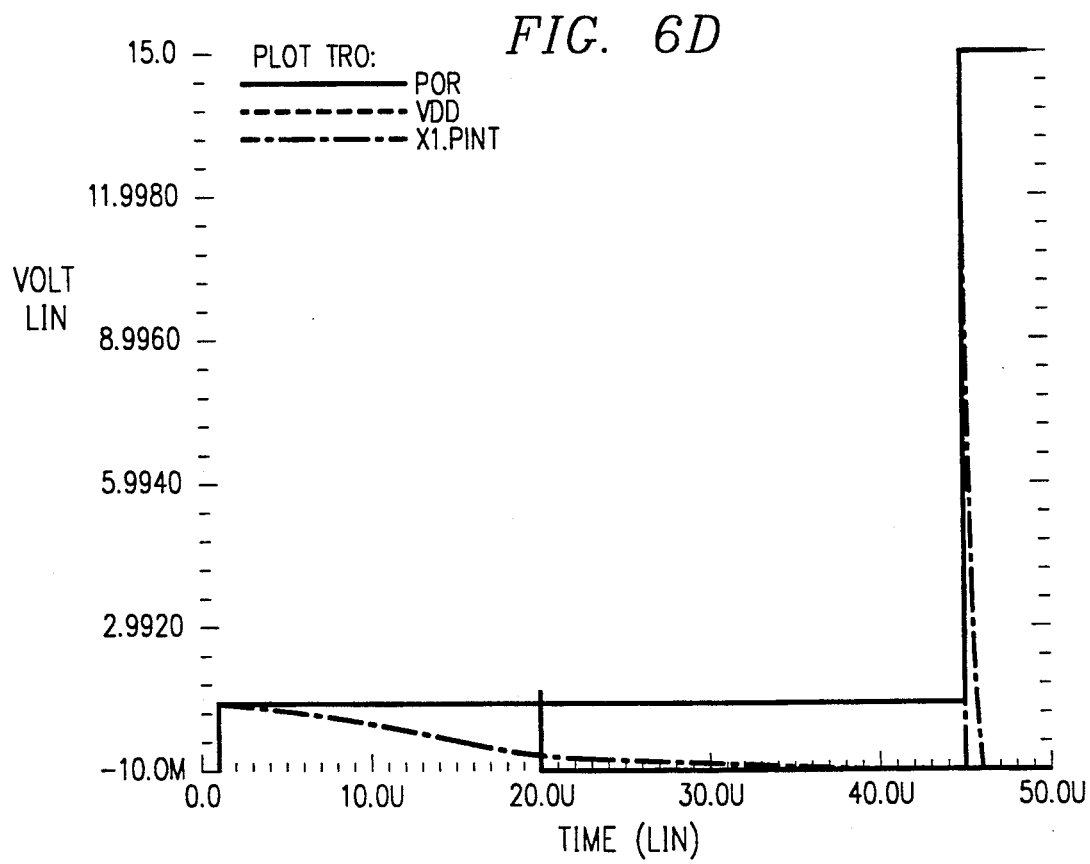

FIG. 6D shows the behavior of nodes VDD2, PINT, and POR2 over a much longer period of time. In this graph (and in FIG. 6B), the right edge of the graph corresponds to a time about 2000 nanoseconds after VDD2 begins its rise from zero Volts. In this graph, the right edge of the graph corresponds to a time about 50,000 nanoseconds (50 μsec) after VDD2 begins its rise from zero Volts.

Node PINT is followed by a strongly asymmetric inverter. This inverter, in the presently preferred embodiment, has dimensions of 5/10, 25/1.2, which gives it a threshold voltage of about 250 mV. Thus, after VDD has come up, this inverter will switch only if PINT declines to a very low level. When this inverter switches, node PINT1 will be driven low, and nodes C and D will be driven high (regardless of the state of nodes A* and B*). Both inputs C* and D* to the combining gate will therefore be low, and nodes POR1 (and POR2) will be driven high.

When node POR1 goes low, nodes A and B will both be driven high, and nodes A* and b* will be driven low. In this state, the combining gates' outputs C and D are forced high, regardless of the state of node PINT1. Thus, the circuit will now remain in a stable state for as long as the power supply is above the minimum, regardless of any further glitches which may occur.

This operation may be seen in FIG. 6D. The time scale of this Figure is long enough to show the slowly declining voltage of node PINT. When this gets down to about a quarter of a volt, the POR signal goes low and node POR1 goes low. In the example of FIG. 6D, it was assumed that a major power supply glitch occurred thereafter (at time 45 μsec), and this glitch pulled up the voltage of node PINT; but the simulation indicated that even this strong surge did not cause a POR signal to be generated.

It should be noted that the device sizings and ratios given are merely illustrative, and help to show the workings of the preferred embodiment in the fullest possible detail. All of the specific numbers given can be varied, in ways which will be readily apparent to those skilled in the art of integrated circuit design.

Moreover, signal polarities can be changed, logic gate types can be changed, and additional stages added or dropped in the signal propagation paths shown.

Further Details of Circuit Organization

FIG. 4 shows the high-level circuit organization of the chip used in the presently preferred embodiment. Note that this diagram includes circuit blocks DIV, PF, IO, POR, RAM, SFR, CNTL, and OSC. DIV refers to the divider circuitry, which primarily divides the frequency produced from oscillator (OSC 17), which is approximately 32 KHz, to approximately 256 Hz. PF refers to the power failure circuitry, which $V_{cc}$ drops below feedback (battery voltage) to stop communication on the serial interface and triggers a back-up mode. IO 9 refers to the input/output circuitry, which refers to the type of interface (i.e., one-wire, three-wire interface), and also contains all the ROM protocol functions. POR 1 refers to power on reset circuitry, which helps initialize particular circuitry to the desired state. RAM 11 refers to the random access memory circuitry, which comprises the memory cells. SFR 5 refers to the special function register circuitry, which is comprised of the alarm registers, clock functions, time of day counters, interval counters, cycle counters, control registers, and status registers. OSC 17 refers to the crystal oscillator. CNTL 15 refers to the circuitry required to perform the memory function commands.

FIG. 4A shows the circuit organization of circuit block IO, which was referred to in FIG. 4. Note that this Figure itself contains blocks PWRCAP, BATTEST, RTOS, PORTARB, OWPROT, POR2, IOBUF, and OUTBUF. PWRCAP 31 refers to the power cap circuitry, which is shown in FIG. 4A1 and is discussed below. BATTEST 33 refers to the battery test circuitry, which is shown in FIG. 4A3 and is discussed below. RTOS 35 refers to the state circuitry for the one-wire interface, which is shown in FIG. 4A2 and is discussed in detail below. PORTARB 37 refers to the port arbitration logic circuitry to handle the one to three wire interface, which is discussed in more detail below. OWPROT 39 refers to the one wire protocol circuitry, which is shown in FIG. 4A4 and discussed in more detail below. POR2 41 refers to the second power on reset circuitry, which is shown in FIG. 4A6 and is discussed in more detail below. IOBUF 43 refers to the input/output buffer circuitry, which is shown in FIG. 4A5 and discussed in detail below. OUTBUF 45 refers to the out buffer circuitry, which is discussed below.

FIG. 4A1 shows the circuit organization of circuit block PWRCAP, which was referred to in FIG. 4A. Note that this Figure itself contains six diodes, from each of the three incoming lines RST/, IO, and VCC, to each of the two power-storage capacitors shown. Storage capacitor CAP-VDD2 feeds the power supply line VDD2. Storage capacitor CAP-VDD3 feeds the power supply line VDD3. Connections to the primary on-chip power supply VDD are shown, as is conventional, by an upward lead to a short horizontal line. Connections to capacitor-fed supply VDD2 are shown by an upward lead to two horizontal lines, and connections to capacitor-fed supply VDD3 are shown by an upward lead to three horizontal lines.

FIG. 4A2 shows the circuit organization of circuit sub-block RTOS, which was referred to in FIG. 4A. Note that this Figure itself contains a block labelled TPOSC which refers to time period oscillator circuitry, which is the actual oscillator. The other circuitry in block RTOS performs oscillator overhead and control functions.

FIG. 4A2a shows the circuit organization of circuit block TPOSC, which was referred to in FIG. 4A2. This is a cross-coupled oscillator, which provides additional stability in characteristics. (Such oscillator characteristics are more fully reviewed in U.S. Pat. No. 4,868,525, which is hereby incorporated by reference.) This oscillator provides the timing for operations over the one-wire bus. The primary clock oscillator is shown as block OSC in FIG. 4.

FIG. 4A3 shows the circuit organization of circuit block BATTEST, which referred to in FIG. 4A. This circuit detects battery failure. Note that the circuitry shown crosses a power domain boundary: the portion on the left is powered by. VDD, and the portion on the right is powered by VDD2. Thus a level-translator circuit block LVLT_CS is used twice. This block is described below in detail.

Circuit block PORTARB, which was referred to in FIG. 4A, simply contains the circuitry for arbitration between the one-wire and three-wire ports. This arbitration circuitry normally gives the three-wire port priority over the one-wire port, but this priority can be reversed by a simple Fuse programming.

FIG. 4A4 shows the circuit organization of circuit block OWPROT, which was referred to in FIG. 4A. Note that this Figure itself contains sub-block OWCMD, which refers to one wire command decode, (which performs decoding in accordance with the one-wire protocol detailed below, and ROM memory ROM64, which contains laser-programmable fuses encoding the unique ID of each particular chip. FIG. 4A10 details the particular circuitry involved in sub-block OWCMD in FIG. 4A4.

FIG. 4A5-shows the circuit organization of circuit block IOBUF, which was referred to in FIG. 4A. Note that this circuit falls across three power supply domains, and level translators of two types (detailed below) are used. An incoming signal on line IO is received by gates in power domain VDD3, and the corresponding output on line OUT is powered by supply VDD2.

FIG. 4A6 shows the circuit organization of circuit block POR2, which was referred to in FIG. 4A. This Figure shows details of the preferred implementation of the innovative power-on-reset circuit which is used in the chip of the presently preferred embodiment. Various nodes of this circuit diagram are labelled to correspond to the voltage traces analyzed in detail below.

Circuit block OUTBUF, which was referred to in FIG. 4A, is a simple gated latch.

FIG. 4A7 shows the circuit organization of level-translator circuit block LVLT_CS, which is referred to in FIG. 4A and elsewhere. This circuit is used to carry a signal across a power-domain boundary with a clear/set capability.

FIG. 4A8 shows the circuit organization of level-translator circuit block LVLT_IE, which is referred to in FIG. 4A and elsewhere. This circuit is used to carry a signal across a power-domain boundary, where the equilibrate signal is at the same level as the supply level on the input side of the translator.

FIG. 4A9 shows the circuit organization of level-translator circuit block LVLT_OE, which is referred to in FIG. 4A and elsewhere. This circuit is used to carry a signal across a power-domain boundary, where the equilibrate signal is at the same level as the supply level on the output side of the translator.

The circuit block RAM, which was referred to in FIG. 4, is entirely conventional. This block contains a low-power SRAM array, with associated conventional decoding, timing, and buffer logic. As shown above in FIG. 3, the counter array and RAM array are in fact physically integrated; but, in the circuit organization of FIG. 4, the counter circuitry is included in the block "SFR" and not in the block "RAM." (Note that the top-level circuit diagram of FIG. 4 shows some column lines running between block SFR and block RAM.)

FIG. 4B shows the special function register block SFR, which was referred to in FIG. 4. This block contains the three counter chains, with associated logic for accessing them. Note that this Figure contains sub-blocks SFDECODE, TSTDCO, XFER, MATCH, RTC00-04, ETC00-04, CC00-03, and CONTROL, STATUS. SPDECODE 51 refers to special function decode circuitry, which is discussed in more detail below. TSTDCO 53 refers to test decode circuitry, which is discussed in more detail below. XFER 55 refers to transfer circuitry, which is shown in FIG. 4B1 and discussed below. MATCH 57 refers to alarm detection circuitry that exists when all the associated bits line up, which is shown in FIG. 4B2 and discussed in more detail below. RTC00 59A, RTC01 59B, RTC02 59C, and RTC03 59D refers to the integral time counter circuitry. ETC01 61A, ETC02 61B, ETC03 61C, and ETC04 61D refers to the elapsed time counter circuitry. CC00, 63A, CC01 63B, CC02 63C, and CC03 63D refers to the cycle count circuitry. CONTROL 65 is the control circuitry that controls how the counters work, which is shown in FIG. 4B3 and discussed in more detail below. STATUS 67 is the status circuitry that signals whether an alarm has occurred or not. FIG. 4B4 shows the actual detailed implementation of one bit of these counter chains.

FIG. 4B1 shows the circuit organization of block XFER which is referred to in FIG. 4B. This circuitry receives a read-enable signal READRM, and the three clock signals RTC_CLK (for the real-time clock), ETC_CLK (for the elapsed-time clock), and CC_CLK (for the cycle counter). When an attempted user read occurs, the circuitry shown drives the appropriate FF2L line (FF2LR, FF2LE, or FF2LC) high, as long as the corresponding ripple-done line (RTC_RD, ETC_RD, or CC_RD) has already gone high. (The FF2L is used to transfer the most current data into the user-accessible latches, as described elsewhere herein.)

FIG. 4B2 shows the circuit organization of block MATCH, which was referred to in FIG. 4B. This block detects the occurrence of an alarm condition in any of the counters.

Circuit block SFDECODE, which was referred to in FIG. 4B, merely contains straightforward decode logic.

Circuit block TSTDC0, which was referred to in FIG. 4B, is connected to decode a 4-bit test mode command TMODE, and accordingly to drive of the lines TST_SFR0-4, TST_PF, and/or TST_DIV.

Circuit block STATUS, which was referred to in FIG. 4B, is simply a collection of 8 latches (3 of them resettable).

FIG. 4B3 shows the circuit organization of block CONTROL, which was referred to in FIG. 4B. In addition to performing routine control functions, note that this circuitry generates a signal LOCK when a match occurs within any of the three counters.

Circuit blocks RTC00-04, ETC00-04, and CC00-03 are simply the three counter chains. FIG. 4B4 shows the actual detailed implementation of one bit of these counter chains. The lines MRTC are chained together to provide a match-detect signal MAT_OUT.

Circuit block PF, which was referred to in FIG. 4, simply compares the backup battery voltage VBATB against the system supply voltage VCC, and accordingly generates a power-fail warning signal PF, which is received by circuit block DIV.

Circuit block POR, which was referred to in FIG. 4, is identical to circuit block POR2 shown in FIG. 4A6, except that block POR is connected to VDD rather than to VDD2. This block generates an on-chip reset signal POR, which is routed to the other circuit blocks.

Circuit block OSC, which was referred to in FIG. 4, is a crystal-controlled oscillator. In the presently preferred embodiment, this is essentially the same as that described in U.S. Pat. No. 4,871,982, which is hereby incorporated by reference.

Circuit block DIV, which was referred to in FIG. 4, divides down the output of the oscillator block OSC, to produce the real-time-clock increment pulses RTC_CLK at 256 Hz. This block also produces elapsed-time-clock pulses ETC_CLK conditionally, and cycle-counter pulses CC_CLK when transitions are detected (as described elsewhere herein), and handles oscillator-halt commands.

Circuit block CNTL, which was referred to in FIG. 4, contains logic implementations of the various functions described herein.

FIG. 5 shows the innovative socket which can be used in combination with the chip of the presently preferred embodiment. Port pens 1-39 in FIG. 5 may be electrically shorted with solder, which along with jumper cables permits output lens to be customized at the point-of-sale.

FIG. 6A-6D show the voltages levels at nodes POR, VDD, PINT, A, and B, verses time, as shown in the upper right hand corner of each FIG. 6A-6D, which were produced by SPICE simulations. Please note that X1, which precedes PINT, A, and B in SPICE refers to subcircuit nodes.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

It should also be noted that the disclosed innovations can easily be adapted to other integrated circuit architectures which include additional functions in addition to timekeeping.

It should also be noted that the disclosed integrated circuit architecture, while particularly advantageous for clocks and other elapsed-time circuits, can also be applied to integrated circuits of other types.

It should also be noted that the claimed innovations are not by any means limited to the specific bus protocol described. While the protocol of the presently preferred embodiment does appear (as of the effective filing date of this application) to have substantial advantages over alternative protocols, it may be anticipated that further developments and improvements in bus protocols will continue. Thus, many of the disclosed inventions can be used with other serial protocols, or with non-serial bus interfaces.

The present application contains several novel teachings which all help to provide reliable communications, over a low-data-rate noisy data channel, without risk of data corruption. These teachings are believed to combine synergistically (as in the presently preferred embodiment); but it is also possible to use some but not all of these teachings and still obtain advantages.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
   a power supply;
   a data input buffer connected to at least one signal line;
   decoding circuitry operatively connected to receive and decode signals received through said data input buffer;
   first energy-storage circuitry operatively connected to said signal line, said first energy-storage circuitry supplies powers said data input buffer;
   second energy-storage circuitry operatively connected to said signal line, said second energy-storage circuitry supplies powers said decoding circuitry; and
   a first plurality of transistors said further plurality of transistors powered by said power supply.

2. The integrated circuit of claim 1, wherein said data input buffer has a serial data interface.

3. The integrated circuit of claim 1, wherein said power supply is a battery.

4. The integrated circuit of claim 1, wherein said first plurality of transistors comprises circuitry which encodes a serial number which is unique to said integrated circuit.

5. The integrated circuit of claim 1, wherein said first plurality of transistors further comprise a memory array and memory access control circuitry.

6. An integrated circuit, comprising:
   a connection for receiving an external power supply;
   a CMOS data input buffer connectible to at least one signal line;
   CMOS decoding circuitry operatively connected to receive and decode signals received through said data input buffer;
   a first energy-storage capacitor operatively connected to said signal line and operatively connected to supply power to said data input buffer at least when said external power supply is not active;
   a second energy-storage capacitor operatively connected to said signal line and operatively connected to supply power to said decoding circuitry at least when said external power supply is not active; and
   a first plurality of transistors which are connected to be powered from said power supply connection, and which are not connected to said first or second energy-storage capacitors.

7. The integrated circuit of claim 6, wherein said data buffer provides a serial data interface.

8. The integrated circuit of claim 6, wherein said connection is a battery connection.

9. The integrated circuit of claim 6, wherein said first plurality of transistors includes a memory array and memory access control circuitry.

10. The integrated circuit of claim 6, wherein said plurality of transistors includes circuitry which encodes a serial number unique to said integrated circuit.

11. A module, comprising:
    a signal line;
    a battery; and
    an integrated circuit comprising
       a memory which contains a unique serial number;
       a data input buffer which comprises both PMOS and NMOS transistors, and which is connected to said signal line;
       decoding circuitry which comprises both PMOS and NMOS transistors, and which are connected to receive and decode signals received through said data input buffer;
       first energy-storage circuitry comprising a capacitor which is operatively connected to said signal line through a first diode, and which is connected to supply power to said data input buffer;
       second energy-storage circuitry comprising a capacitor which is operatively connected to said signal line through a second diode, and which is connected to supply power to said decoding circuitry; and
       a plurality of transistors comprising both PMOS and NMOS transistors, which are not included in said input buffer or decoding circuits, and which are powered from said battery;
    wherein said integrated circuit can be interrogated over said signal line to ascertain its unique serial number.

12. The module of claim 11, wherein said plurality of transistors includes a memory array and memory access control circuitry.

13. The integrated circuit of claim 1, wherein said data input buffer comprises a second plurality of transistors, said second plurality of transistors having both PMOS and NMOS transistors.

14. The integrated circuit of claim 1, wherein said decoding circuitry comprises a third plurality of transistors, said third plurality of transistors having both PMOS and NMOS transistors.

15. The integrated circuit of claim 1, wherein said first energy-storage circuitry comprises a capacitor.

16. The integrated circuit of claim 1, wherein said first energy-storage circuitry is connected to said signal line through a first diode.

17. The integrated circuit of claim 1, wherein said second energy-storage circuitry comprises a capacitor.

18. The integrated circuit of claim 1, wherein said first energy-storage circuitry is connected to said signal line through a second diode.

19. The integrated circuit as in claim 13, wherein said first plurality of transistors comprises both PMOS and NMOS transistors, which are not included in said input buffer.

20. The integrated circuit as in claim 14, wherein said first plurality of transistors comprises both PMOS and NMOS transistors, which are not included in said decoding circuitry.

21. The integrated circuit of claim 1, wherein said first energy-storage circuitry receives energy from said signal line.

22. The integrated circuit of claim 1, wherein said second energy-storage circuitry receives energy from said signal line.

23. The integrated circuit of claim 1, wherein said signal line provides a moderately stable voltage.

24. The integrated circuit of claim 6, wherein said signal line provides a moderately stable voltage.

25. The integrated circuit of claim 6, wherein said first energy-storage capacitor is operatively connected to said signal line through a first diode.

26. The integrated circuit of claim 6, wherein said second energy-storage capacitor is operatively connected to said signal line through a second diode.

27. The integrated circuit of claim 6, wherein said first energy-storage capacitor and said second energy-storage capacitor receive energy from said signal line.

28. The module of claim 11, wherein said integrated circuit can be interrogated over said signal line to ascertain its unique serial number, even after said battery has been exhausted.

29. The module of claim 11, wherein a moderately stable voltage rests exists on said signal line.

30. The integrated circuit of claim 11, wherein said first energy-storage circuitry and said second energy-storage circuitry receive energy from said signal line.

31. An integrated circuit, comprising:
a power supply;
a data input buffer connected to only one signal line;
decoding circuitry operatively connected to receive and at least one decode signal received through said data input buffer;
first energy-storage circuitry operatively connected to said signal line and which supplies power to said data input buffer;
second energy-storage circuitry operatively connected to said signal line and supplies power to said decoding circuitry; and
a first plurality of transistors powered by said power supply.

32. The integrated circuit of claim 31, wherein said data input buffer provides a serial data interface.

33. The integrated circuit of claim 31, wherein said first plurality of transistors comprises circuitry which encodes a serial number which is unique to said integrated circuit.

34. The integrated circuit of claim 31, wherein said first plurality of transistors further comprise a memory array and memory access control circuitry.

35. The integrated circuit of claim 31, wherein said first energy-storage circuitry and said second energy-storage circuitry receive energy from said signal line.

36. The integrated circuit of claim 31, wherein said first energy-storage circuitry comprises a capacitor.

37. The integrated circuit of claim 31, wherein said second energy-storage circuitry comprises a capacitor.

38. The integrated circuit of claim 5, wherein said memory array is nonvolatile.

39. The integrated circuit of claim 9, wherein said memory array is nonvolatile.

40. The integrated circuit of claim 12, wherein said memory array is nonvolatile.

41. The integrated circuit of claim 34, wherein said memory array is nonvolatile.

* * * * *